US012396363B2

(12) United States Patent
Kim et al.

(10) Patent No.: US 12,396,363 B2
(45) Date of Patent: Aug. 19, 2025

(54) LIGHT-EMITTING DEVICE AND AN ELECTRONIC APPARATUS INCLUDING THE SAME

(71) Applicant: Samsung Display Co., Ltd., Yongin-si (KR)

(72) Inventors: Seulong Kim, Yongin-si (KR); Soungwook Kim, Yongin-si (KR); Sungsoo Bae, Yongin-si (KR); Hyein Jeong, Yongin-si (KR); Hyewon Choi, Yongin-si (KR); Jaeweon Hur, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 814 days.

(21) Appl. No.: 17/533,135

(22) Filed: Nov. 23, 2021

(65) Prior Publication Data

US 2022/0173331 A1 Jun. 2, 2022

(30) Foreign Application Priority Data

Nov. 24, 2020 (KR) ........................ 10-2020-0159093

(51) Int. Cl.

| | |
|---|---|
| ***H10K 50/844*** | (2023.01) |
| ***H10K 85/60*** | (2023.01) |
| *H10K 50/16* | (2023.01) |
| *H10K 101/00* | (2023.01) |

(52) U.S. Cl.

CPC ....... *H10K 85/6572* (2023.02); *H10K 85/615* (2023.02); *H10K 85/636* (2023.02); *H10K 50/166* (2023.02); *H10K 2101/90* (2023.02)

(58) Field of Classification Search

None

See application file for complete search history.

(56) References Cited

U.S. PATENT DOCUMENTS 10,193,078 B2 1/2019 Ito et al.
2003/0230972 A1* 12/2003 Cok ....................... H10K 59/35 313/504
2008/0074038 A1 3/2008 Kim et al.
2016/0149157 A1* 5/2016 Cho ..................... H10K 85/626 257/40
2016/0204356 A1 7/2016 Yang et al.
2016/0308162 A1* 10/2016 Yoo ...................... H10K 50/858
2017/0263876 A1* 9/2017 Kim ..................... H10K 50/165
2017/0346023 A1* 11/2017 Jankus ................... H10K 71/30
2018/0069187 A1* 3/2018 Ito ........................ H10K 50/841
2018/0118742 A1* 5/2018 Joo .................... H10K 85/6572
2018/0190922 A1* 7/2018 Gölfert et al. ....... H10K 50/171
2019/0019959 A1* 1/2019 Sakamoto ......... C07F 9/650952
2019/0051841 A1* 2/2019 Sim ...................... H10K 85/654
2020/0095224 A1* 3/2020 Zhang .................. H10K 85/654
2020/0395550 A1* 12/2020 Sim ...................... H10K 85/657

FOREIGN PATENT DOCUMENTS

CN 110903159 3/2020
KR 10-2008-0028212 3/2008
KR 10-2016-0005196 1/2016
KR 10-2016-0086449 A 7/2016
KR 10-2016-0124285 A 10/2016
KR 10-2019-0016638 A 2/2019

OTHER PUBLICATIONS

Lee, Jun Yeob. "Mixed-host-emitting layer for high-efficiency organic light-emitting diodes." Journal of Information Display 15.3 (2014): 139-144. (Year: 2014).*

Qiang Huang et al., Performance improvement of top-emitting organic light-emitting diodes by an organic capping layer: An experimental study, Journal of Applied Physics 100, 064507, 2006.

* cited by examiner

*Primary Examiner* — Robert S Loewe

(74) *Attorney, Agent, or Firm* — Womble Bond Dickinson (US) LLP

(57) ABSTRACT

A light-emitting device includes: a first electrode; a second electrode facing the first electrode; an interlayer between the first electrode and the second electrode and including an emission layer; and a capping layer disposed on the second electrode, wherein the interlayer further includes an electron transport region between the emission layer and the second electrode, the capping layer includes at least one first material represented by Formula 1 or Formula 2, and the electron transport region satisfies at least one of Condition (1) and Condition (2), as defined herein.

19 Claims, 3 Drawing Sheets

LIGHT-EMITTING DEVICE AND AN ELECTRONIC APPARATUS INCLUDING THE SAME

CROSS-REFERENCE TO RELATED APPLICATION

This application claims priority from and the benefit of Korean Patent Application No. 10-2020-0159093, filed on Nov. 24, 2020, which is hereby incorporated by reference for all purposes as if fully set forth herein.

BACKGROUND

Embodiments of the invention relate generally display devices and, more particularly, to a light-emitting device and an electronic apparatus including the same.

Discussion of the Background

Organic light-emitting devices (OLEDs) are self-emission devices that, as compared with devices of the related art, have wide viewing angles, high contrast ratios, short response times, and excellent characteristics in terms of luminance, driving voltage, and response speed, and produce full-color images.

OLEDs may include a first electrode located on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

The above information disclosed in this Background section is only for understanding of the background of the inventive concepts, and, therefore, it may contain information that does not constitute prior art.

SUMMARY

Light-emitting devices and electronic apparatus including the same constructed according to the principles and illustrative implementations of the invention have superior driving voltage, luminescence efficiency, and lifespan compared to the related art.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode; an interlayer between the first electrode and the second electrode and including an emission layer; and a capping layer disposed on the second electrode, wherein the interlayer further includes an electron transport region between the emission layer and the second electrode, the capping layer includes at least one first material represented by Formula 1 or Formula 2, and the electron transport region satisfies at least one of Condition (1) and Condition (2):

Condition (1)

the electron transport region further includes a first electron transport layer, wherein the first electron transport layer includes a mixture including an organic electron transport material and a metal element-containing material, and the organic electron transport material and the metal element-containing material are different from each other; and Condition (2)

the electron transport region includes at least one second material represented by Formula 1 or Formula 2:

Formula 1

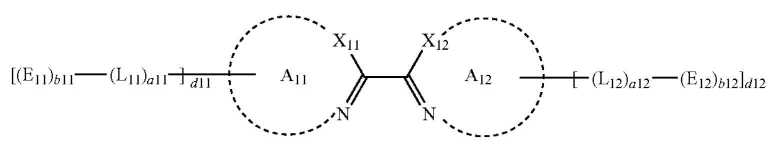

Formula 2

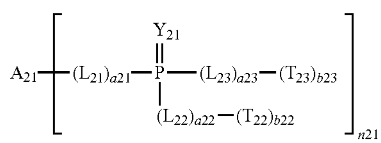

wherein, the variables for Formula 1 and 2 are defined herein.

The first electrode may include an anode, the second electrode may include a cathode, the interlayer may further include a hole transport region between the emission layer and the first electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

The second electrode may include silver.

The silver in the second electrode may include about 95 parts or more by mass based on the total 100 parts by mass of the second electrode.

The electron transport region may satisfy the Condition (2), the electron transport region further may include a first electron transport layer, and the first electron transport layer may include the second material represented by Formula 1 or Formula 2.

The electron transport region may further include a second electron transport layer between the first electron transport layer and the emission layer.

The first electron transport layer and the second electrode may directly contact each other.

The second electrode and the capping layer may directly contact each other.

The electron transport region may satisfy the Condition (1), and the organic electron transport material may include the second material represented by Formula 1 or Formula 2.

The metal element-containing material may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The metal element-containing material in the first electron transport layer may include about 5 parts or less by mass based on the total 100 parts by mass of the first electron transport layer.

The interlayer may further include a hole transport region between the emission layer and the first electrode, and the hole transport region may include a compound represented by Formula 201, a compound represented by Formula 202, or any combination thereof:

Formula 201

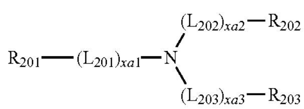

Formula 202

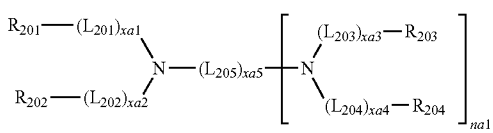

wherein, in Formulae 201 and 202, the variables are defined herein.

Formula 1

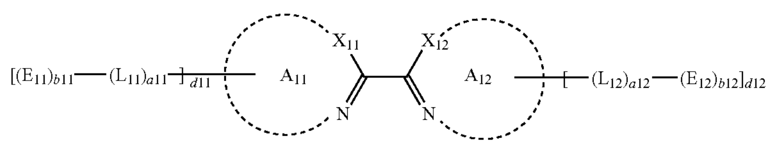

Formula 2

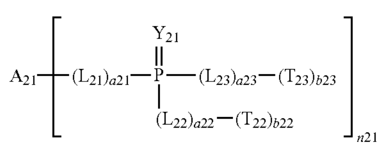

The emission layer may include a first host, a second host, and a dopant, and the first host and the second host may be different from each other.

The first host may be a hole transport compound including at least one electron withdrawing group, and the second host maybe an electron transport compound including at least one electron donating group.

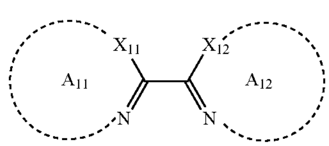

The moiety represented by in Formula 1 may be represented by one of Formulae 1-1 to 1-32, as defined herein.

The Formula 2 may be represented by one of Formulae 2-1 to 2-4, as defined herein.

The variable A21 in Formula 2 may be represented by one of Formulae 3-1 to 3-7, as defined herein.

According to another aspect of the invention, a light-emitting device includes: a plurality of first electrodes patterned according to each of a first subpixel, a second subpixel, and a third subpixel; a second electrode facing the plurality of first electrodes; an interlayer between the plurality of first electrodes and the second electrode and including an emission layer; and a capping layer on the second electrode, wherein the emission layer includes a first emission layer disposed in the first subpixel to emit a first-color light, a second emission layer disposed in the second subpixel to emit a second-color light, and a third emission layer disposed in the third subpixel to emit a third-color light, the interlayer further includes an electron transport region between the emission layer and the second electrode, the capping layer includes at least one first material represented by Formula 1 or Formula 2, and the electron transport region satisfies at least one of Condition (11) and Condition (12):

Condition (11)

the electron transport region further includes a first electron transport layer which is formed as a common layer in all of the first subpixel, the second subpixel, and the third subpixel, the first electron transport layer includes a mixture including an organic electron transport material and a metal element-containing material, and the organic electron transport material and the metal element-containing material are different from each other; and Condition (12)

the electron transport region includes at least one second material represented by Formula 1 or Formula 2:

wherein, in Formula 1, the variables are defined herein.

An electronic apparatus may include: the light-emitting device as defined above and a thin-film transistor, wherein the thin-film transistor may include a source electrode and a drain electrode, and the first electrode of the light-emitting device may be electrically connected to the source electrode or the drain electrode.

The electronic apparatus may further include a color filter, a color conversion layer, a touch screen layer, a polarizing layer, or any combination thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
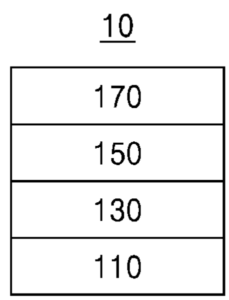
FIG. 1 is a diagram schematically illustrating an embodiment of a structure of a light-emitting device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light-emitting device according to an embodiment includes: a first electrode;

a second electrode facing the first electrode;

an interlayer located between the first electrode and the second electrode and including an emission layer; and a capping layer on the second electrode, wherein the interlayer may further include an electron transport region between the emission layer and the second electrode, the capping layer may include at least one first material represented by Formula 1 or Formula 2, and the electron transport region may satisfy at least one of Condition (1) and Condition (2):

Condition (1)

the electron transport region further includes a first electron transport layer, wherein the first electron transport layer includes a compound including an organic electron transport material and a metal element-containing material, and the organic electron transport material and the metal element-containing material are different from each other.

Condition (2)

the electron transport region includes at least one second material represented by Formula 1 or Formula 2:

In Formula 1, $X_{11}$ may be N or $C(R_{11})$, and $X_{12}$ may be N or $C(R_{12})$.

$A_{11}$ and $A_{12}$ may each independently be a $C_1$-$C_{60}$ heterocyclic group including at least one N.

$L_{11}$ and $L_{12}$ may each independently be a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$.

a11 and a12 may each independently be an integer selected from 1 to 3.

$E_{11}$, $E_{12}$, $R_{11}$ and $R_{12}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$.

b11 and b12 may each independently be an integer selected from 1 to 8.

d11 and d12 may each independently be an integer selected from 1 to 8.

$R_{11}$ and $R_{12}$ may optionally be linked to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$.

In Formula 2, $Y_{21}$ may be O, S, or Se.

$A_{21}$ may be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$.

n21 may be an integer selected from 1 to 3.

$L_{21}$ to $L_{23}$ may each independently be a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$.

Formula 1

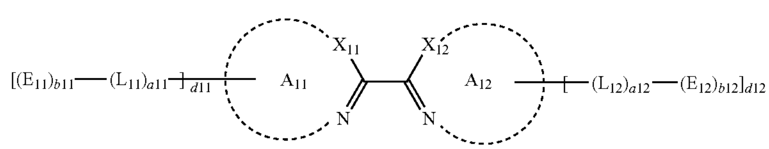

Formula 2

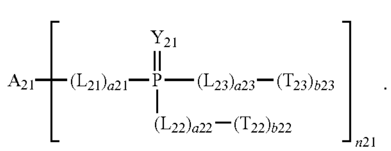

a21 to a23 may each independently be an integer selected from 1 to 3.

$T_{22}$ and $T_{23}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$ ($Q_1$), or —P(=O)($Q_1$)($Q_2$).

b22 and b23 may each independently be an integer selected from 1 to 8.

$L_{22}$, $L_{23}$, $T_{22}$ and $T_{23}$ may optionally be linked to each other to form a $C_2$-$C_{30}$ heterocyclic group unsubstituted or substituted with at least one $R_{10a}$.

$R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si ($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$) ($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$) ($Q_{22}$), or any combination thereof or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$) ($Q_{32}$), wherein $Q_1$ to $Q_3$, $Q_{11}$ to $Q_{13}$, $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, in Formula 1, the portion represented by

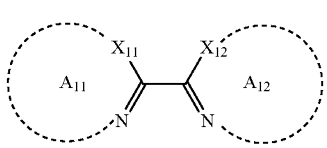

may be represented by one of Formulae 1-1 to 1-32:

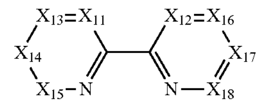

1-1

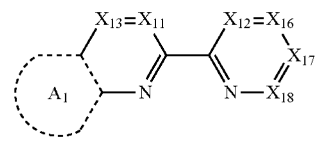

1-2

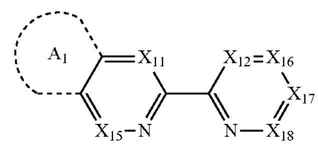

1-3

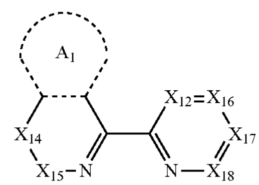

1-4

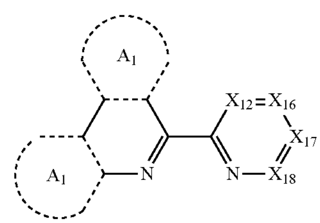

1-5

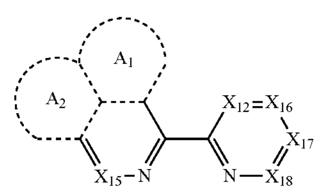

1-6

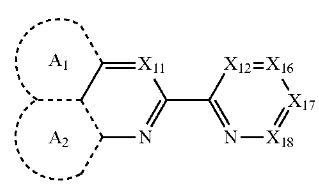

1-7

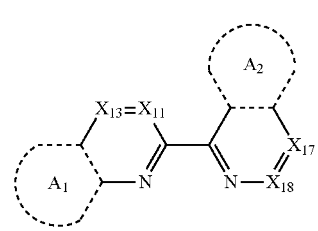

1-8

-continued
1-9
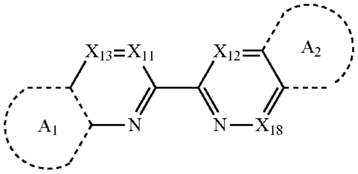
1-10
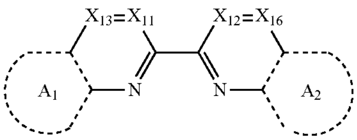
1-11
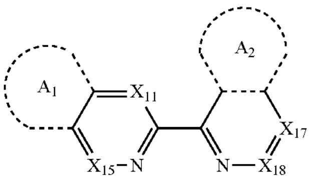
1-12
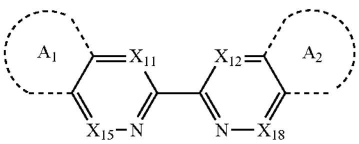
1-13
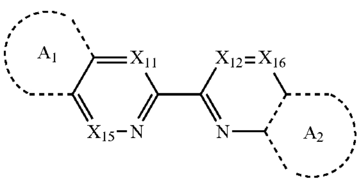
1-14
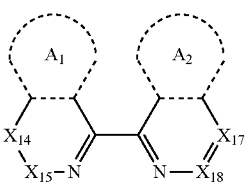
1-15
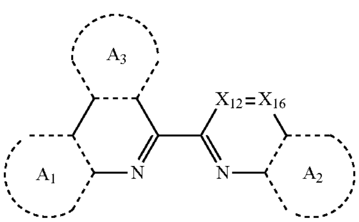
1-16
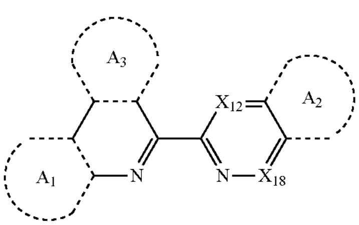
-continued
1-17
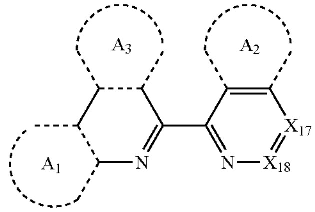
1-18
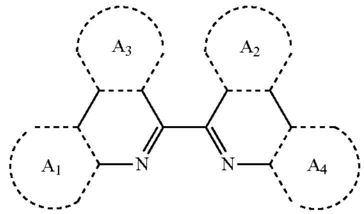
1-19
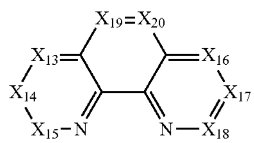
1-20
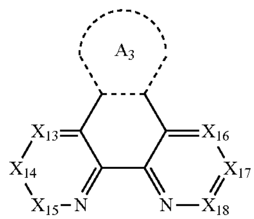
1-21
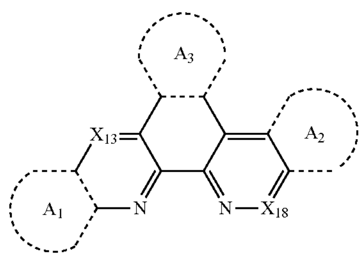
1-22
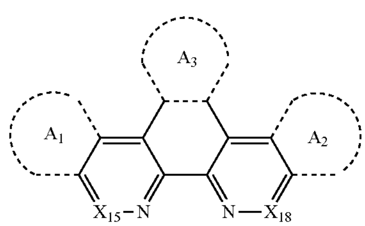
1-23
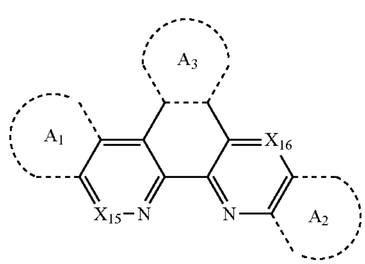

-continued 1-24

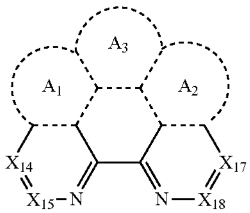

1-25

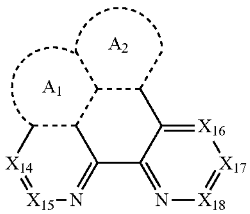

1-26

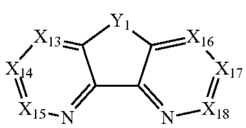

1-27

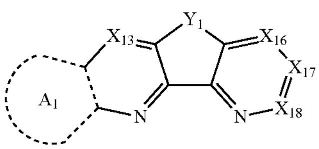

1-28

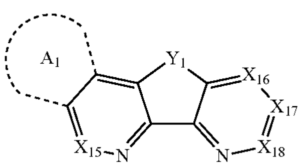

1-29

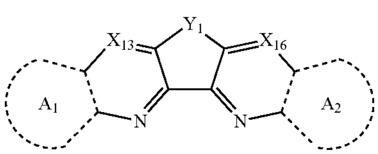

1-30

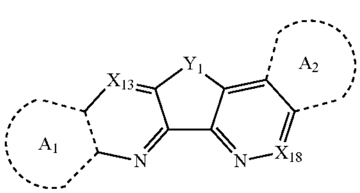

1-31

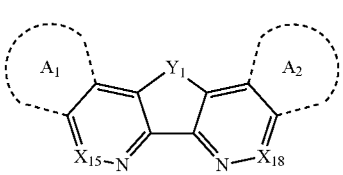

-continued 1-32

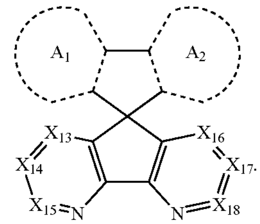

In Formulae 1-1 to 1-32, $X_{11}$ and $X_{12}$ may each be the same as described as described herein, $X_{13}$ may be N or $C(R_{13})$, $X_{14}$ may be N or $C(R_{14})$, $X_{15}$ may be N or $C(R_{15})$, $X_{16}$ may be N or $C(R_{16})$, $X_{17}$ may be N or $C(R_{17})$, $X_{18}$ may be N or $C(R_{18})$, $X_{19}$ may be N or $C(R_{19})$, $X_{20}$ may be N or $C(R_{20})$, $A_1$ to $A_3$ may each independently be a benzene group, a naphthalene group, an anthracene group, a phenanthrene group, a triphenylene group, a pyrene group, a cyclopentadiene group, a thiophene group, a furan group, an indole group, an indene group, a benzosilole group, a benzogermole group, a benzothiophene group, a benzoselenophene group, a benzofuran group, a carbazole group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group or a 5,6,7,8-tetrahydroquinoline group, $Y_1$ may be O, S, $N(R_{1a})$, or $C(R_{1a})(R_{1b})$, $R_{11}$ to $R_{20}$, $R_{1a}$ and $R_{1b}$ may each have the same meaning as$*-(L_{11})_{a11}-(E_{11})_{b11}$ described in connection with $E_{11}$ as described herein, $R_{11}$ to $R_{20}$, $R_{1a}$ and $R_{1b}$ may optionally be linked to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, and $R_{10a}$ may be the same as described herein.

In an embodiment, the first material or the second material compound may be represented by Formula 4-1 or 4-2:

Formula 4-1

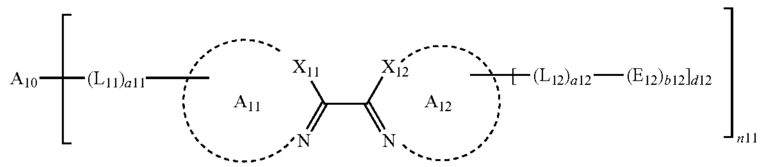

Formula 4-2

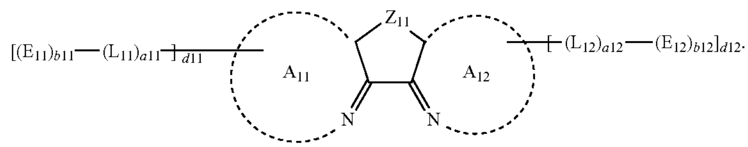

In Formula 4-1 or 4-2, $A_{10}$ may be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, n11 may be an integer selected from 1 to 3, $Z_{11}$ may be a non-bond, a single bond, *—O—*', *—S—*', *—N($R_{11a}$)—*', *—C($R_{11a}$)($R_{11b}$)—*', *—C($R_{11a}$)=C($R_{11b}$)—*', *—N=C($R_{11b}$)—*', or *—C($R_{11a}$)=N—*',

* and *' may each indicate a binding site to $Z_{11}$ and a neighboring atom, $R_{11a}$ and $R_{11b}$ may be the same as described in connection with $E_{11}$ herein, and $R_{11a}$ and $R_{11b}$ may optionally be linked to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, and $X_{11}$, $X_{12}$, $A_{11}$, $A_{12}$, $L_{11}$, $L_{12}$, a11, a12, $E_{11}$, $E_{12}$, b11, b12, d11, d12, and $R_{10a}$ may be the same as described herein.

In an embodiment, the compound represented by Formula 2 may be represented by one of Formulae 2-1 to 2-4:

Formula 2-1

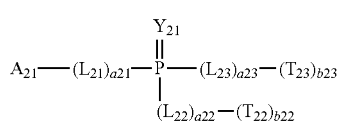

Formula 2-2

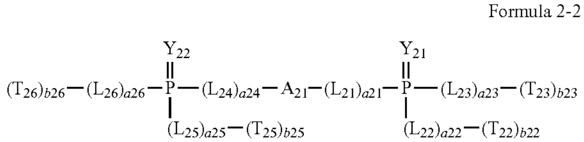

Formula 2-3

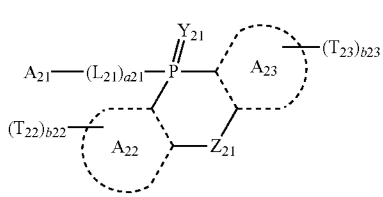

-continued

Formula 2-4

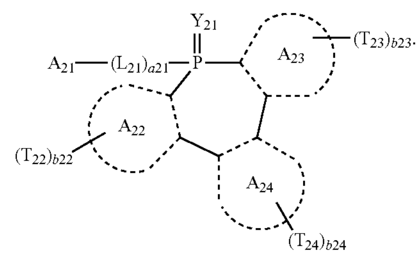

In Formulae 2-1 to 2-4, $Z_{21}$ may be a non-bond, a single bond, O, S, N($R_{21a}$), or C($R_{21a}$)($R_{21b}$), $R_{21a}$ and $R_{21b}$ may be the same as described in connection with $T_{22}$ herein, $Y_{21}$, $A_{21}$, $L_{21}$ to $L_{23}$, a21 to a23, $T_{22}$, $T_{23}$, b22 and b23 may be the same as described herein, $Y_{22}$ may be the same in connection with $Y_{21}$ as described herein, $L_{24}$ to $L_{26}$ may each be the same as described in connection with $L_{21}$ herein, a24 to a26 may each independently be an integer selected from 1 to 3, $T_{24}$ to $T_{26}$ may each be the same as described in connection with $T_{22}$ herein, $A_{22}$ to $A_{24}$ may each independently be a $C_5$-$C_{60}$ carbocyclic group or a $C_2$-$C_{30}$ heterocyclic group, and b24 to b26 may each independently be an integer selected from 1 to 8.

The term "non-bond" meaning that the atoms binding with $Z_{21}$ are not connected with each other by a single bond, O, S, N($R_{21a}$), or C($R_{21a}$)($R_{21b}$), therefore if $Z_{21}$ is "non-bond", the atom binding with $Z_{21}$ in $A_{22}$ is substituted with $T_{22}$ and the atom binding with $Z_{21}$ in $A_{23}$ is substituted with $T_{23}$.

In an embodiment, in Formula 2, $A_{21}$ may be represented by one of Formulae 3-1 to 3-7:

3-1

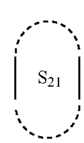

-continued 3-2

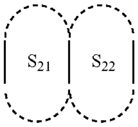

3-3

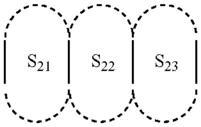

3-4

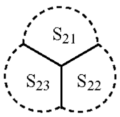

3-5

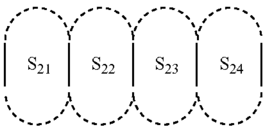

3-6

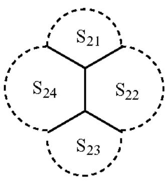

-continued 3-7

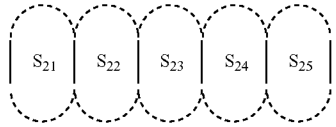

In Formulae 3-1 to 3-7, $S_{21}$ to $S_{25}$ may each independently be a benzene group, a naphthalene group, a phenanthrene group, an anthracene group, a triphenylene group, a pyrrole group, an imidazole group, a benzoxazole group, a benzothiazole group, a benzimidazole group, a pyridine group, a pyrazine group, a pyrimidine group, an indole group, a quinoline group, an isoquinoline group, a benzoquinoline group, a phenanthridine group, an acridine group, a phenanthroline group, a triazole group, a tetrazole group or a triazine group, each unsubstituted or substituted with at least one $R_{10a}$, and $R_{10a}$ may be the same as described specification herein.

In an embodiment, the first material and the second material may each independently be one of Compounds 1-1 to 1-18 and 2-1 to 2-78, but embodiments are not limited thereto:

1-1

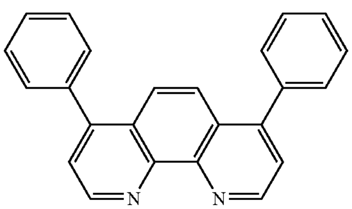

1-2

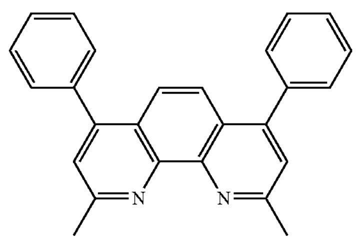

1-3

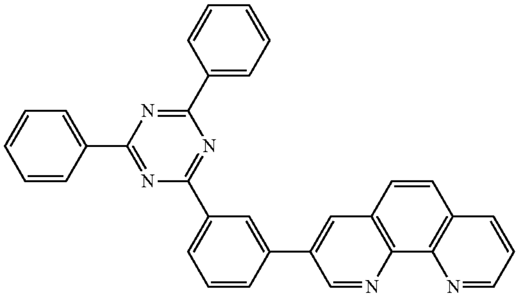

1-4

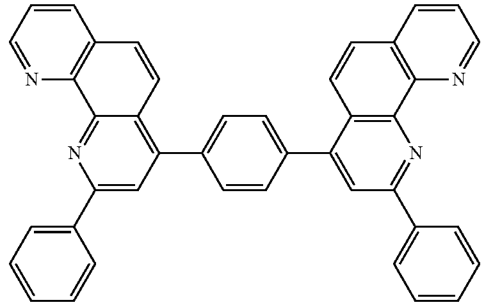

-continued
1-5
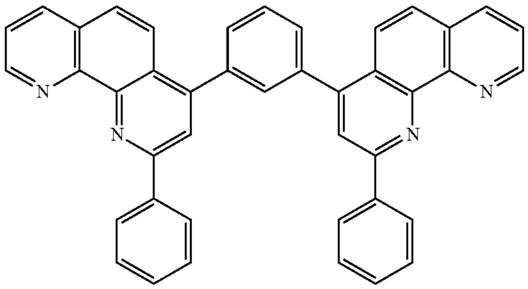
1-6
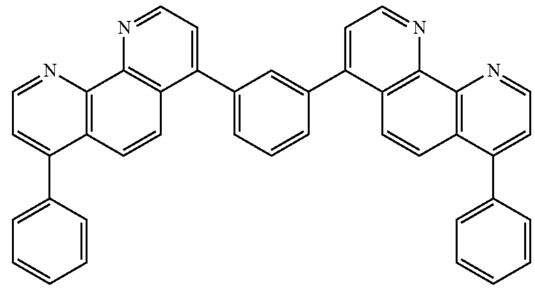
1-7
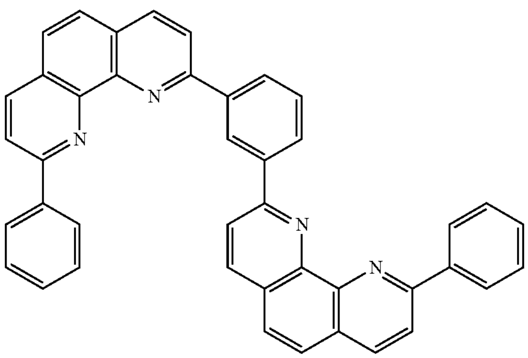
1-8
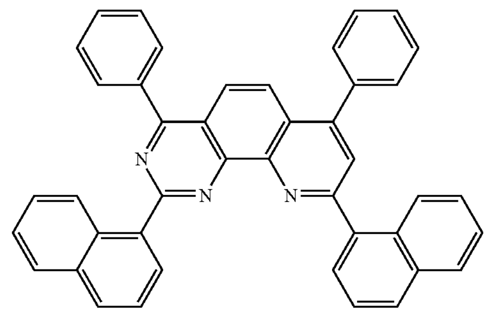
1-9
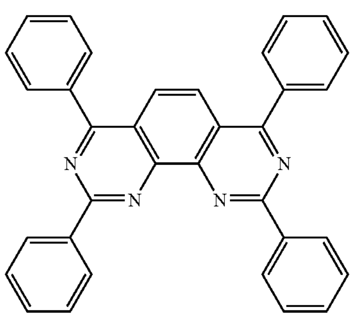
1-10
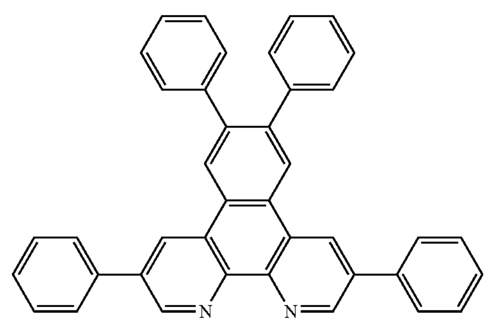
1-11
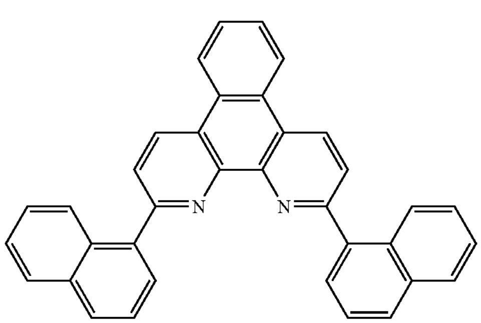
1-12
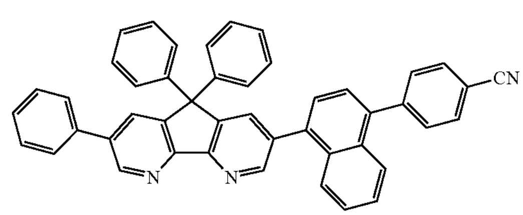

-continued
1-13
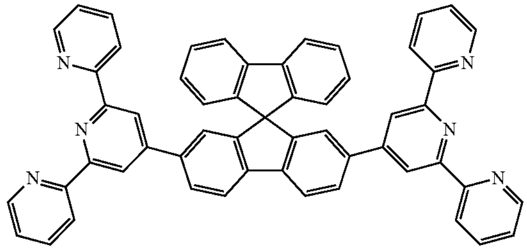
1-14
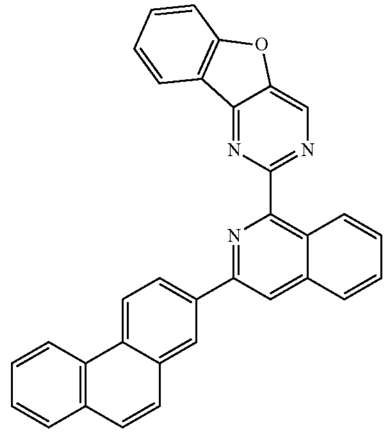
1-15
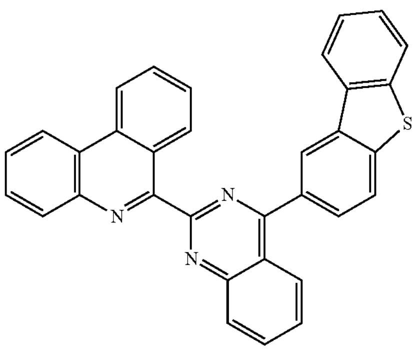
1-16
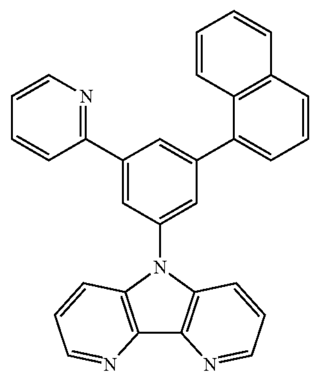
1-17
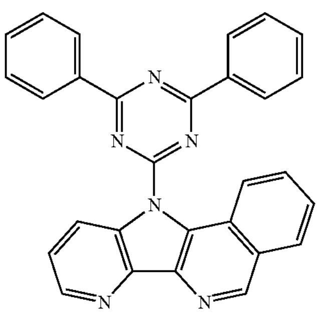
1-18
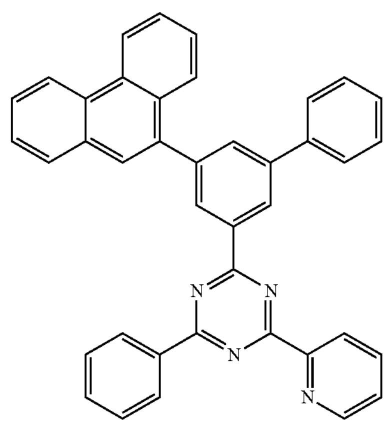
2-1
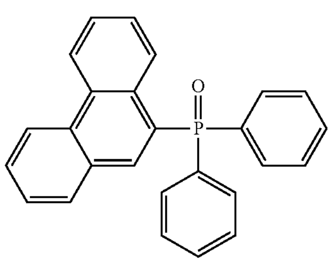
2-2
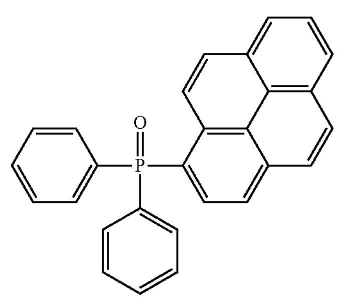

-continued
2-3
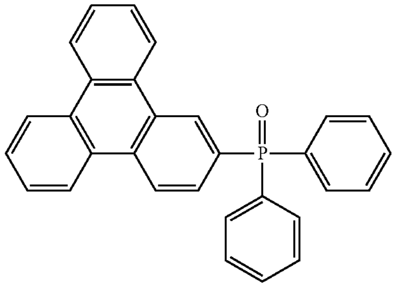
2-4
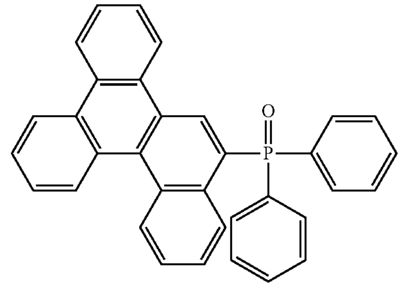
2-5
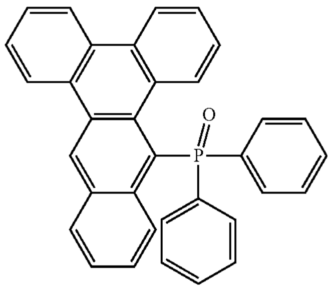
2-6
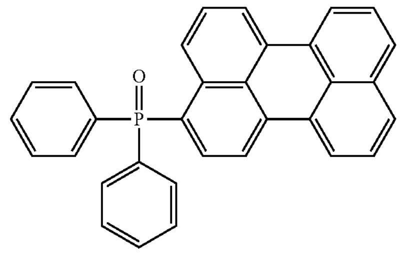
2-7
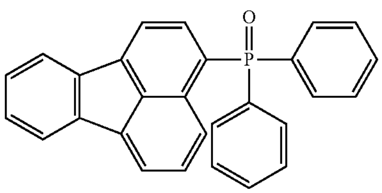
2-8
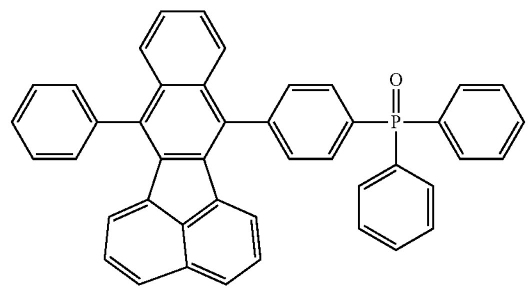
2-9
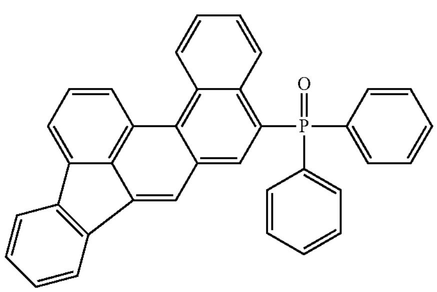
2-10
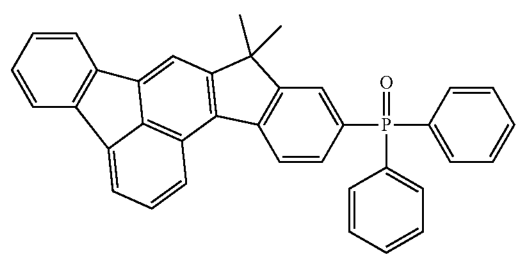
2-11
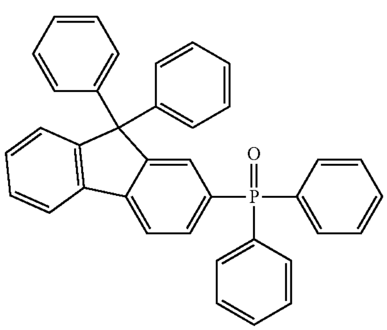
2-12
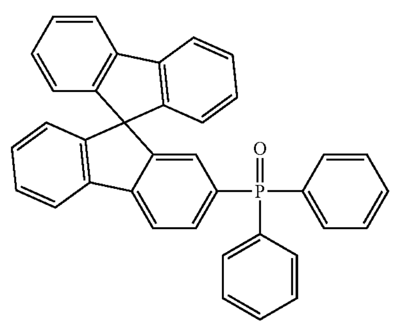

-continued
2-13
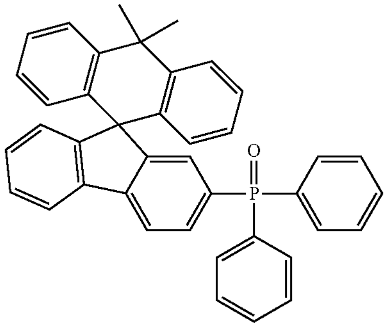
2-14
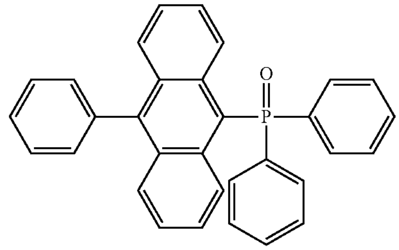
2-15
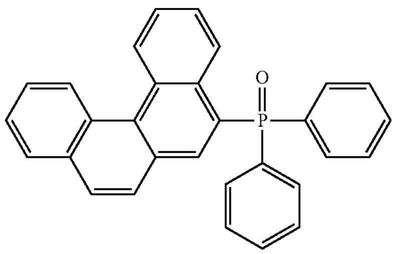
2-16
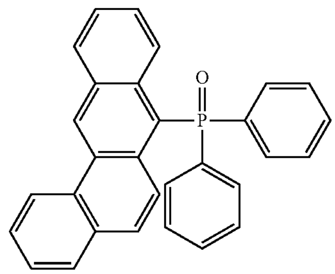
2-17
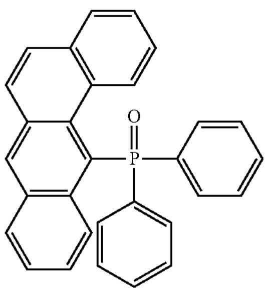
2-18
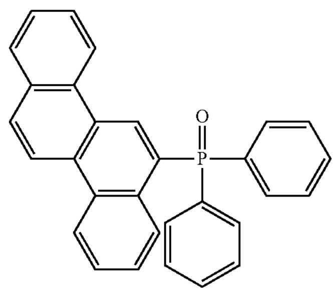
2-19
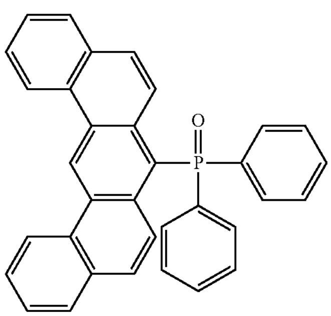
2-20
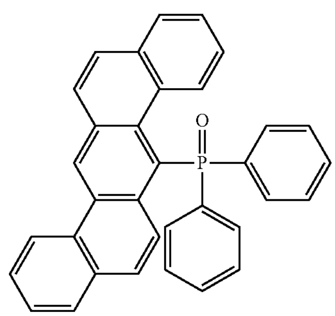
2-21
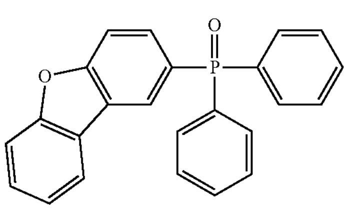
2-22
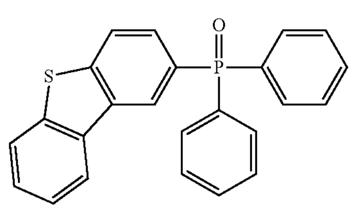

-continued
2-23
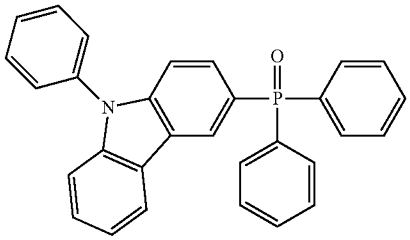
2-24
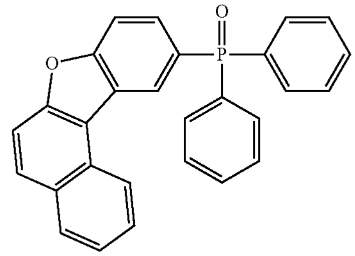
2-25
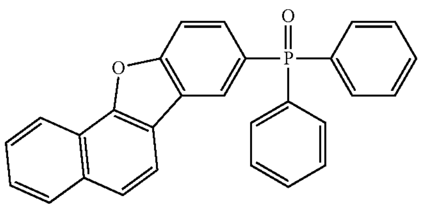
2-26
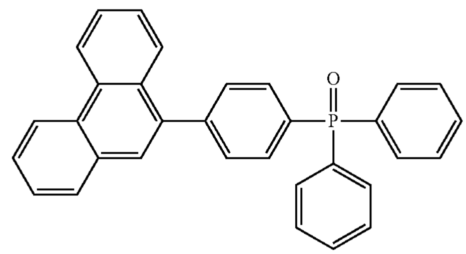
2-27
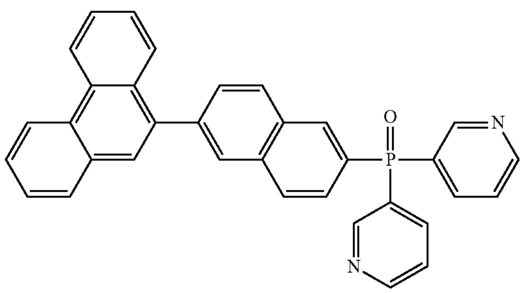
2-28
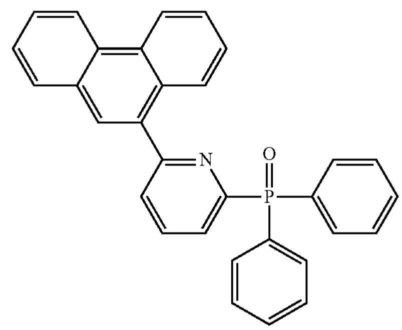
2-29
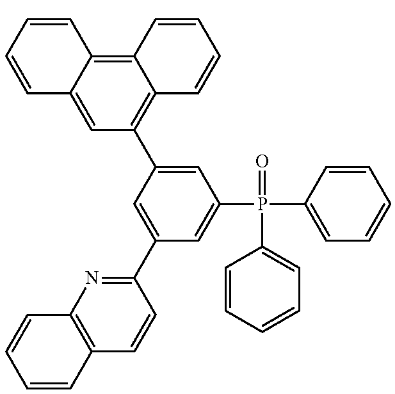
2-30
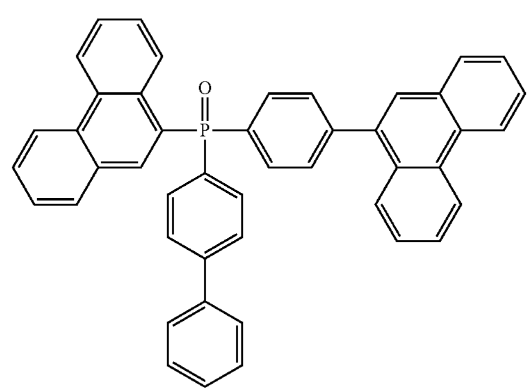

-continued
2-31
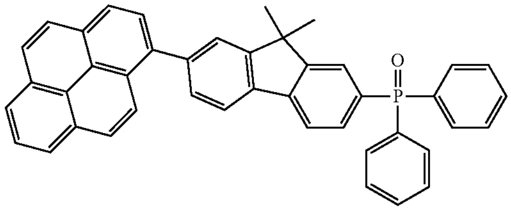
2-32
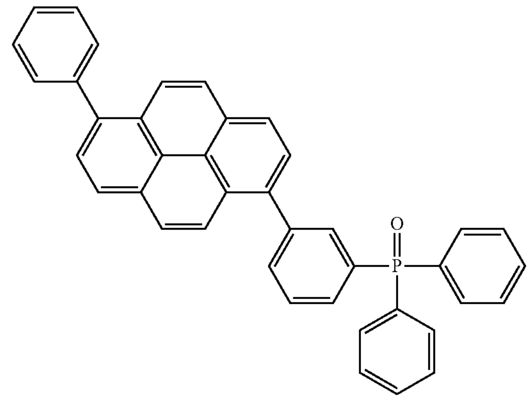
2-33
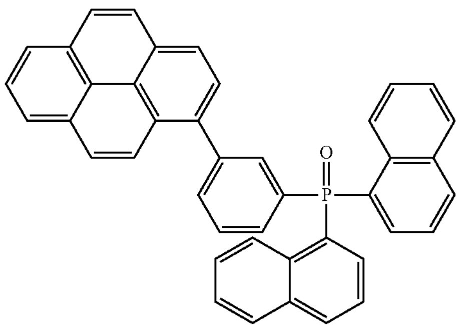
2-34
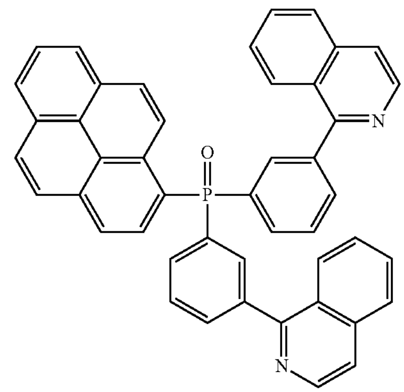
2-35
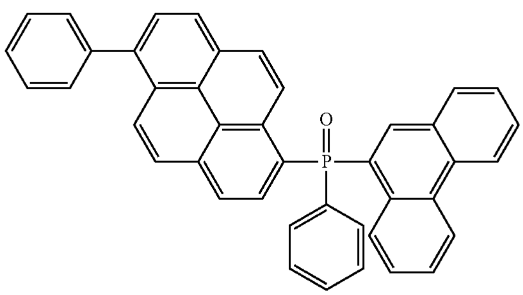
2-36
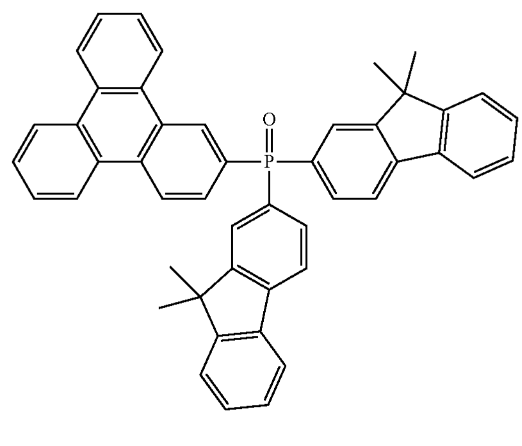
2-37
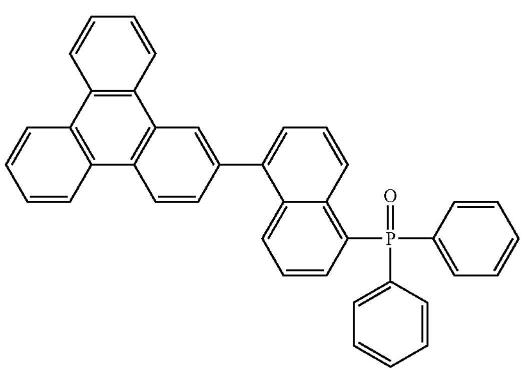
2-38
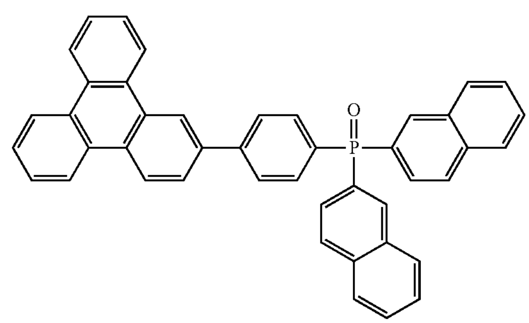

-continued
2-39
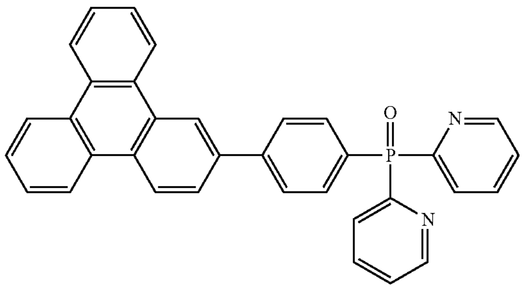
2-40
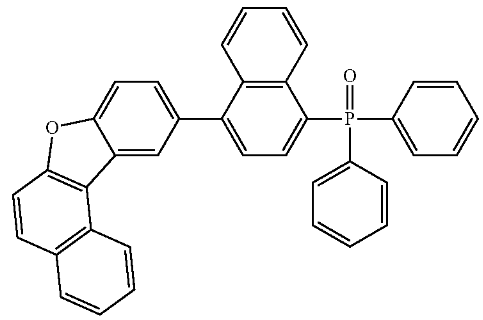
2-41
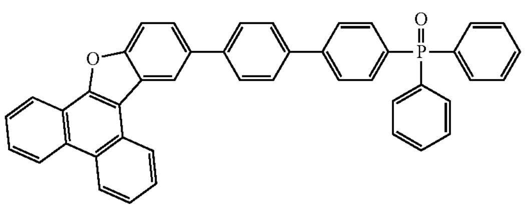
2-42
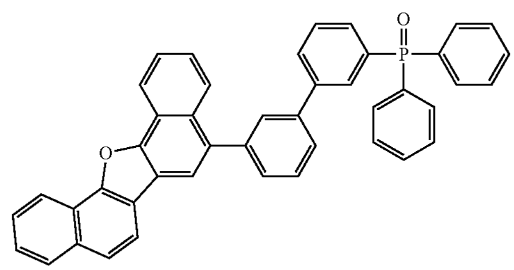
2-43
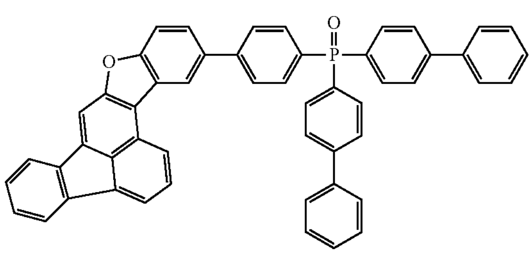
2-44
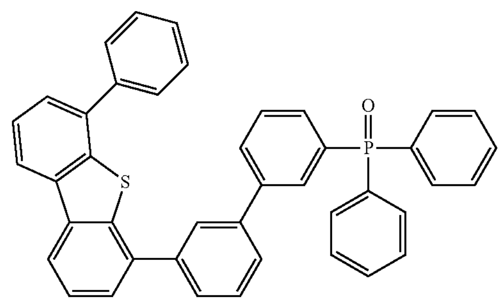
2-45
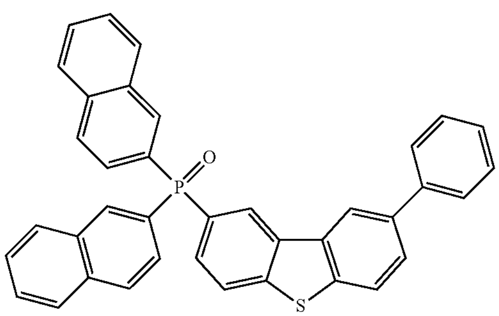
2-46
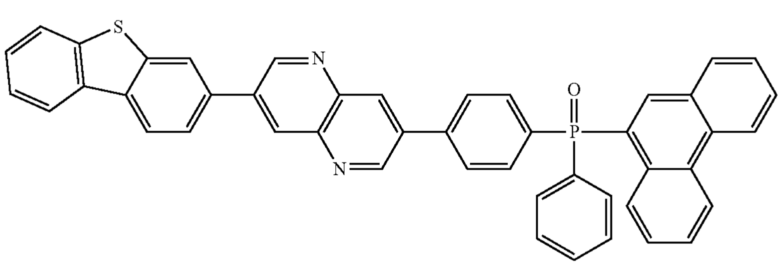

-continued
2-47
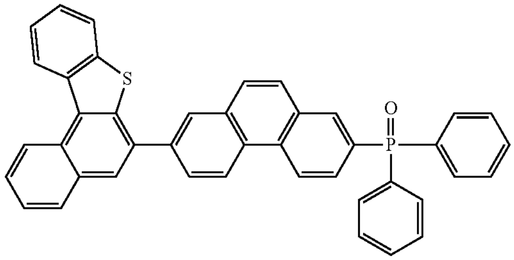
2-48
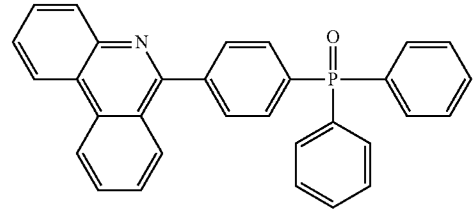
2-49
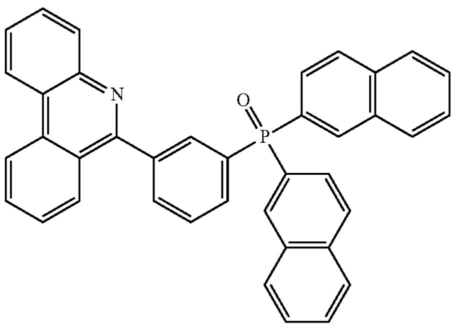
2-50
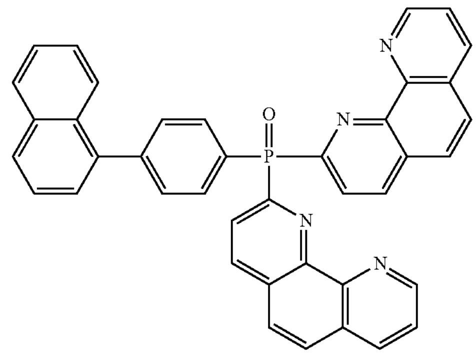
2-51
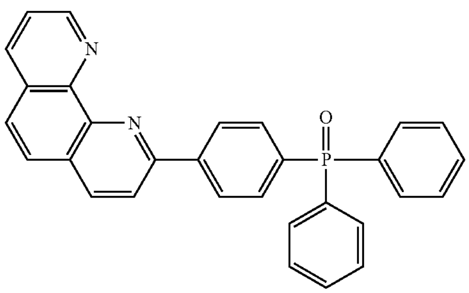
2-52
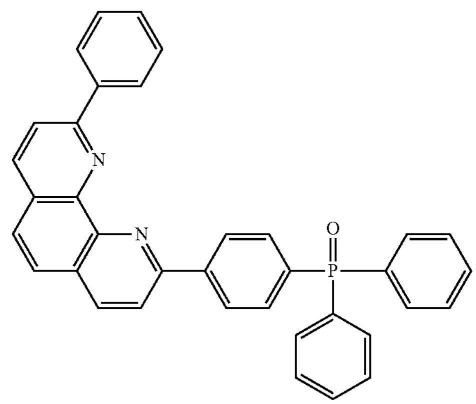
2-53
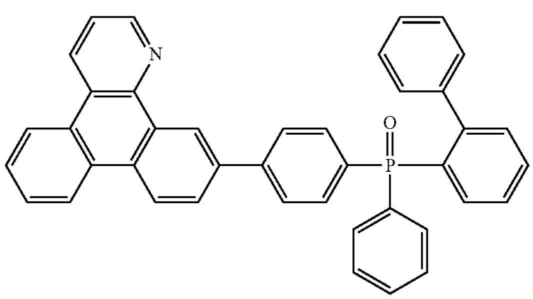
2-54
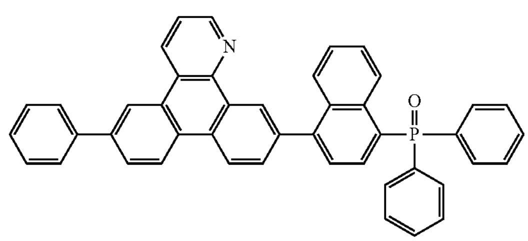

-continued
2-55
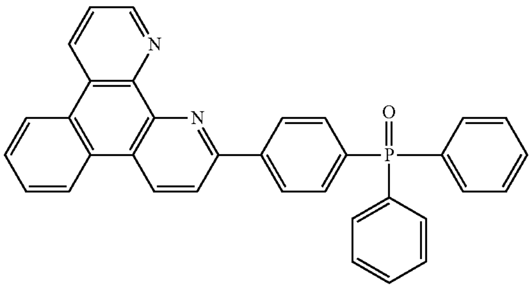
2-56
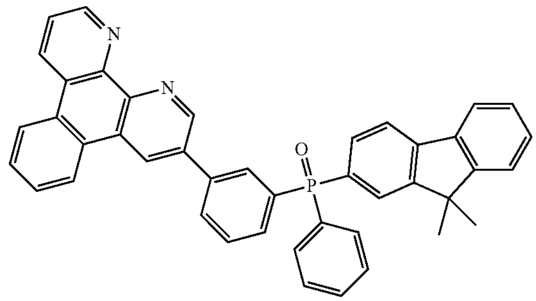
2-57
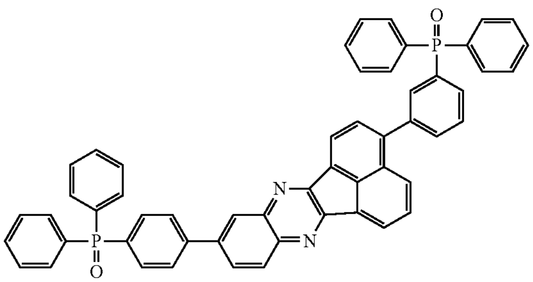
2-58
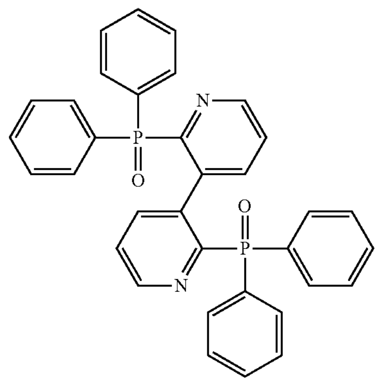
2-59
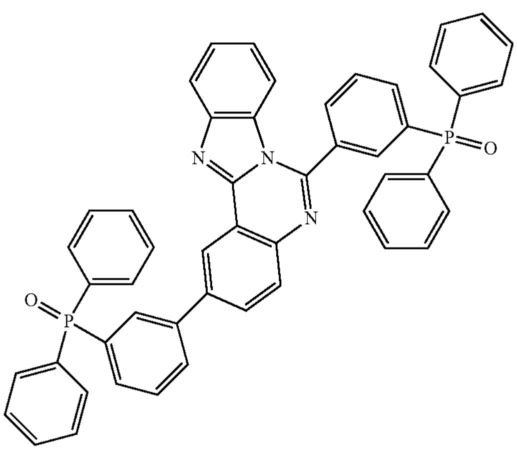
2-60
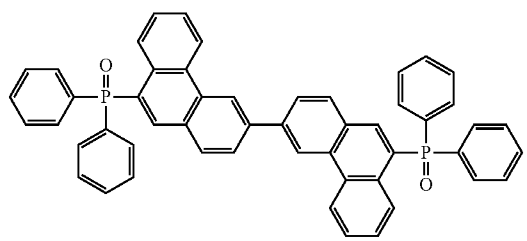
2-61
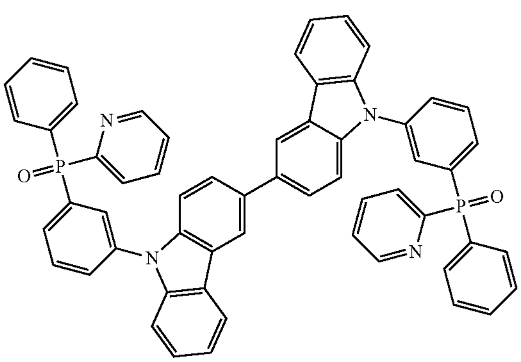
2-62
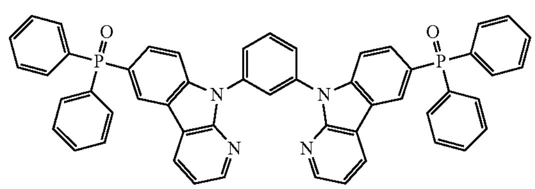

-continued
2-63
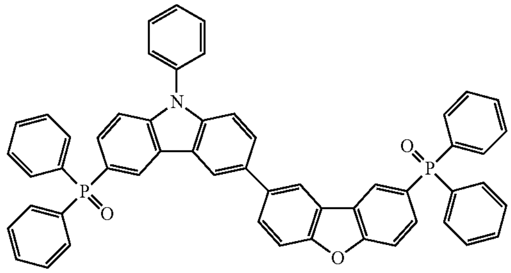
2-64
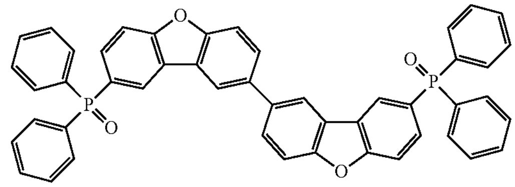
2-65
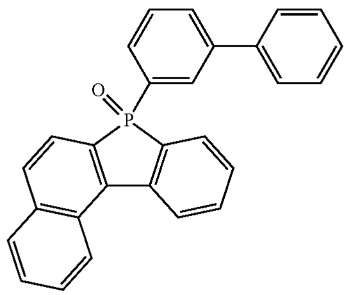
2-66
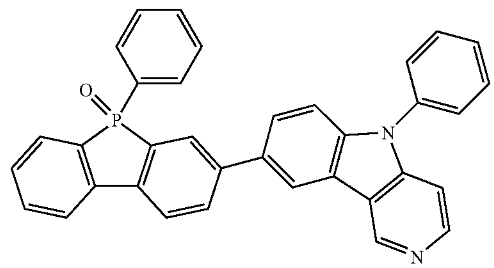
2-67
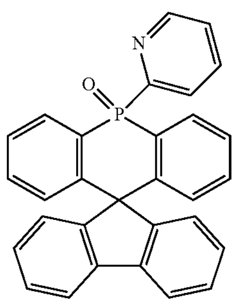
2-68
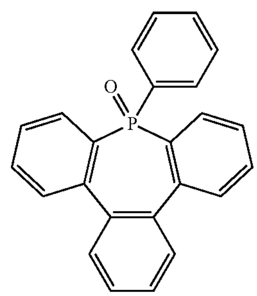
2-69
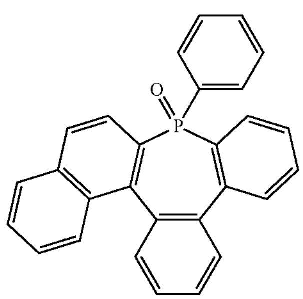
2-70
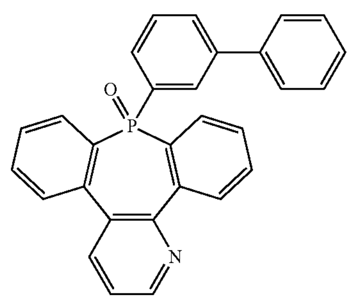
2-71
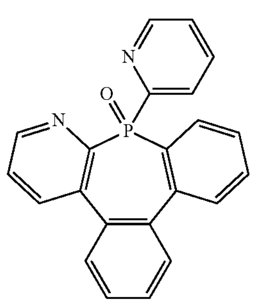
2-72
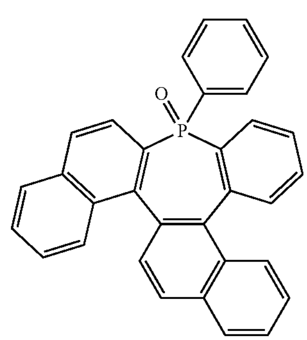

-continued 2-73

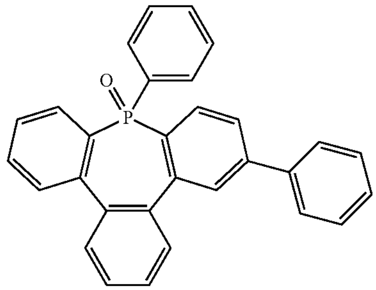

2-74

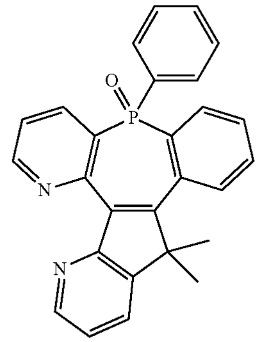

2-75

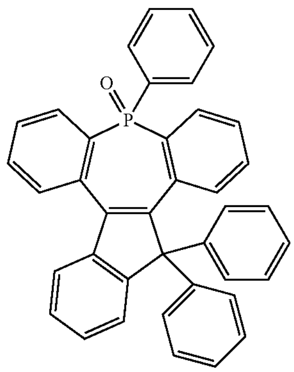

2-76

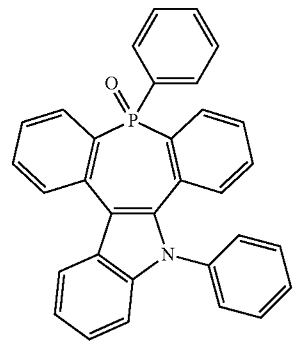

2-77

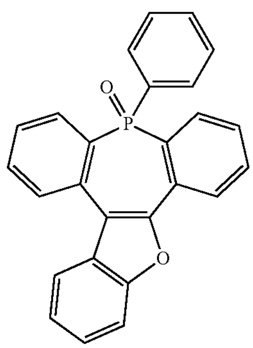

2-78

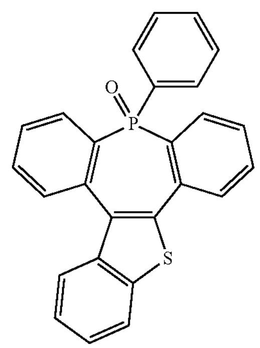

In an embodiment, the first electrode may be an anode, the second electrode may be a cathode, the interlayer may further include a hole transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In an embodiment, the second electrode may include silver (Ag). In an embodiment, the amount of silver (Ag) in the second electrode may be about 95 parts or more by mass based on the total 100 parts by mass of the second electrode.

In an embodiment, the electron transport region may satisfy Condition (2), the electron transport region may further include a first electron transport layer, and the first electron transport layer may include the second material. In an embodiment, the electron transport region may further include a second electron transport layer located between the first electron transport layer and the emission layer. In an embodiment, the second electron transport layer may include an electron transport compound.

In an embodiment, the second electron transport layer may not include the second material. In an embodiment, the hole transport region may further include an emission auxiliary layer located between the emission layer and the first electrode. In an embodiment, the first electron transport layer may be in direct contact with the second electrode. In an embodiment, the second electrode may be in direct contact with the second capping layer. In an embodiment, the second electron transport layer may be in direct contact with the first electron transport layer.

In an embodiment, the second electron transport layer may be in direct contact with the emission layer. In an embodiment, the electron transport region may satisfy Condition (1), and the organic electron transport material may include the second material.

In an embodiment, the metal element-containing material may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. In an embodiment, the alkali metal may include Li, Na, K, Rb, Cs, or any combination thereof, the alkaline earth metal may include Mg, Ca, Sr, Ba, or any combination thereof, the rare earth metal may include Sc, Y, Ce, Tb, Yb, Gd, or any combination thereof, and the alkali metal-containing compound, the alkaline earth metal-containing compound, and the rare earth metal-containing compound may be oxides, halides, or tellurides of the alkali metal, the alkaline earth metal, and the rare earth metal, or any combination thereof.

In an embodiment, the metal element-containing material may include Yb. In an embodiment, the amount of the metal element-containing material included may be about 5 parts or less by mass based on the total 100 parts by mass of the first electron transport layer.

In an embodiment, the emission layer may be a red emission layer emitting red light or a green emission layer emitting green light. In an embodiment, the emission layer may include a first host, a second host, and a dopant, and the first host and the second host may be different from each other. In an embodiment, the first host may be a hole transport compound including at least one electron withdrawing group, and the second host may be an electron transport compound including at least one electron donating group.

In an embodiment, the electron withdrawing group may be: —F, $—CFH_2$, $—CF_2H$, $—CF_3$, —CN, or $—NO_2$; a $C_1$-$C_{60}$ alkyl group substituted with at least one —F, $—CFH_2$, $—CF_2H$, $—CF_3$, —CN, $—NO_2$, or any combination thereof; or a π electron-deficient nitrogen-containing $C_1$-$C_{60}$ cyclic group unsubstituted or substituted with at least one $R_{20a}$. The electron donating group may be a π electron-rich $C_3$-$C_{60}$ cyclic group unsubstituted or substituted with at least one $R_{30a}$ or $—N(Q_{41})(Q_{42})$.

$R_{20a}$ may be the same as described in connection with $R_{10a}$ herein, and $R_{30a}$ may be: deuterium (-D), a hydroxyl group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, a hydroxyl group, a nitro group, a π electron-rich $C_3$-$C_{60}$ cyclic group, a $C_6$-$C_{60}$ aryloxy group, a $C_6$-$C_{60}$ arylthio group, $—Si(Q_{51})(Q_{52})(Q_{53})$, $—N(Q_{51})(Q_{52})$, $—B(Q_{51})(Q_{52})$, or any combination thereof; a π electron-rich $C_3$-$C_{60}$ cyclic group, a $C_6$-$C_{60}$ aryloxy group, or a $C_6$-$C_{60}$ arylthio group, each unsubstituted or substituted with deuterium, a hydroxyl group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a π electron-rich $C_3$-$C_{60}$ cyclic group, a $C_6$-$C_{60}$ aryloxy group, a $C_6$-$C_{60}$ arylthio group, $—Si(Q_{61})(Q_{62})(Q_{63})$, $—N(Q_{61})(Q_{62})$, $—B(Q_{61})(Q_{62})$, or any combination thereof; or $—Si(Q_{71})(Q_{72})(Q_{73})$, $—N(Q_{71})(Q_{72})$, or $—B(Q_{71})(Q_{72})$, wherein $Q_{41}$, $Q_{42}$, $Q_{51}$ to $Q_{53}$, $Q_{61}$ to $Q_{63}$ and $Q_{71}$ to $Q_{73}$ may each independently be: hydrogen; deuterium; a hydroxyl group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a π electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the π electron-deficient nitrogen-containing $C_1$-$C_{60}$ cyclic group may be a) a first ring, b) a condensed ring in which at least two first rings are condensed, or c) a condensed ring in which at least one first ring and at least one second ring are condensed, the π electron-rich $C_3$-$C_{60}$ cyclic group may be a) second ring or b) a condensed ring in which at least two second rings are condensed, the first ring may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group, and the second ring may be a benzene group, a cyclopentadiene group, a pyrrole group, a furan group, a thiophene group, or a silole group.

In an embodiment, the π electron-deficient nitrogen-containing $C_1$-$C_{60}$ cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, an acridine group, or a pyridopyrazine group, and the π electron-rich $C_3$-$C_{60}$ cyclic group may be a benzene group, a heptalene group, an indene group, a naphthalene group, an azulene group, an indacene group, an acenaphthene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonaphthothiophene group, an (indolo)phenanthrene group, a (benzofuran)phenanthrene group, or a (benzothieno)phenanthrene group.

In an embodiment, the hole transport region may include a compound represented by Formula 201, a compound represented by Formula 202, or any combination thereof:

Formula 201

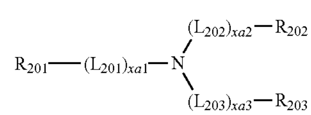

Formula 202

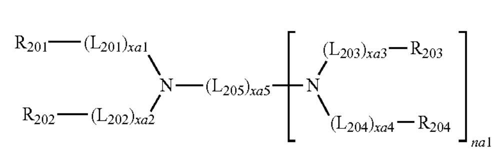

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, Condition (11)

The electron transport region further includes a first electron transport layer which is formed as a common layer in all of the first subpixel, the second subpixel, and the third subpixel, the first electron transport layer includes a mixture including an organic electron transport material and a metal element-containing material, and the organic electron transport material and the metal element-containing material are different from each other.

Condition (12)

The electron transport region includes at least one second material represented by Formula 1 or Formula 2:

Formula 1

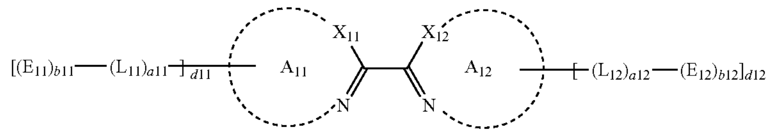

Formula 2

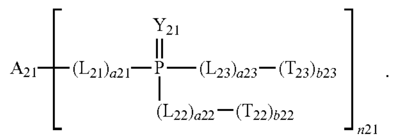

xa1 to xa4 may each independently an integer selected from 0 to 5, xa5 may be an integer selected from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, na1 may be an integer selected from 1 to 4, and $R_{10a}$ may be the same as described specification herein.

According to another aspect, the light-emitting device may include: a plurality of first electrodes patterned according to each of a first subpixel, a second subpixel, and a third subpixel; a second electrode facing a plurality of the first electrode; an interlayer located between a plurality of the first electrode and the second electrode and including an emission layer; and a capping layer located on the second electrode, wherein the emission layer may include a first emission layer formed in the first subpixel and emitting first-color light, a second emission layer formed in the second subpixel and emitting second-color light, and a third emission layer formed in the third subpixel and emitting third-color light, the interlayer may further include an electron transport region located between the emission layer and the second electrode, and the capping layer may include at least one first material represented by Formula 1 or Formula 2. The electron transport region may satisfy at least one of Condition (11) and Condition (12).

Formula 1 and 2 may be the same as described herein. In an embodiment, the first electrode may be an anode, the second electrode may be a cathode, the interlayer may further include a hole transport region located between the emission layer and the first electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In an embodiment, the second electrode may include silver (Ag). In an embodiment, the amount of silver (Ag) in the second electrode may be about 95 parts or more by mass based on the total 100 parts by mass of the second electrode. In an embodiment, the electron transport region may satisfy Condition (12), the electron transport region may further include a first electron transport layer, and the first electron transport layer may include the second material. In an embodiment, the electron transport region may further include a second electron transport layer located between the first electron transport layer and the emission layer. In an embodiment, the second electron transport layer may include an electron transport compound. In an embodiment, the second electron transport layer may not include the second material. In an embodiment, the emission layer may further include a first emission auxiliary layer located between the first emission layer and the first electrode.

In an embodiment, the emission layer may further include a second emission auxiliary layer located between the second emission layer and the first electrode. In an embodiment, the emission layer may further include a third emission auxiliary layer located between the third emission layer and the first electrode. In an embodiment, the first emission auxiliary layer, the second emission auxiliary layer, and the third emission auxiliary layer may include an amine-based compound. The amine-based compound refers to a compound including at least one amine group and, thus, the first emission auxiliary layer, the second emission auxiliary layer, and the third emission auxiliary layer may include at least one amine group. In an embodiment, the first electron transport layer may be in direct contact with the second electrode.

In an embodiment, the second electrode may be in direct contact with the capping layer. In an embodiment, the second electron transport layer may be in direct contact with the first electron transport layer. In an embodiment, the electron transport region may satisfy Condition (11), and the organic electron transport material may include the second material.

In an embodiment, the metal element-containing material may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. In an embodiment, the alkali metal may include Li, Na, K, Rb, Cs, or any combination thereof, the alkaline earth metal may include Mg, Ca, Sr, Ba, or any combination thereof, the rare earth metal may include Sc, Y, Ce, Tb, Yb, Gd, or any combination thereof, and the alkali metal-containing compound, the alkaline earth metal-containing compound, and the rare earth metal-containing compound may be oxides, halides, or tellurides of the alkali metal, the alkaline earth metal, and the rare earth metal, or any combination thereof.

In an embodiment, the metal element-containing material may include Yb. In an embodiment, the amount of the metal element-containing material included may be about 5 parts or less by mass based on the total 100 parts by mass of the first electron transport layer. In an embodiment, the first-color light, the second-color light, and the third-color light may have different maximum emission wavelengths from one another. In an embodiment, the first-color light, the second-color light, and the third-color light may be mixed to emit white light.

In an embodiment, the first color light may be red light, the second color light may be green light, and the third color light may be blue light, but embodiments are not limited thereto. In an embodiment, the first emission layer, the second emission layer, the third emission layer, or any combination thereof may include a first host, a second host, and a metal complex, and the first host and the second host may be different from each other.

In an embodiment, the first host may be a hole transport compound including at least one electron withdrawing group, and the second host may be an electron transport compound including at least one electron donating group.

In an embodiment, the electron withdrawing group may be:

—F, —$CFH_2$, —$CF_2H$, —$CF_3$, —CN or —$NO_2$;

a $C_1$-$C_{60}$ alkyl group substituted with at least one —F, —$CFH_2$, —$CF_2H$, —$CF_3$, —CN, —$NO_2$, or any combination thereof; or a π electron-deficient nitrogen-containing $C_1$-$C_{60}$ cyclic group unsubstituted or substituted with at least one $R_{20a}$, the electron donating group may be a π electron-rich $C_3$-$C_{60}$ cyclic group unsubstituted or substituted with at least one $R_{30a}$ or —$N(Q_{41})(Q_{42})$, $R_{20a}$ may be the same as described in connection with $R_{10a}$ herein, and $R_{30a}$ may be:

deuterium (-D), a hydroxyl group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, a hydroxyl group, a nitro group, a π electron-rich $C_3$-$C_{60}$ cyclic group, a $C_6$-$C_{60}$ aryloxy group, a $C_6$-$C_{60}$ arylthio group, —$Si(Q_{51})(Q_{52})(Q_{53})$, —$N(Q_{51})(Q_{52})$, —$B(Q_{51})(Q_{52})$, or any combination thereof;

a π electron-rich $C_3$-$C_{60}$ cyclic group, a $C_6$-$C_{60}$ aryloxy group, or a $C_6$-$C_{60}$ arylthio group, each unsubstituted or substituted with deuterium, a hydroxyl group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a π electron-rich $C_3$-$C_{60}$ cyclic group, a $C_6$-$C_{60}$ aryloxy group, a $C_6$-$C_{60}$ arylthio group, —$Si(Q_{61})(Q_{62})(Q_{63})$, —$N(Q_{61})(Q_{62})$, —$B(Q_{61})(Q_{62})$, or any combination thereof; or —$Si(Q_{71})(Q_{72})(Q_{73})$, —$N(Q_{71})(Q_{72})$, or —$B(Q_{71})(Q_{72})$, wherein $Q_{41}$, $Q_{42}$, $Q_{51}$ to $Q_{53}$, $Q_{61}$ to $Q_{63}$ and $Q_{71}$ to $Q_{73}$ may each independently be: hydrogen; deuterium; a hydroxyl group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a π electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the π electron-deficient nitrogen-containing $C_1$-$C_{60}$ cyclic group may be a) a first ring, b) a condensed ring in which at least two first rings are condensed, or c) a condensed ring in which at least one first ring and at least one second ring are condensed, the π electron-rich $C_3$-$C_{60}$ cyclic group may be a) second ring or b) a condensed ring in which at least two second rings are condensed, the first ring may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group, and the second ring may be a benzene group, a cyclopentadiene group, a pyrrole group, a furan group, a thiophene group, or a silole group.

In an embodiment, the π electron-deficient nitrogen-containing $C_1$-$C_{60}$ cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, an acridine group, or a pyridopyrazine group, and the π electron-rich $C_3$-$C_{60}$ cyclic group may be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonaphthothiophene group, an (indolo)phenanthrene group, a (benzofuran)phenanthrene group, or a (benzothieno)phenanthrene group.

According to another aspect, provided is an electronic apparatus including the light-emitting device and a thin-film transistor, wherein the thin-film transistor may include a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof.

In the light-emitting device, a capping layer on a second electrode includes at least one first material represented by Formula 1 or 2, and an electron transport region has a first electron transport layer including a mixture including an organic electron transport material and a metal element-containing material, which are different from each other, and/or includes at least one second material represented by Formula 1 or 2:

Formula 1

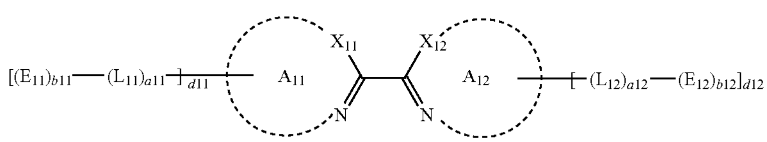

Formula 2

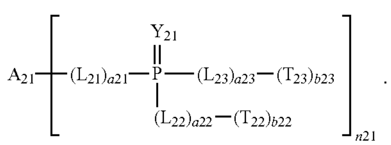

Because the light-emitting device includes a first material having metal binding characteristics in a capping layer on a second electrode, the decrease in the stability of the light-emitting device due to the agglutinability of a metal, for example, silver, in the second electrode may be prevented. Because the light-emitting device according to an embodiment includes an electron transport layer in which an organic electron transport material is mixed with a metal element-containing material in an electron transport layer, the electron injection characteristics of the electron transport layer may be improved, thereby improving the efficiency of the light-emitting device.

The light-emitting device according to an embodiment may include a second material in an electron transport region. Because the light-emitting device includes a second material having metal binding characteristics in an electron transport region between an emission layer and a second electrode, the agglutination of a metal, for example, silver, in the second electrode may be prevented, thereby improving the stability of the light-emitting device.

In addition, since an emission layer of the light-emitting device includes a first host as a hole transport host, a second host as an electron transport host, and a metal complex, the charge balance of the light-emitting device having fast electron transfer characteristics may be controlled, and thus, a light-emitting device with high efficiency and long lifespan may be obtained.

Accordingly, a light-emitting device, for example, an organic light-emitting device, including a first material and a second material represented by Formula 1 or 2 in a capping layer and an electron transport region, respectively, and further including a metal element-containing material in the electron transport region, may have low driving voltage, high maximum quantum efficiency, high efficiency, and long lifespan.

The wording "(interlayer and/or capping layer) includes a first material" as used herein may be understood as interlayer and/or capping layer may include one kind of first material represented by Formula 1 or two different kinds of first materials, each represented by Formula 1."

For example, the interlayer and/or capping layer may include Compound 1-1 only as the first material. In this regard, Compound 1-1 may exist in the capping layer of the light-emitting device. In one or more embodiments, the interlayer may include, as the first material, Compound 1-1 and Compound 2-1. In this regard, Compound 1-1 and Compound 2-1 may exist in an identical layer (for example, Compound 1-1 and Compound 2-1 may all exist in a capping layer), or different layers (for example, Compound 1-1 may exist in an electron transport region and Compound 2-1 may exist in a capping layer).

According to another aspect, provided is an electronic apparatus including the light-emitting device as described above. The electronic apparatus may further include a thin-film transistor. In an embodiment, the electronic apparatus may further include a thin-film transistor including a source electrode and a drain electrode, and the first electrode of the light-emitting device may be electrically connected to the source electrode or the drain electrode. Meanwhile, the electronic apparatus may further include a color filter, a color conversion layer, a touch screen layer, a polarizing layer, or any combination thereof. More details on the electronic apparatus may be the same as described herein.

Figure 2:
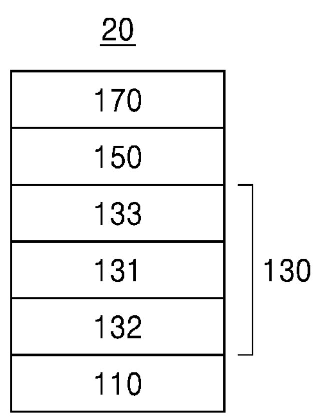
FIG. 2 is a diagram schematically illustrating another embodiment of a structure of a light-emitting device constructed according to the principles of the invention.

Description of FIGS. 1 and 2

FIG. 1 is a diagram schematically illustrating an embodiment of a structure of a light-emitting device constructed according to the principles of the invention.

The light-emitting device 10 includes a first electrode 110, an interlayer 130, a second electrode 150, and a capping layer 170.

Hereinafter, the structure of the light-emitting device 10 according to an embodiment and an example of a method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be used. In an embodiment, the substrate may be a flexible substrate, and may include plastics with excellent heat resistance and durability, such as a polyimide, a polyethylene terephthalate (PET), a polycarbonate, a polyethylene napthalate, a polyarylate (PAR), a polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include an indium tin oxide (ITO), an indium zinc oxide (IZO), a tin oxide ($SnO_2$), a zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming a first electrode.

The first electrode 110 may have a single layer consisting of a single-layered structure or a multilayer structure including a plurality of layers. In an embodiment, the first electrode 110 may have a three-layered structure of ITO/Ag/ITO.

Interlayer 130

The interlayer 130 may be located on the first electrode 110. The interlayer 130 may include an emission layer. The interlayer 130 may further include a hole transport region placed between the first electrode 110 and the emission layer and an electron transport region placed between the emission layer and the second electrode 150. The interlayer 130 may further include metal element-containing compounds such as organometallic compounds, inorganic materials such as quantum dots, and the like, in addition to various organic materials.

In one or more embodiments, the interlayer 130 may include, i) two or more emitting units sequentially stacked between the first electrode 110 and the second electrode 150 and ii) a charge generation layer located between the two emitting units. When the interlayer 130 includes the emitting unit and the charge generation layer as described above, the light-emitting device 10 may be a tandem light-emitting device.

FIG. 2 is a diagram schematically illustrating another embodiment of a structure of a light-emitting device constructed according to the principles of the invention.

The light-emitting device 20 includes: the first electrode 110; the interlayer 130 including an emission layer 131, a hole transport region 132, and an electron transport region 133; the second electrode 150; and the capping layer 170. The capping layer 170 may include the first material represented by Formula 1 or 2 as described below. The electron transport region 133 may include the second material represented by Formula 1 or 2 as described below. The electron transport region 133 may include an electron transport layer including a mixture including an organic electron transport material and a metal element-containing material as described below. The first electrode 110, the hole transport region 132, the emission layer 131, the electron transport region 133, the second electrode 150, and the capping layer 170 may be the same as described in connection with FIG. 1.

Hole Transport Region 132 in Interlayer 130

The hole transport region 132 may have: i) a single-layered structure consisting of a single layer consisting of a single material, ii) a single-layered structure consisting of a single layer consisting of a plurality of different materials, or iii) a multi-layered structure including a plurality of layers including a plurality of different materials. The hole transport region may include a hole injection layer, a hole transport layer, an emission auxiliary layer, an electron blocking layer, or any combination thereof.

In an embodiment, the hole transport region 132 may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

Formula 201

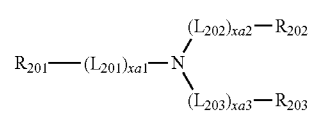

Formula 202

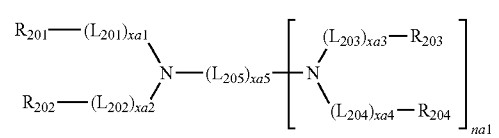

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer selected from 0 to 5, xa5 may be an integer selected from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, to form a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (see Compound HT16 or the like), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer selected from 1 to 4.

In an embodiment, each of Formulae 201 and 202 may include at least one of groups represented by Formulae CY201 to CY217:

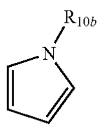

CY201

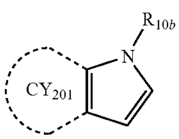

CY202

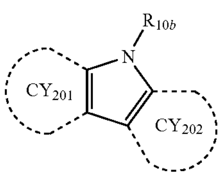

CY203

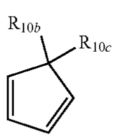

CY204

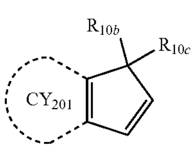

CY205

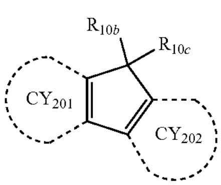

CY206

-continued

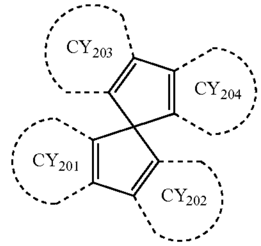

CY207

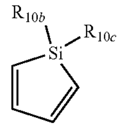

CY208

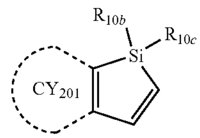

CY209

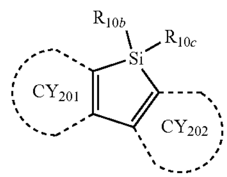

CY210

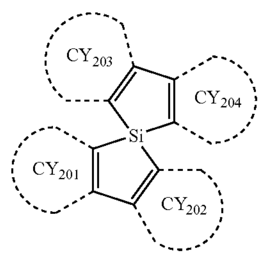

CY211

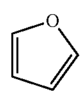

CY212

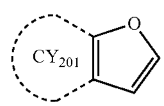

CY213

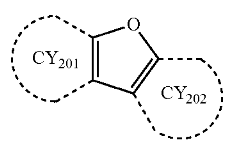

CY214

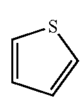

CY215

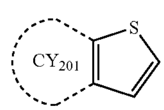

CY216

-continued

CY217

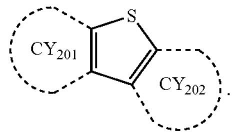

$R_{10b}$ and $R_{10c}$ in Formulae CY201 to CY217 may be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with at least one $R_{10a}$.

In an embodiment, ring $CY_{201}$ to ring $CY_{204}$ in Formulae CY201 to CY217 may each independently be a benzene group, a naphthalene group, a phenanthrene group, or an anthracene group. In one or more embodiments, each of Formulae 201 and 202 may include at least one of groups represented by Formulae CY201 to CY203. In one or more embodiments, Formula 201 may include at least one of groups represented by Formulae CY201 to CY203 and at least one of groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207. In one or more embodiments, each of Formulae 201 and 202 may not include a group represented by one of Formulae CY201 to CY203. In one or more embodiments, each of Formulae 201 and 202 may not include a group represented by one of Formulae CY201 to CY203, and may include at least one of groups represented by Formulae CY204 to CY217. In an embodiment, each of Formulae 201 and 202 may not include a group represented by one of Formulae CY201 to CY217.

In an embodiment, the hole transport region may include one of Compounds HT1 to HT47, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), N,N'-di(1-naphthyl)-N,N'-diphenyl-(1,1'-biphenyl)-4,4'-diamine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (Spiro-TPD), N2,N7-di-1-naphthalenyl-N2,N7-diphenyl-9,9'-spirobi[9H-fluorene]-2,7-diamine (Spiro-NPB), N,N'-di(1-naphthyl)-N,N-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

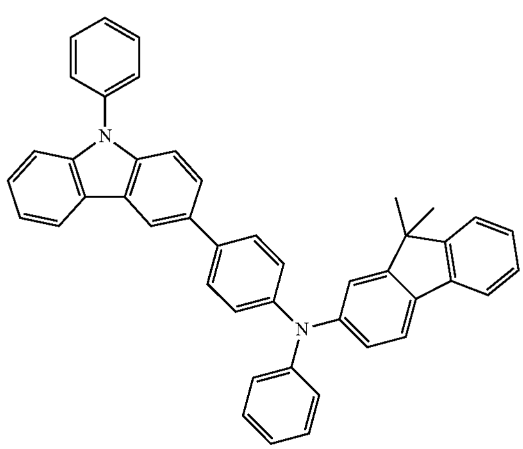

HT2

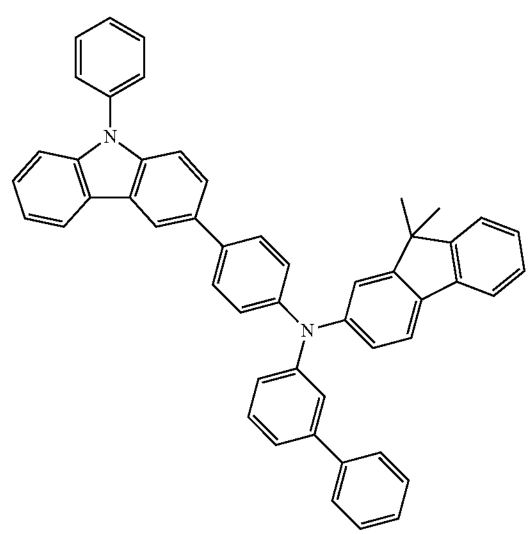

-continued
HT3
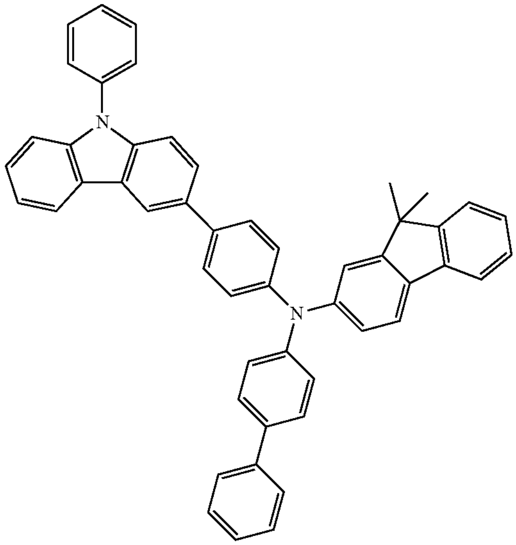
HT4
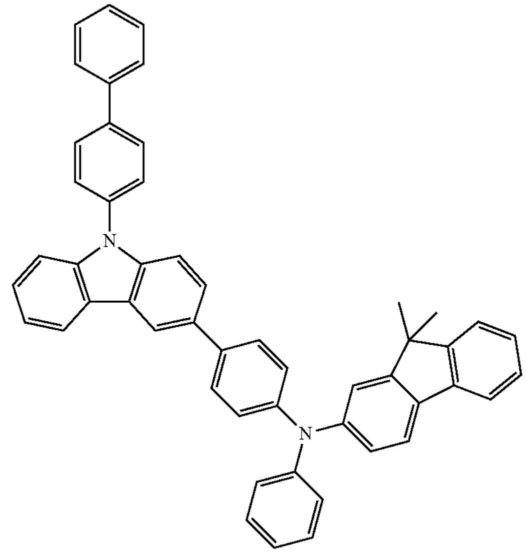
HT5
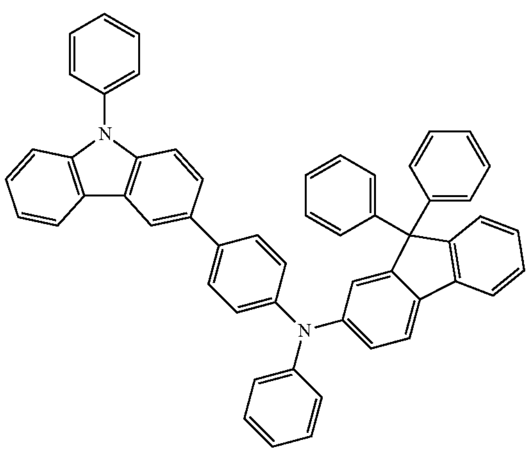
HT6
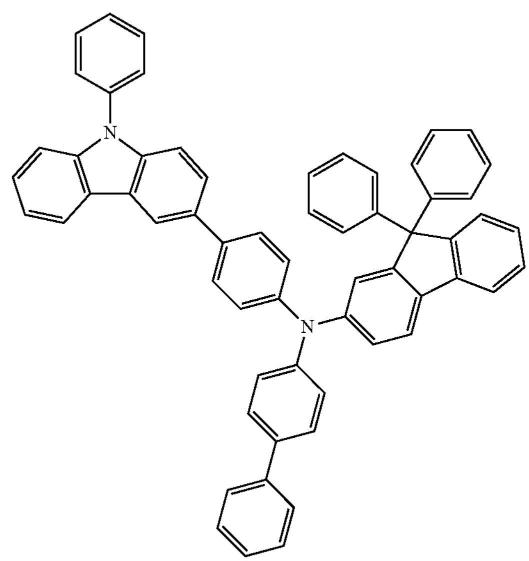

-continued
HT7
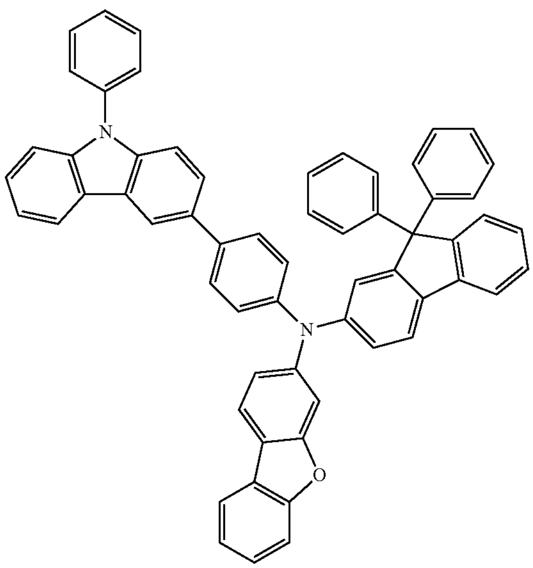
HT8
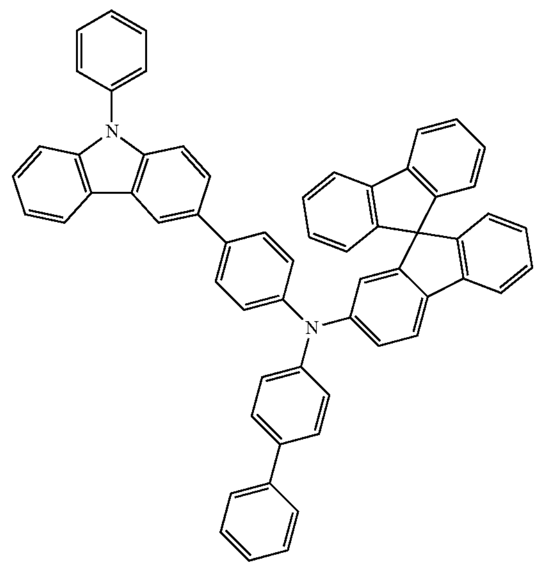
HT9
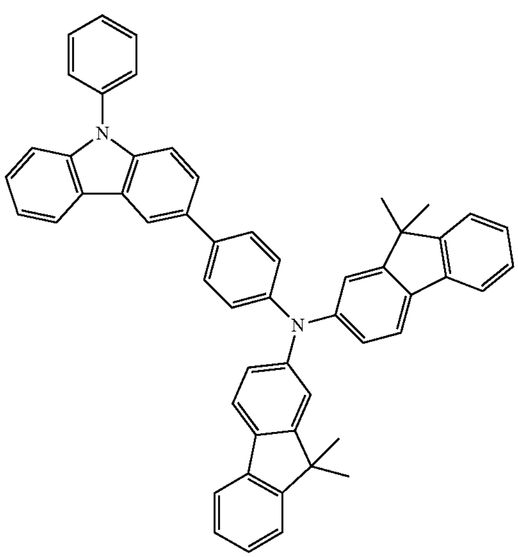
HT10
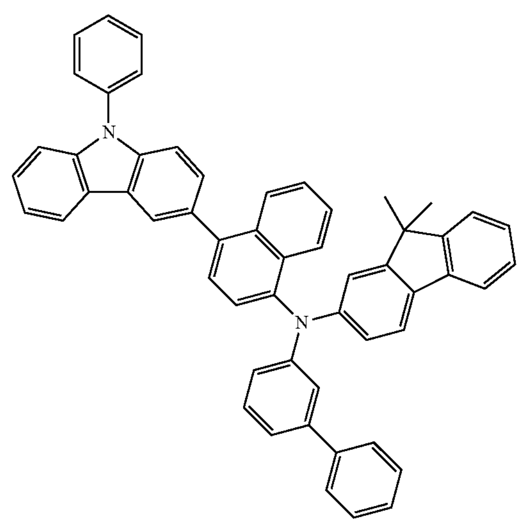
HT11
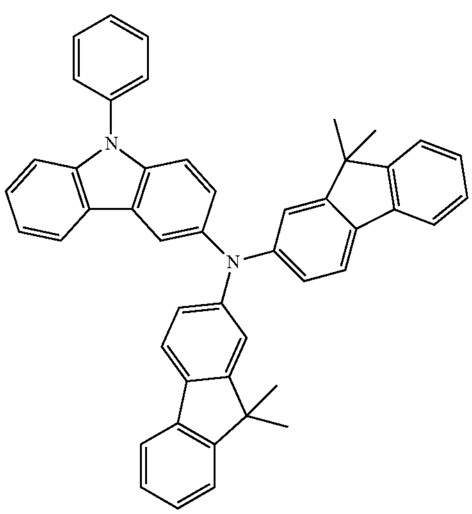
HT12
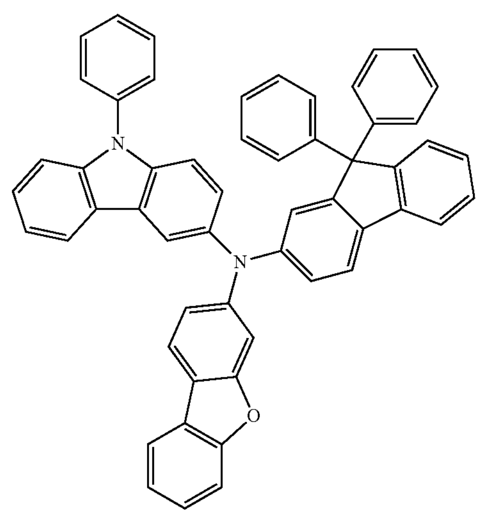

-continued
HT13
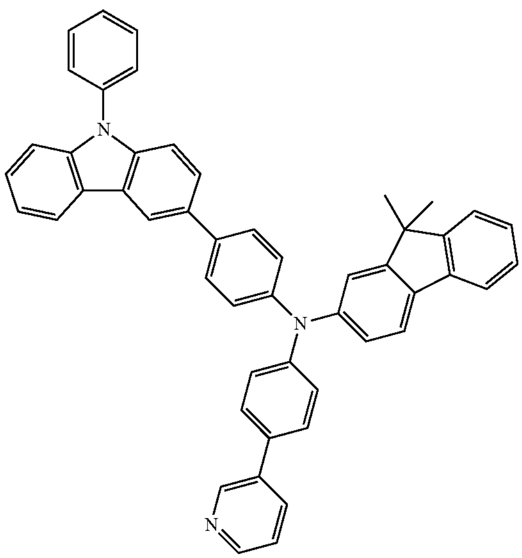
HT14
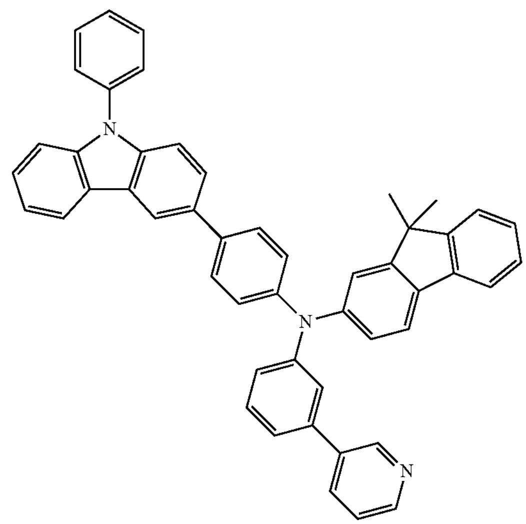
HT15
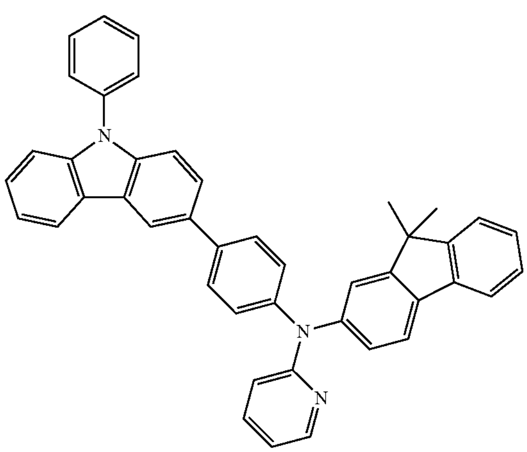
HT16
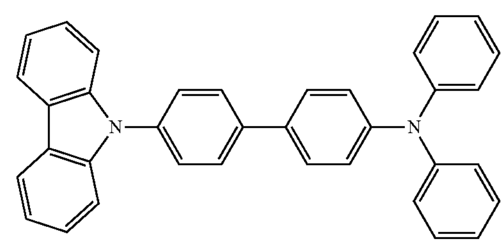
HT17
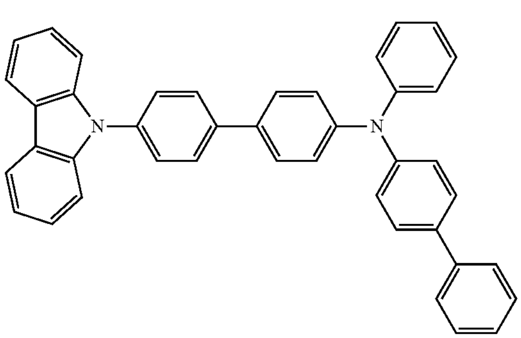
HT18
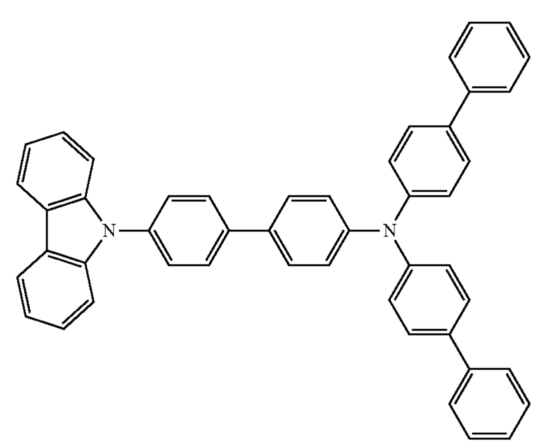

-continued
HT19
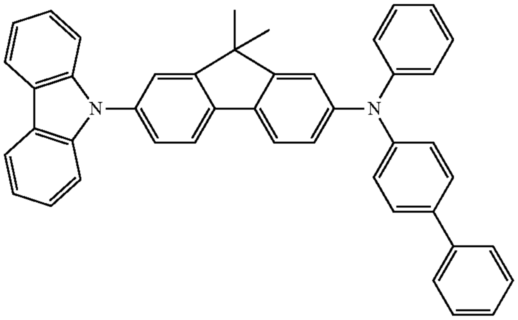
HT20
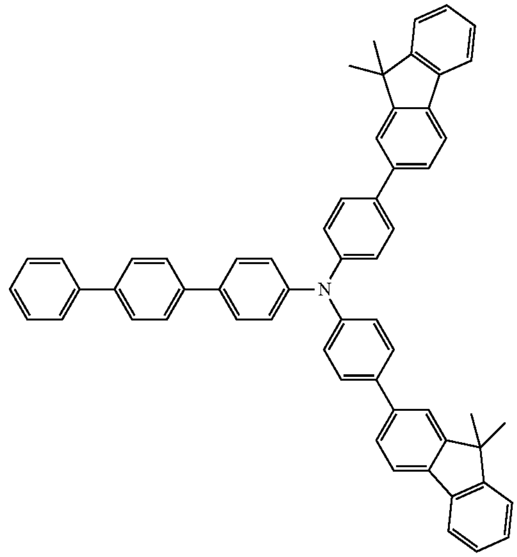
HT21
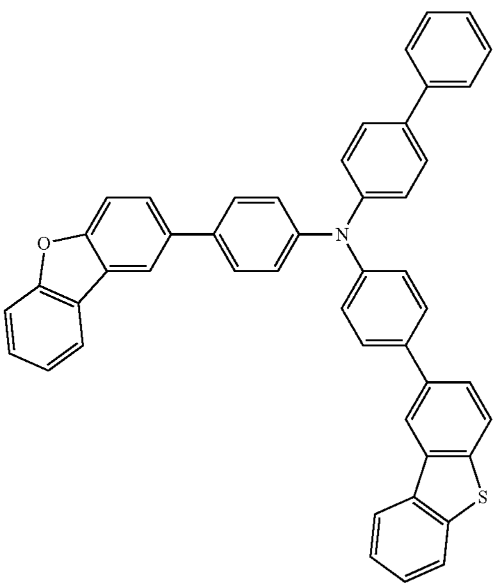
HT22
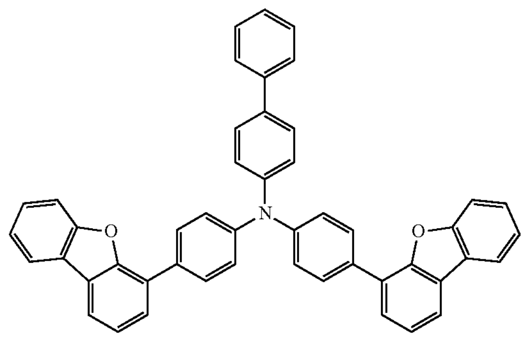
HT23
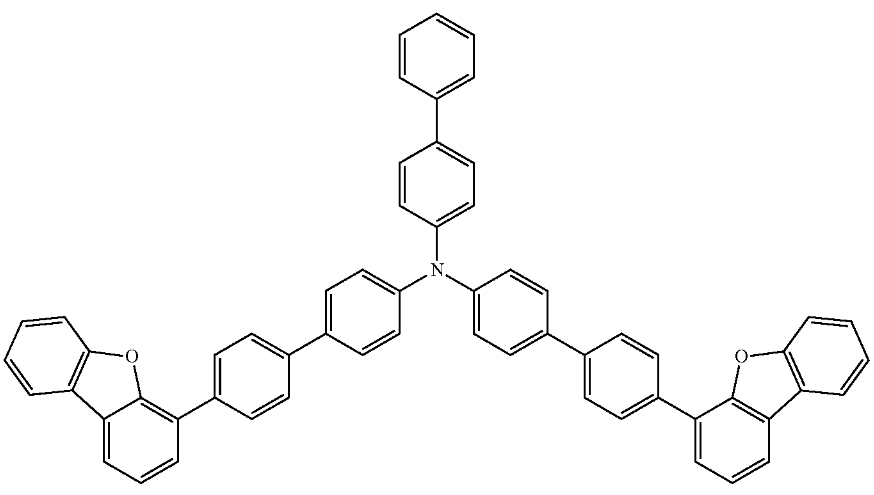

-continued
HT24
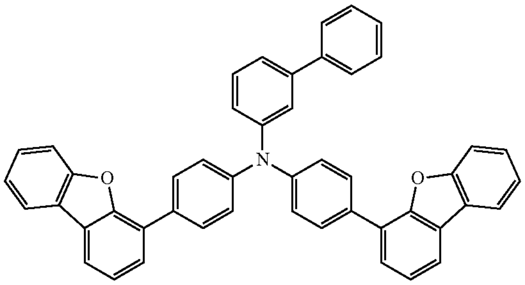
HT25
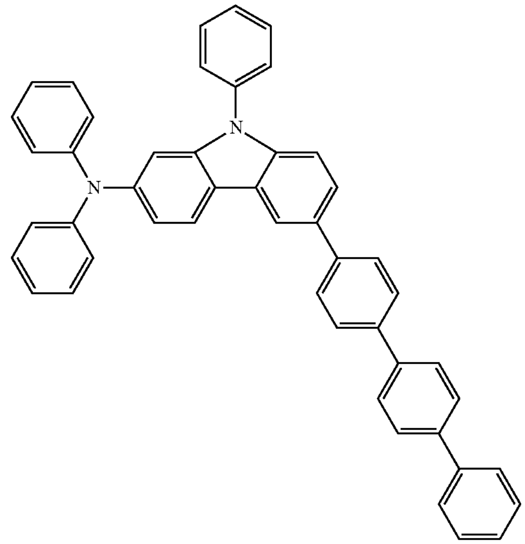
HT26
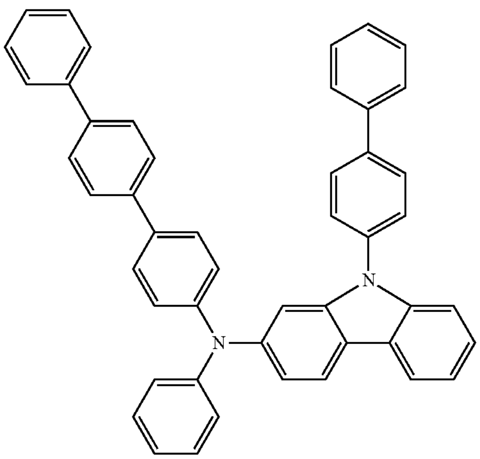
HT27
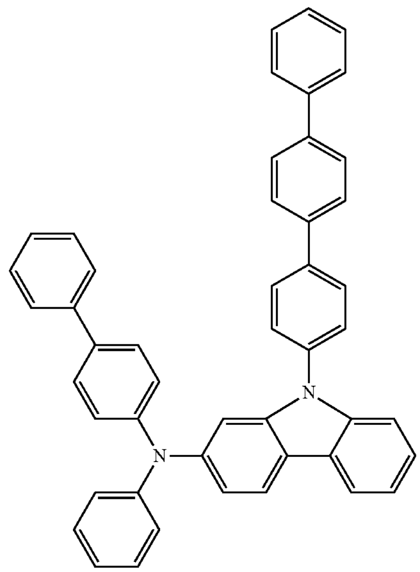
HT28
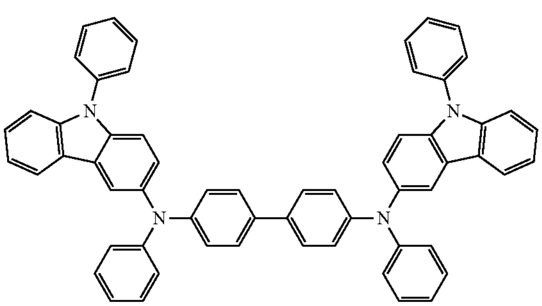
HT29
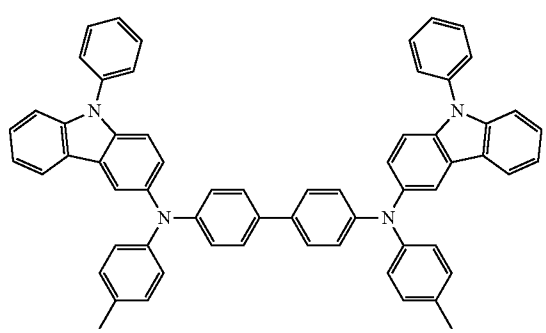

-continued
HT30
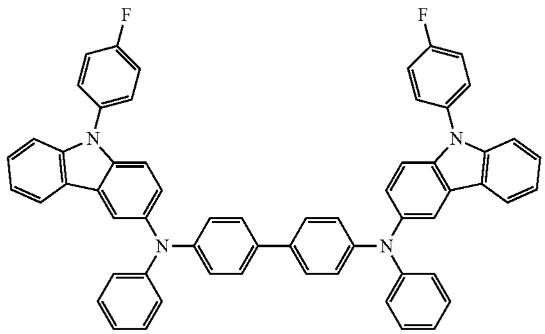
HT31
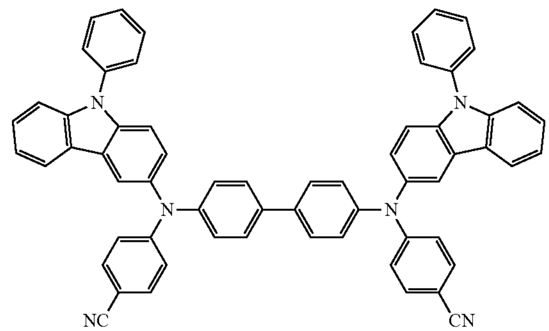
HT32
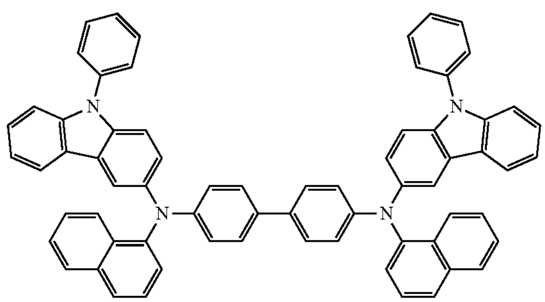
HT33
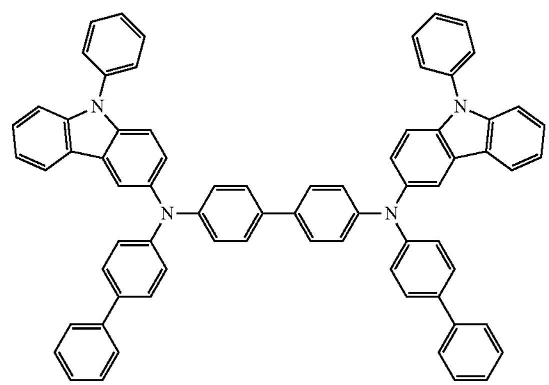
HT34
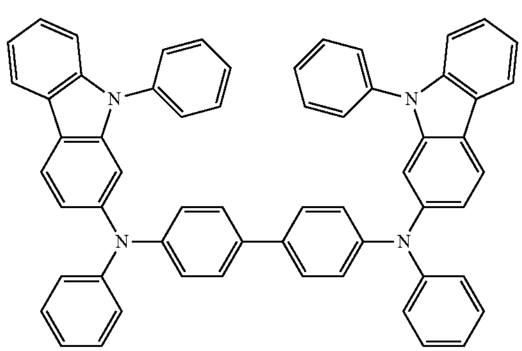
HT35
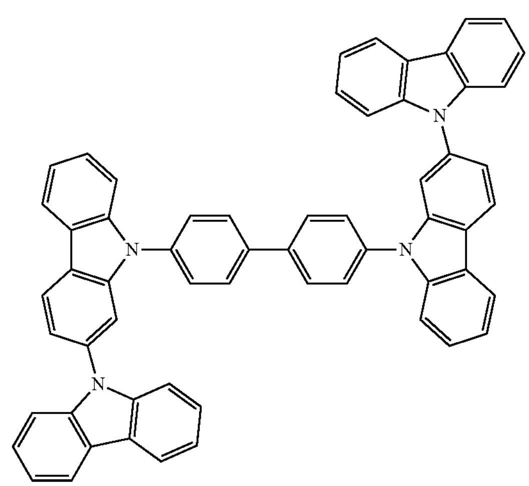

-continued
HT36
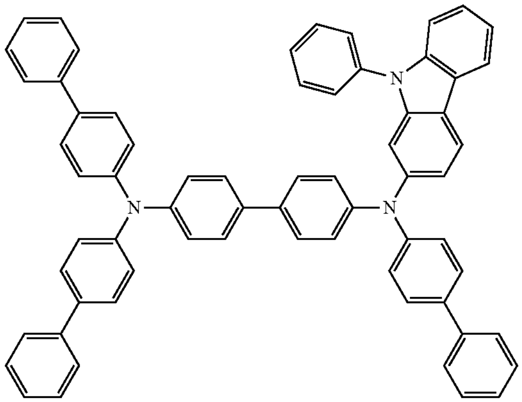
HT37
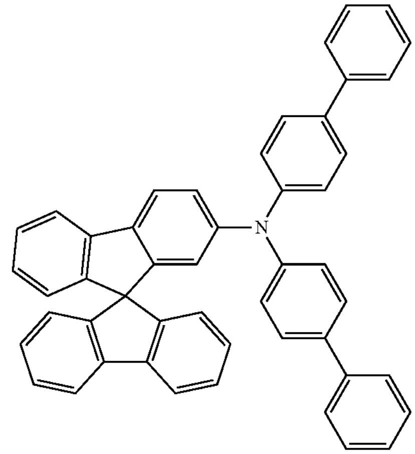
HT38
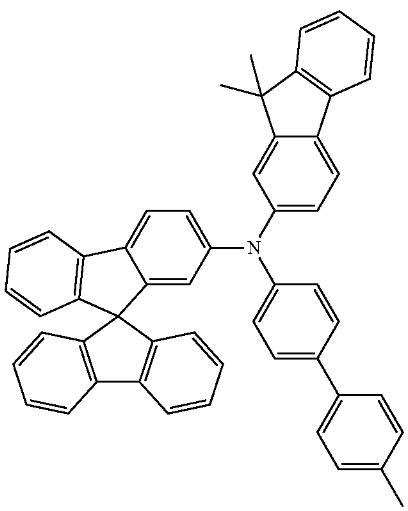
HT39
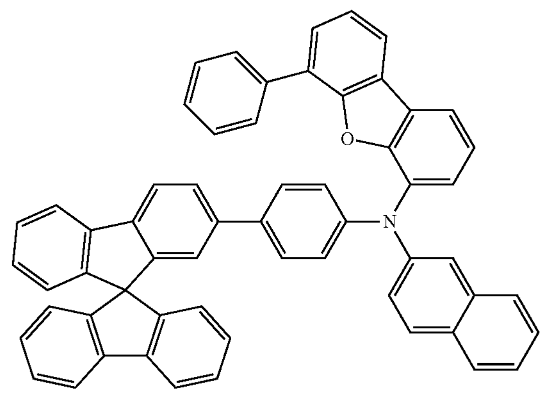
HT40
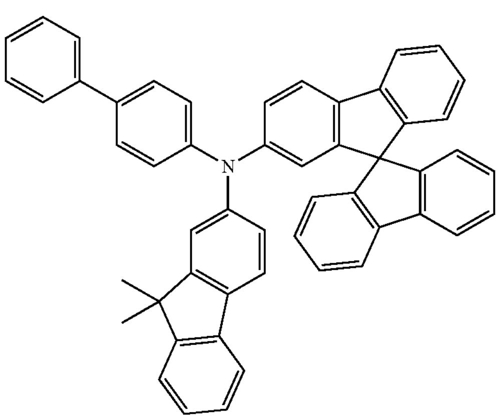
HT41
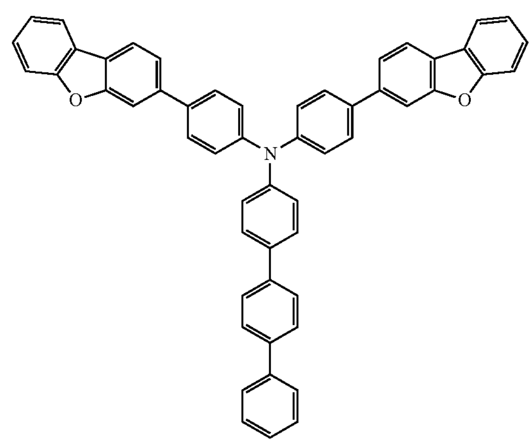

-continued
HT42
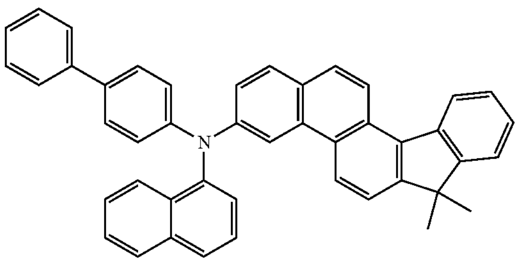
HT43
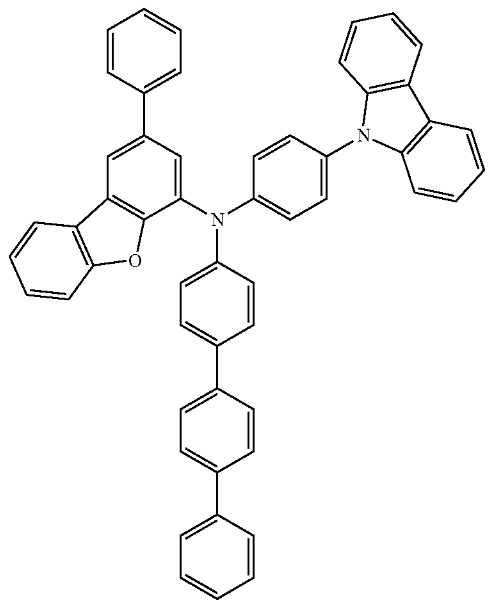
HT44
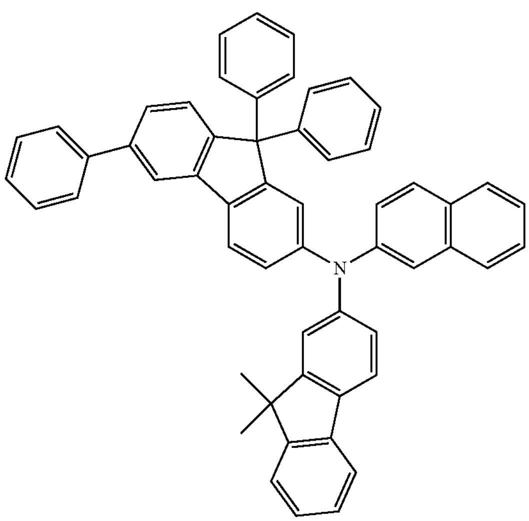
HT45
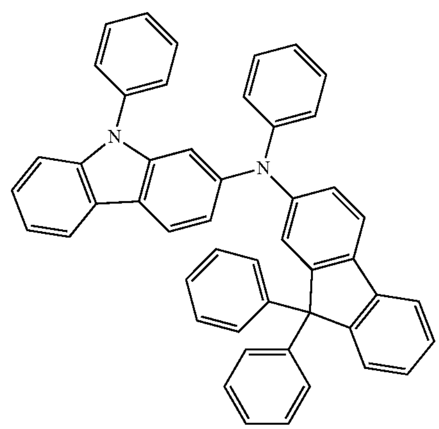
HT46
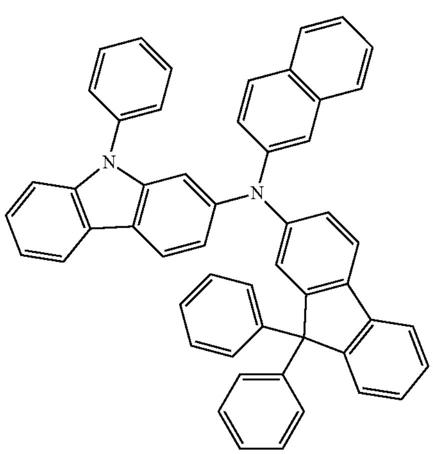
HT47
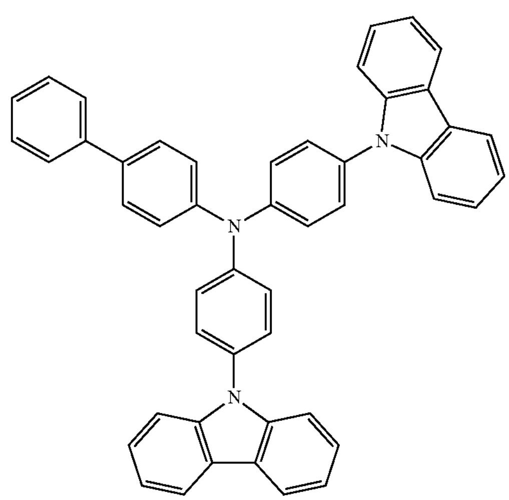

-continued
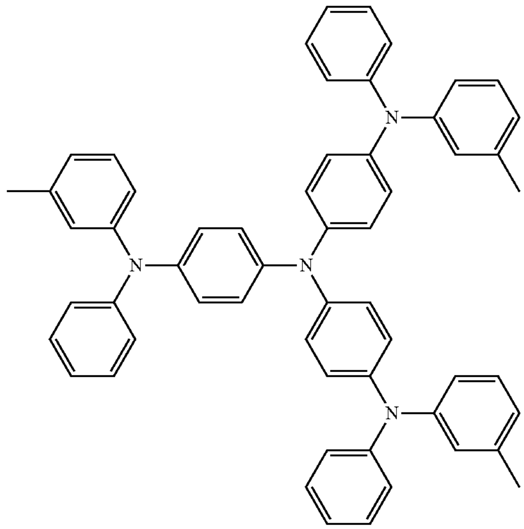
m-MTDATA
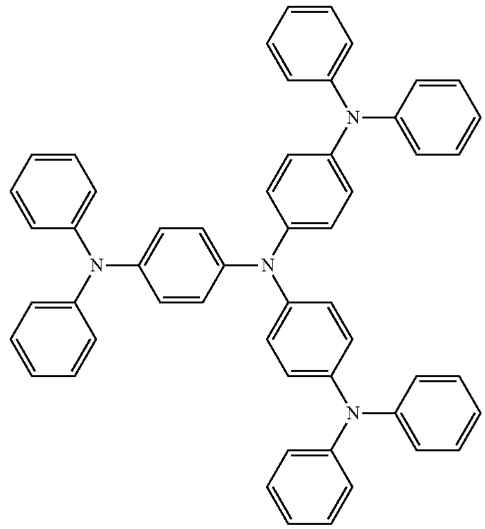
TDATA
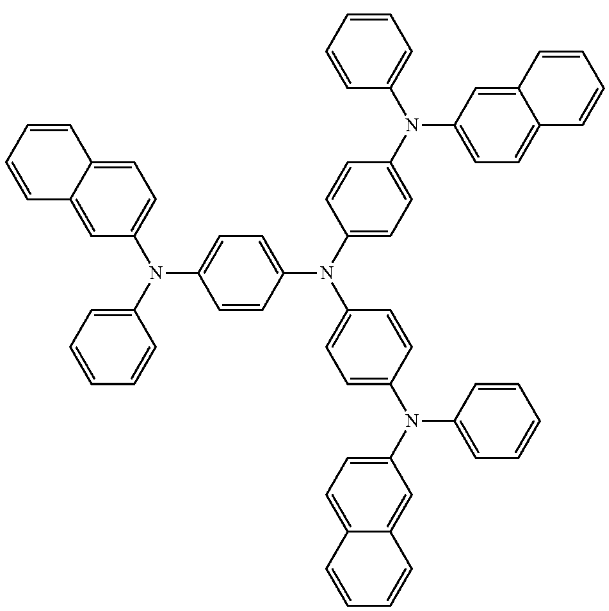
2-TNATA
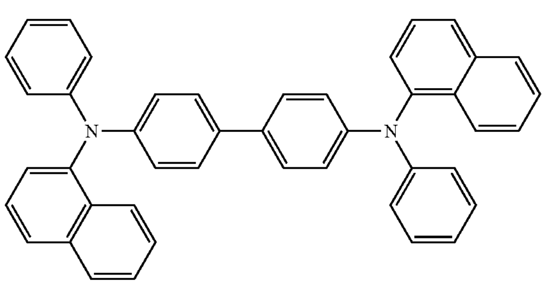
NPB -continued
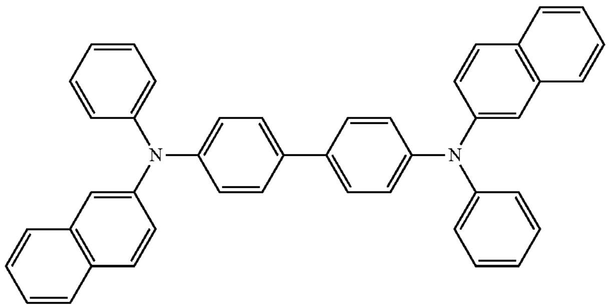
β-NPB
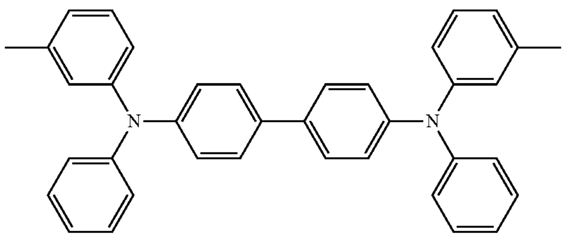
TPD
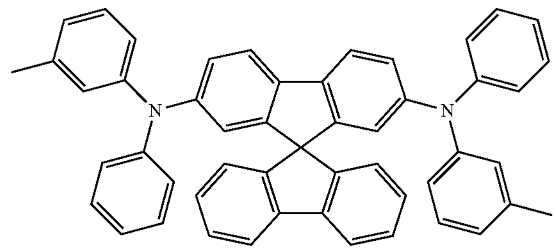
Spiro-TPD
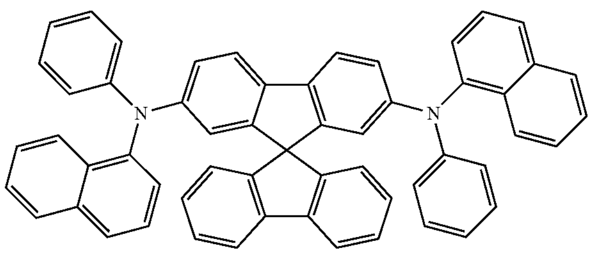
Spiro-NPB
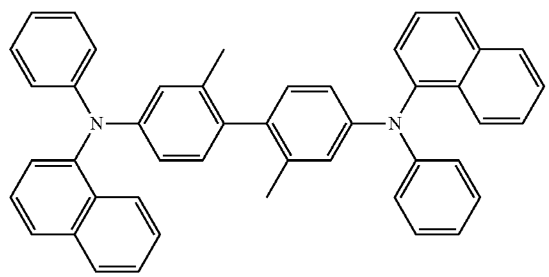
methylated-NPB
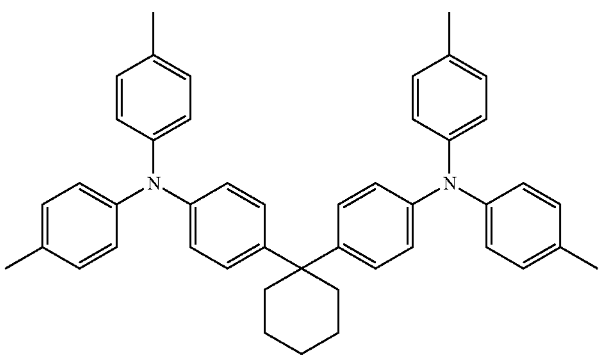
TAPC
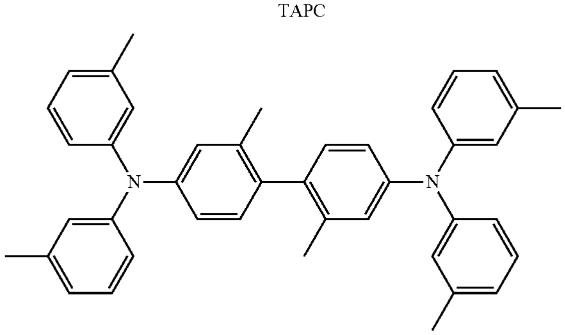
HMTPD The thickness of the hole transport region may be in a range of about 50 Å to about 10,000 Å, for example, about 100 Å to about 4,000 Å. When the hole transport region includes a hole injection layer, a hole transport layer, or any combination thereof, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer, and the hole transport layer are within these ranges described above, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the leakage of electrons from an emission layer to a hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant. In an embodiment, the lowest unoccupied molecular orbital (LUMO) energy level of the p-dopant may be about −3.5 eV or less.

In an embodiment, the p-dopant may include a quinone derivative, a cyano group-containing compound, a compound containing element EL1 and element EL2, or any combination thereof.

Examples of the quinone derivative are tetracyanoquinodimethane (TCNQ), 2,3,5,6-tetrafluoro-7,7,8,8-tetracyanoquinodimethane (F4-TCNQ), etc. Examples of the cyano group-containing compound are 1,4,5,8,9,12-hexaazatriphenylene-hexacarbonitrile (HAT-CN), and a compound represented by Formula 221 below.

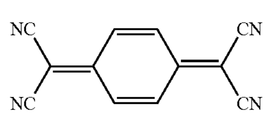

TCNQ

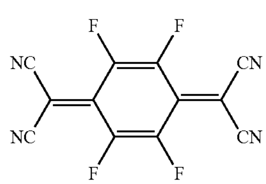

F4-TCNQ

-continued

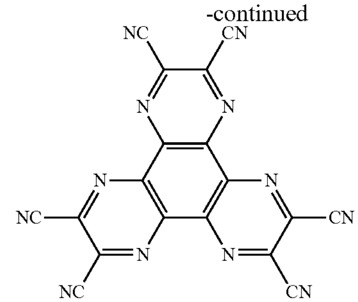

HAT-CN

Formula 221

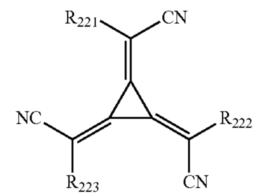

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or a combination thereof, and element EL2 may be non-metal, metalloid, or a combination thereof.

Examples of the metal are an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium (Lu), etc.).

Examples of the metalloid are silicon (Si), antimony (Sb), and tellurium (Te). Examples of the non-metal are oxygen (O) and halogen (for example, F, Cl, Br, I, etc.).

In an embodiment, examples of the compound containing element EL1 and element EL2 are metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or any combination thereof.

Examples of the metal oxide are tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI. Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, IrBrz, $Ir_{12}$, etc.), nickel halide (for example, $NiF_2$, $NiCl_2$, NiBrz, $NiI_2$, etc.), palladium halide (for example, $PdF_2$, $PdCl_2$, PdBrz, $PdI_2$, etc.), platinum halide (for example, $PtF_2$, $PtCl_2$, $PtBr_2$, $PtI_2$, etc.), copper halide (for example, CuF, CuCl, CuBr, Cut etc.), silver halide (for example, AgF, AgCl, AgBr, AgI, etc.), and gold halide (for example, AuF, AuCl, AuBr, AuI, etc.).

Examples of the post-transition metal halide are zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.). Examples of the lanthanide metal halide are YbF, $YbF_2$, $YbF_3$, $SmF_3$, $YbC_1$, $YbCl_2$, $YbCl_3$, $SmCl_3$, YbBr, $YbBr_2$, $YbBr_3$, $SmBr_3$, YbI, $YbI_2$, $YbI_3$, and $SmI_3$. An example of the metalloid halide is antimony halide (for example, $SbCl_5$, etc.).

Examples of the metal telluride are alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, Cu2Te, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer 131 in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of the red emission layer, the green emission layer, and the blue emission layer, in which the two or more layers contact each other or are separated from each other. In one or more embodiments, the emission layer may include two or more materials of the red light-emitting material, the green light-emitting material, and the blue light-emitting material, in which the two or more materials are mixed with each other in a single layer to emit white light.

The emission layer may include a host and a dopant. The dopant may include a phosphorescent dopant, a fluorescent dopant, or any combination thereof. The amount of the dopant in the emission layer may be from about 0.01 to about 15 parts by weight based on 100 parts by weight of the host. In one or more embodiments, the emission layer may include a quantum dot. The emission layer may include a delayed fluorescence material. The delayed fluorescence material may act as a host or a dopant in the emission layer.

The thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host

The host may include more than two kinds of compounds. In an embodiment, the host may include a first host and a second host which are different from each other. In an embodiment, the first host may be a hole transport compound including at least one electron withdrawing group, and the second host may be an electron transport compound including at least one electron donating group.

In an embodiment, the electron withdrawing group may be:

—F, —$CFH_2$, —$CF_2H$, —$CF_3$, —CN, or —$NO_2$;

a $C_1$-$C_{60}$ alkyl group substituted with at least one —F, —$CFH_2$, —$CF_2H$, —$CF_3$, —CN, —$NO_2$, or any combination thereof; or a π electron-deficient nitrogen-containing $C_1$-$C_{60}$ cyclic group unsubstituted or substituted with at least one $Ra_u$, and the electron donating group may be a π electron-rich $C_3$-$C_{60}$ cyclic group unsubstituted or substituted with at least one $R_{30a}$ or —$N(Q_{41})(Q_{42})$.

$R_{20a}$ may be the same as described in connection with $R_{10a}$ herein, and $R_{30a}$ may be:

deuterium (-D), a hydroxyl group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, a hydroxyl group, a nitro group, a π electron-rich $C_3$-$C_{60}$ cyclic group, a $C_6$-$C_{60}$ aryloxy group, a $C_6$-$C_{60}$ arylthio group, —$Si(Q_{51})(Q_{52})(Q_{53})$, —$N(Q_{51})(Q_{52})$, —$B(Q_{51})(Q_{52})$, or any combination thereof;

a π electron-rich $C_3$-$C_{60}$ cyclic group, a $C_6$-$C_{60}$ aryloxy group, or a $C_6$-$C_{60}$ arylthio group, each unsubstituted or substituted with deuterium, a hydroxyl group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a π electron-rich $C_3$-$C_{60}$ cyclic group, a $C_6$-$C_{60}$ aryloxy group, a $C_6$-$C_{60}$ arylthio group, —$Si(Q_{61})(Q_{62})(Q_{63})$, —$N(Q_{61})(Q_{62})$, —$B(Q_{61})(Q_{62})$, or any combination thereof; or —$Si(Q_{71})(Q_{72})(Q_{73})$, —$N(Q_{71})(Q_{72})$, or —$B(Q_{71})(Q_{72})$, wherein $Q_{41}$, $Q_{42}$, $Q_{51}$ to $Q_{53}$, $Q_{61}$ to $Q_{63}$ and $Q_{71}$ to $Q_{73}$ may each independently be: hydrogen; deuterium; a hydroxyl group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a π electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, the host may include a compound represented by Formula 301 below:

$$[Ar_{301}]_{xb11}\text{-}[(L_{301})_{xb1}\text{-}R_{301}]_{xb21} \quad \text{Formula 301}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer selected from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer selected from 1 to 5, and $Q_{301}$ to $Q_{303}$ may be the same as described in connection with $Q_1$ herein.

In an embodiment, xb11 in Formula 301 is 2 or more, two or more of $Ar_{301(s)}$ may be linked to each other via a single bond.

In an embodiment, the host may include a compound represented by Formula 301-1, a compound represented by Formula 301-2, or any combination thereof:

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)xb4-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ are the same as described in connection with $R_{301}$.

In an embodiment, the host may include an alkaline earth metal complex, a post-transition metal complex, or any combination thereof. In an embodiment, the host may include a Be complex (for example, Compound H55), an Mg complex, a Zn complex, or a combination thereof.

In an embodiment, the host may include one of Compounds H1 to H124, H201 to H216 and H301 to H326, 9,10-di(2-naphthyl)anthracene (ADN), 2-Methyl-9,10-bis (naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

Formula 301-1

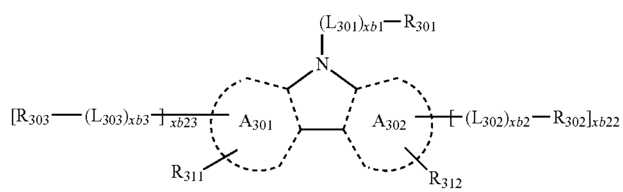

Formula 301-2

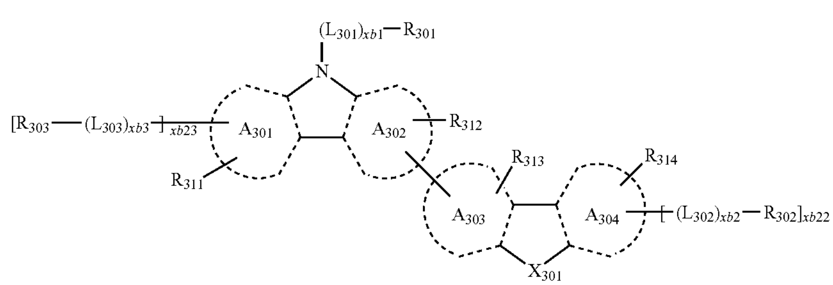

H1
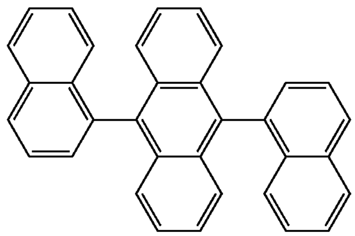
H2
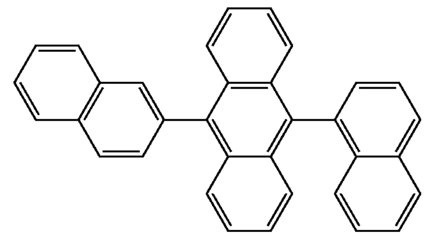
H3
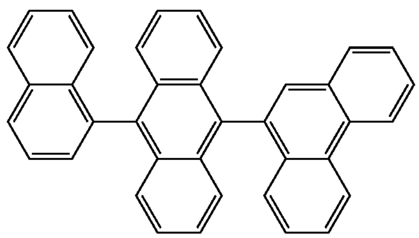
H4
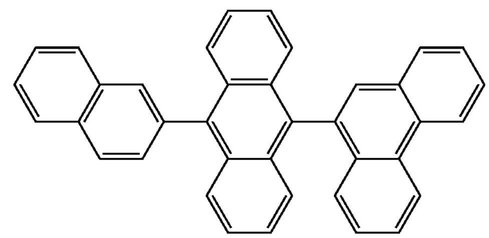
H5
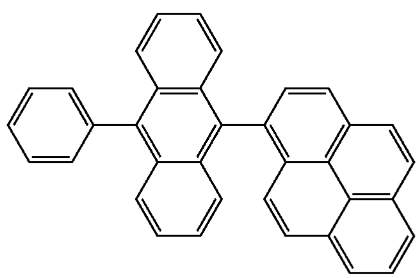
H6
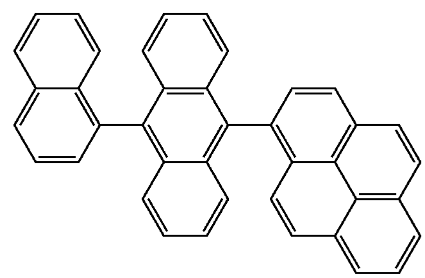
H7
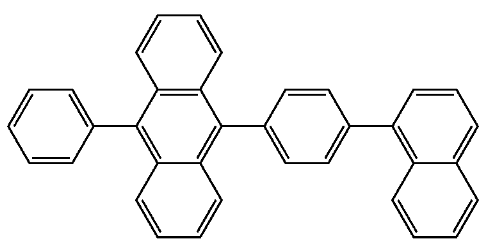
H8
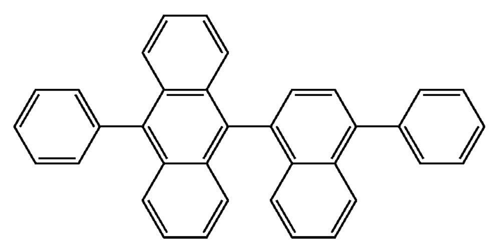
H9
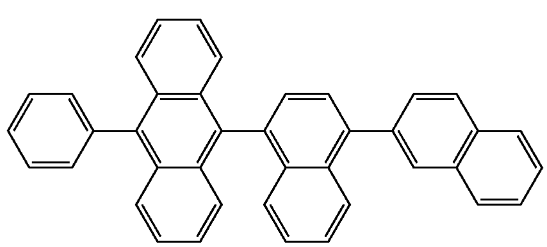
H10
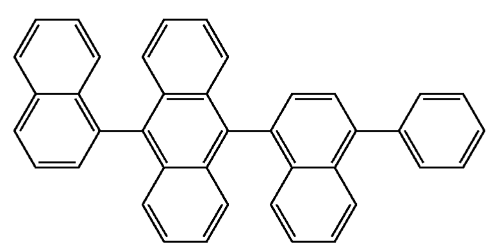
H11
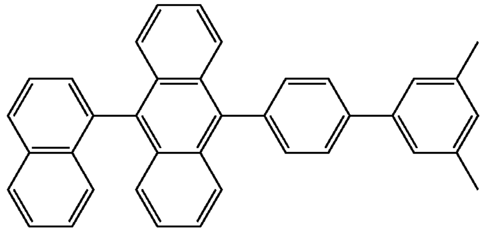
H12
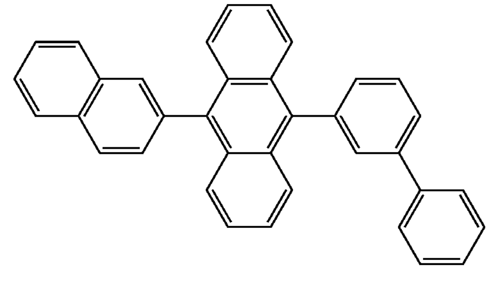

-continued
H13
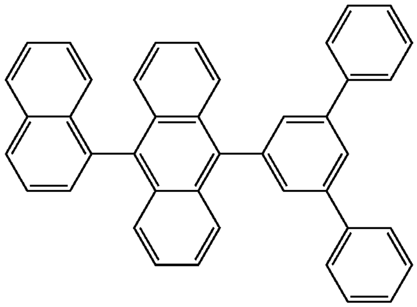
H14
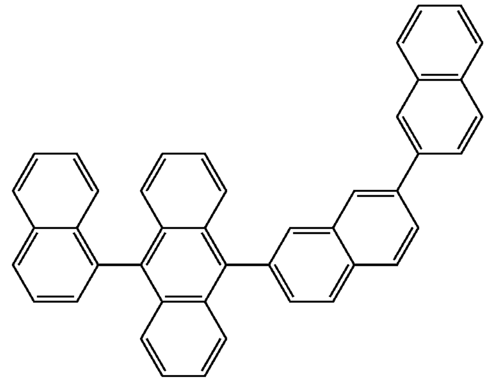
H15
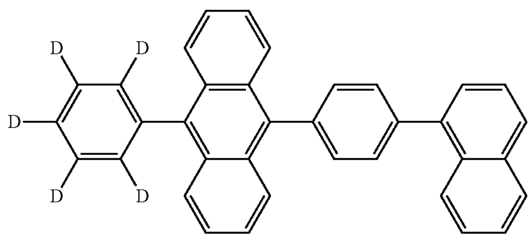
H16
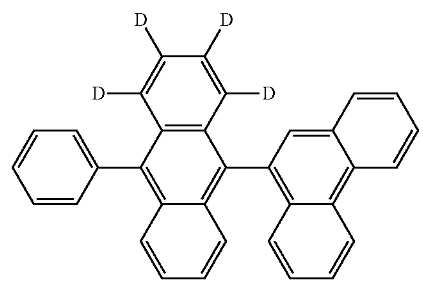
H17
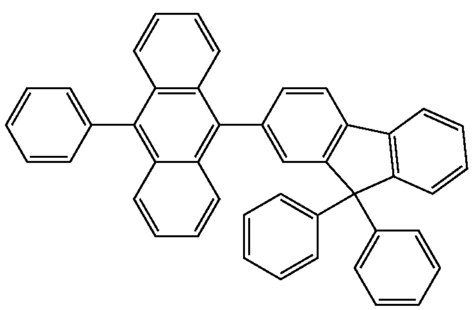
H18
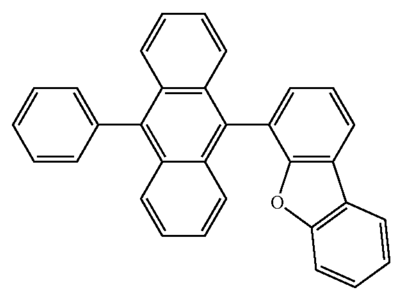
H19
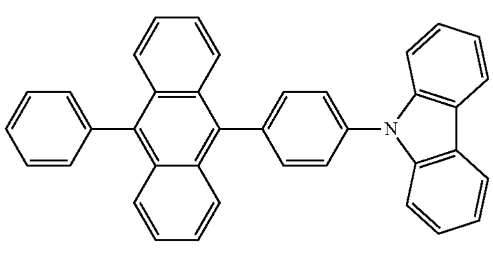
H20
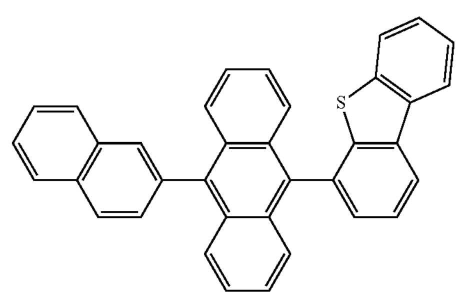

-continued
H21
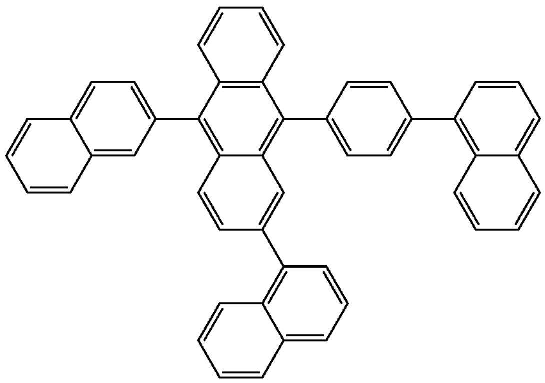
H22
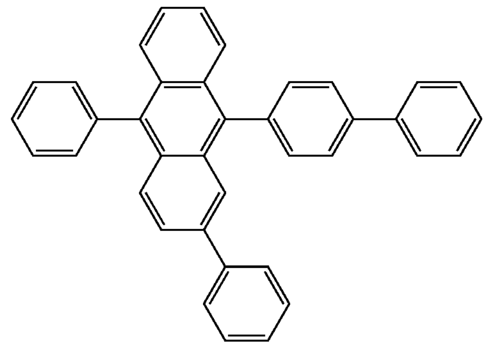
H23
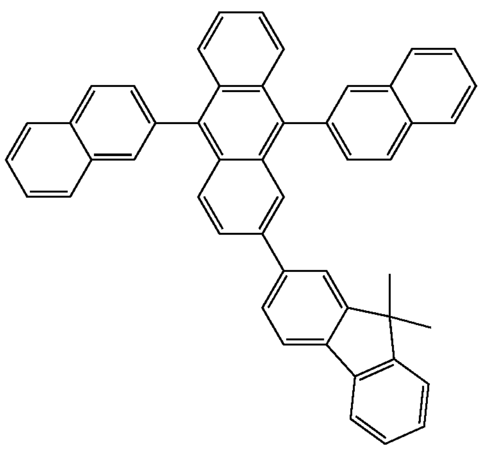
H24
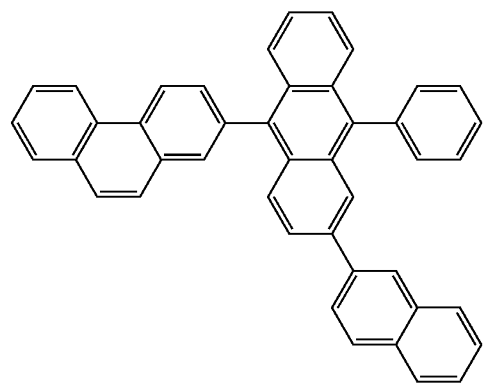
H25
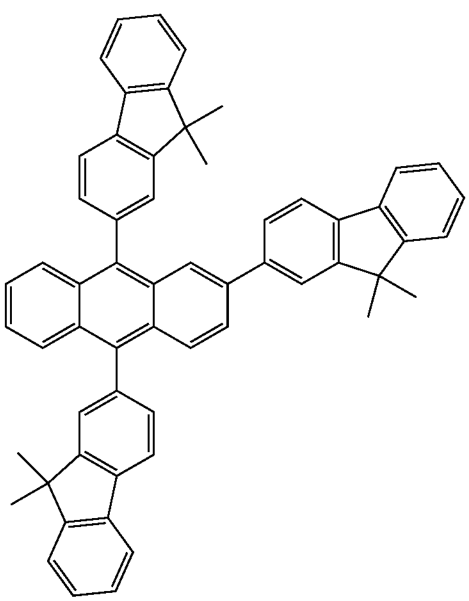
H26
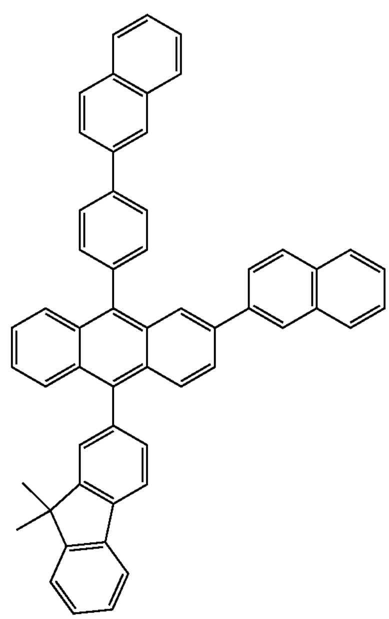

-continued
H27
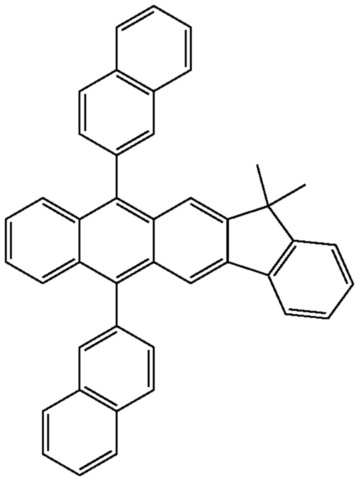
H28
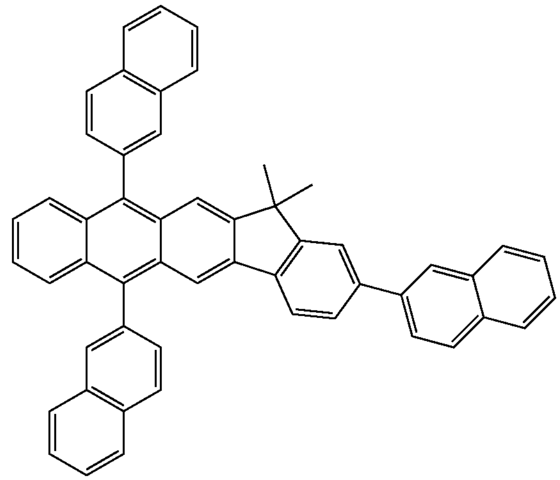
H29
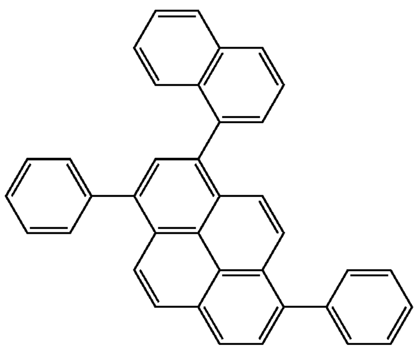
H30
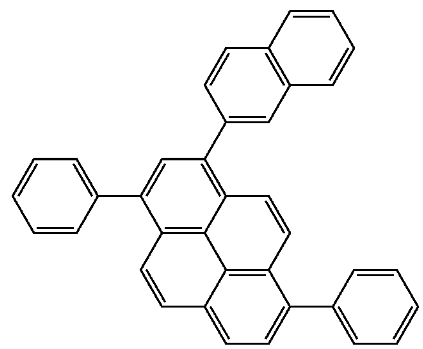
H31
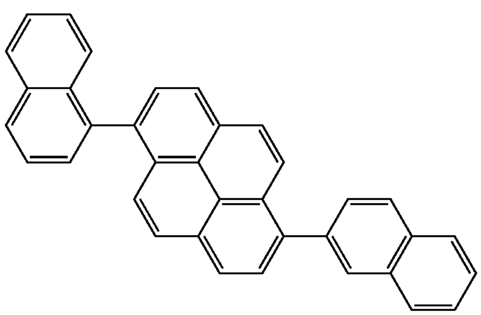
H32
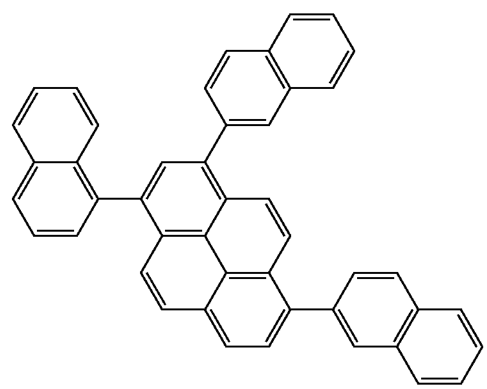
H33
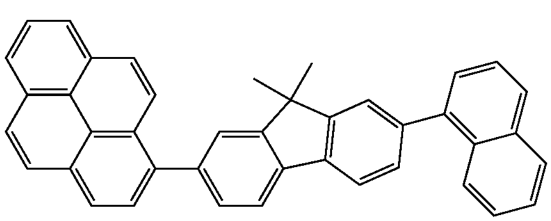
H34
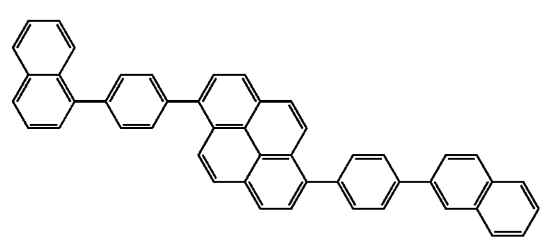

-continued
H35
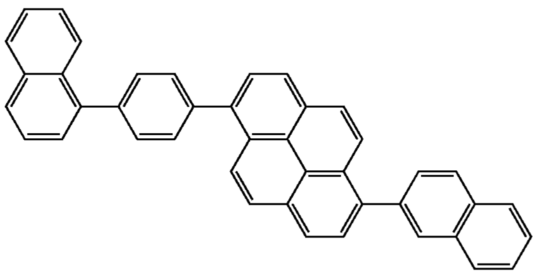
H36
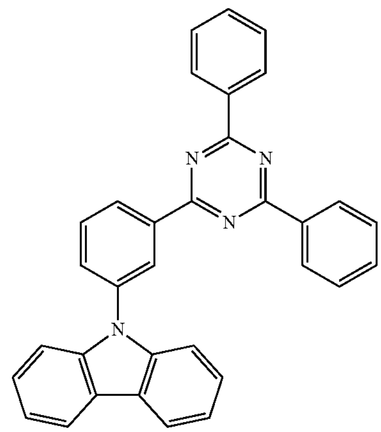
H37
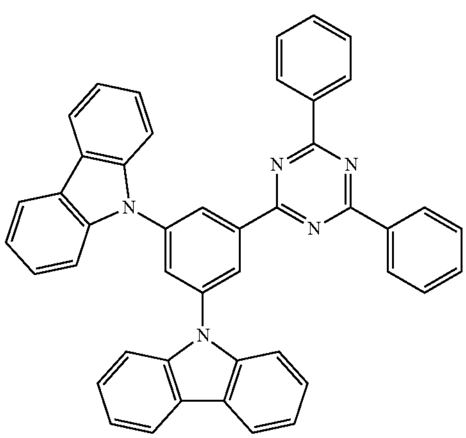
H38
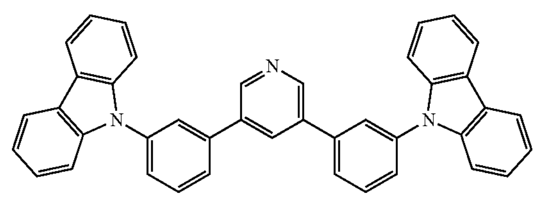
H39
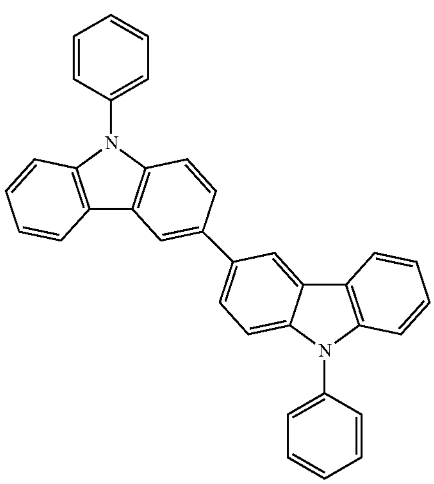
H40
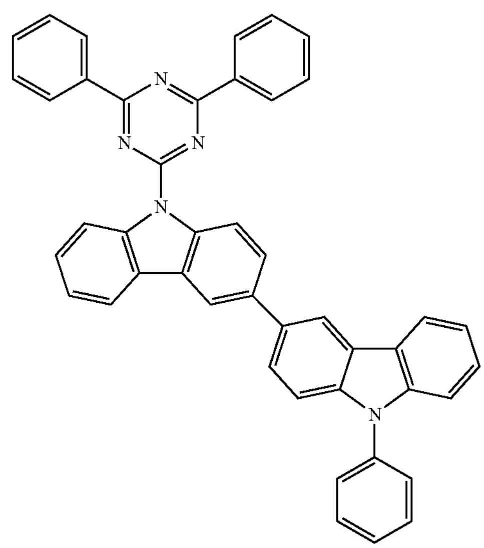

-continued
H41
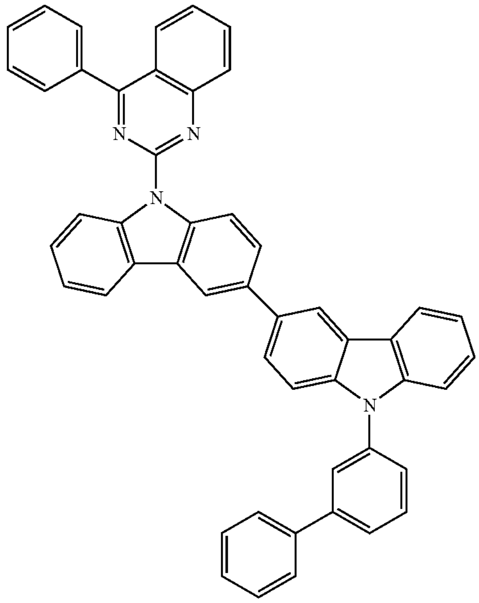
H42
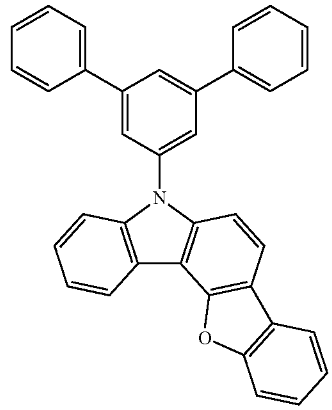
H43
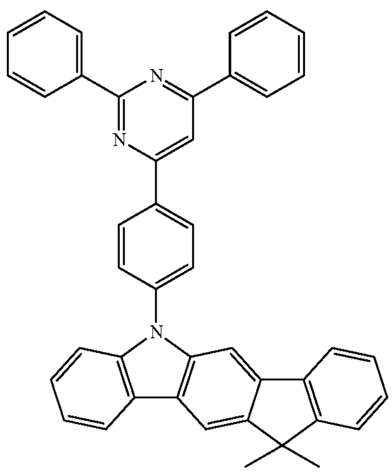
H44
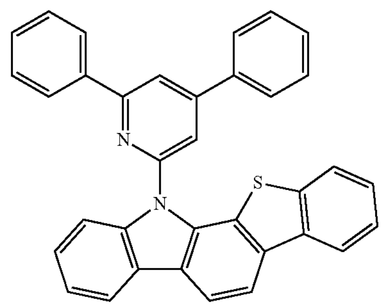
H45
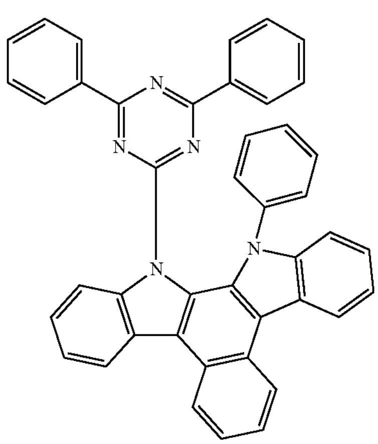
H46
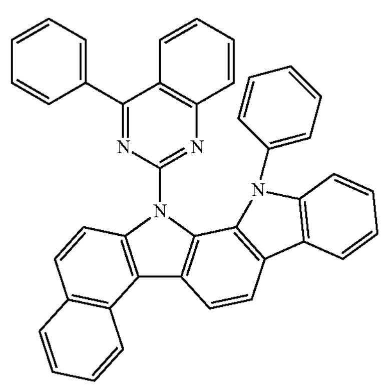

-continued
H47
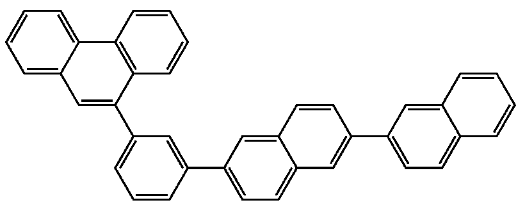
H48
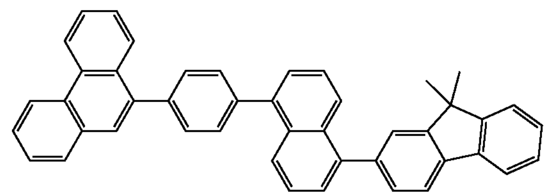
H49
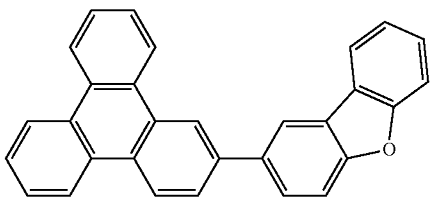
H50
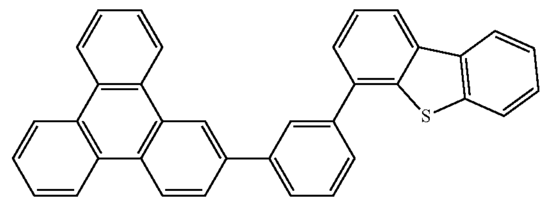
H51
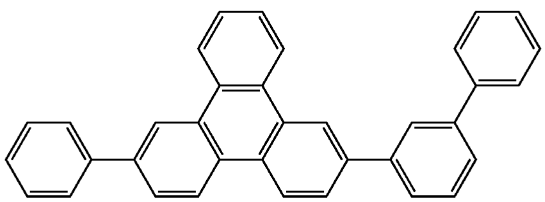
H52
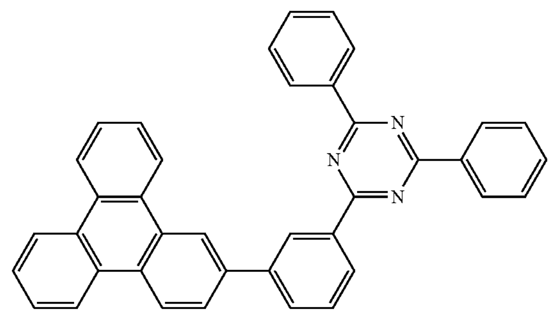
H53
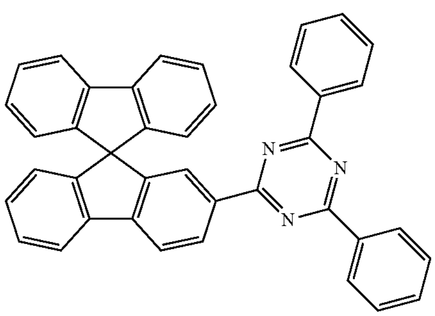
H54
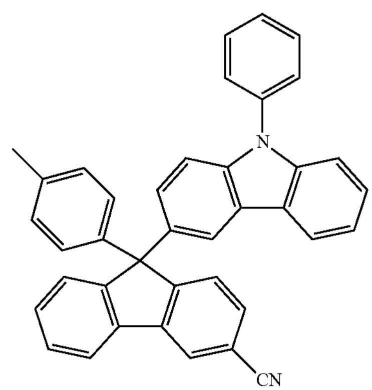
H55
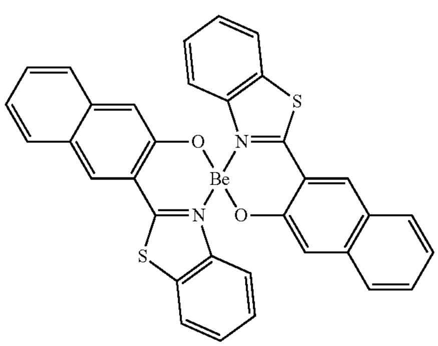
H56
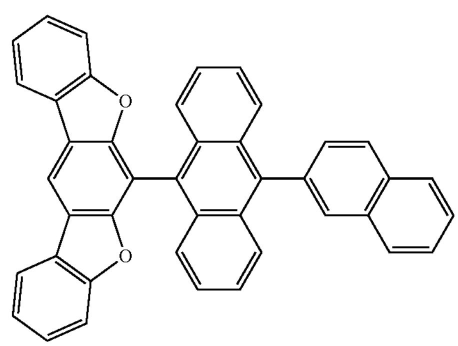

-continued
H57
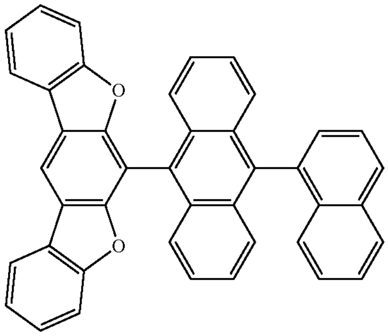
H58
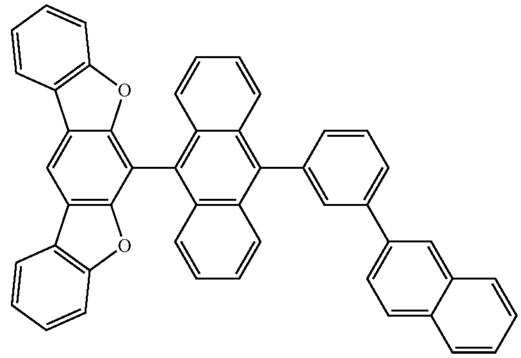
H59
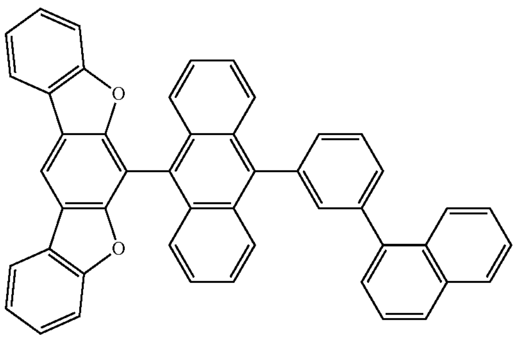
H60
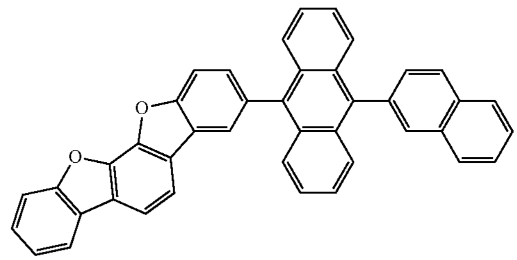
H61
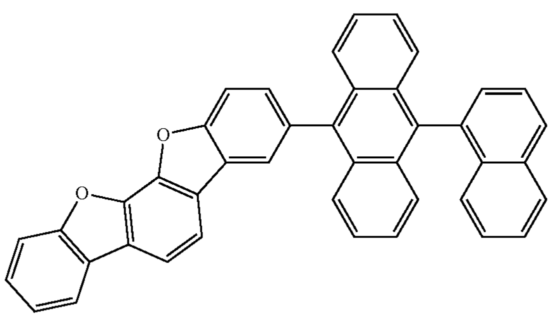
H62
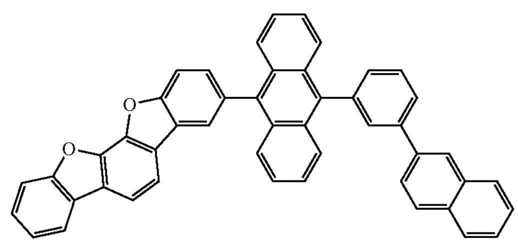
H63
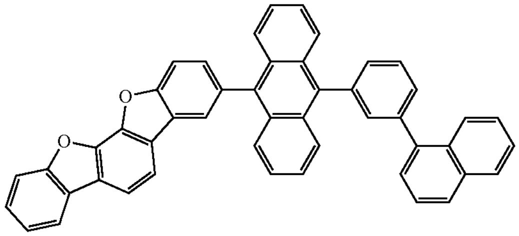
H64
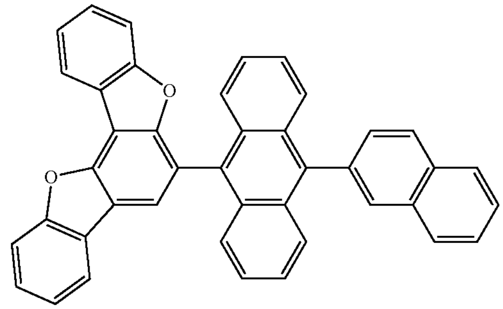

-continued
H65
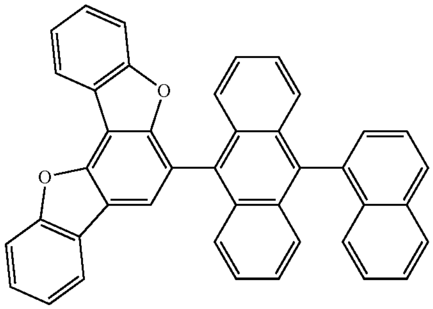
H66
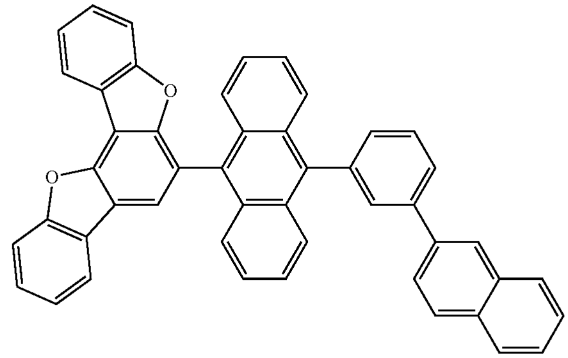
H67
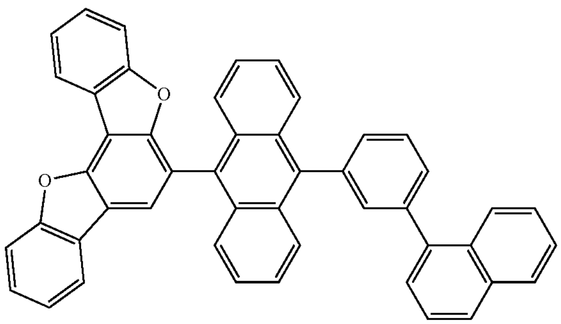
H68
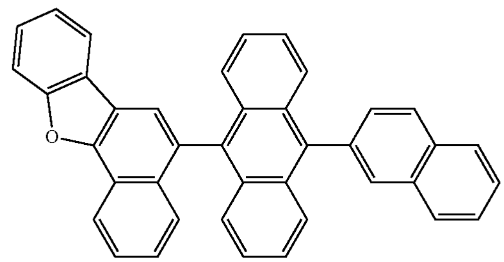
H69
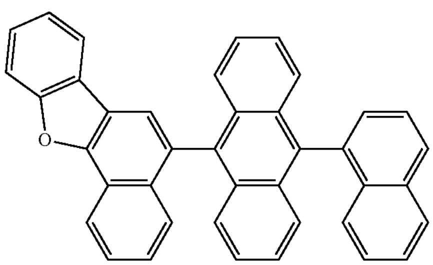
H70
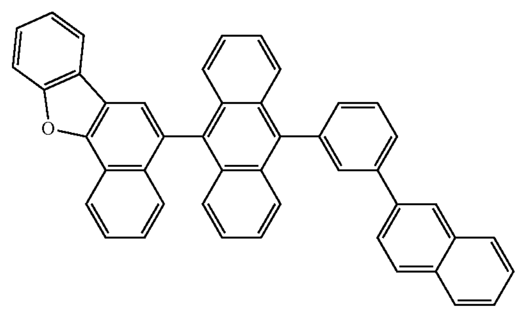
H71
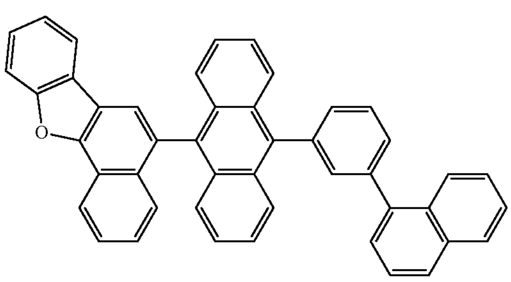
H72
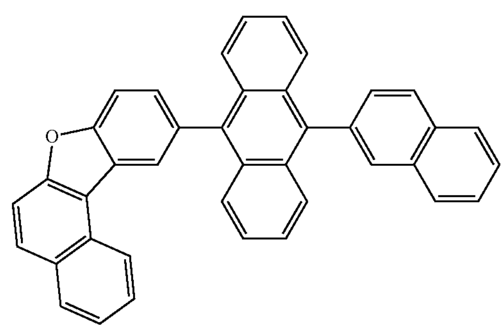

-continued
H73
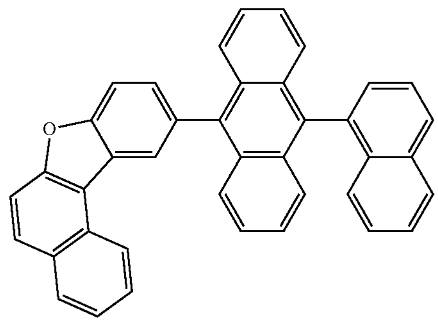
H74
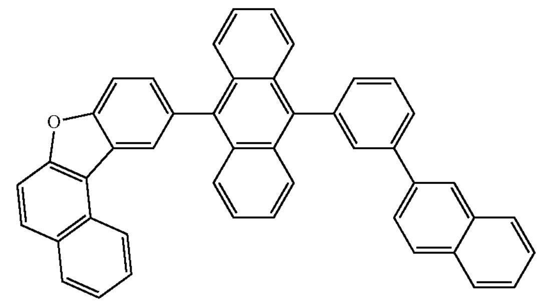
H75
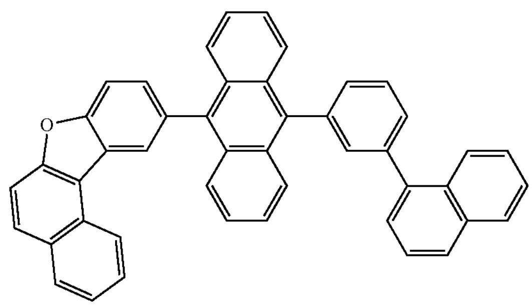
H76
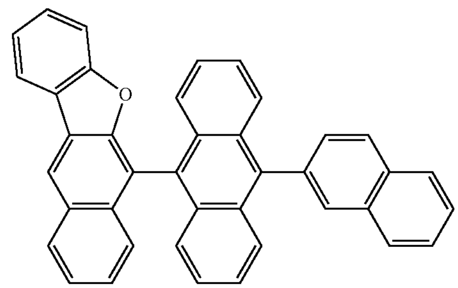
H77
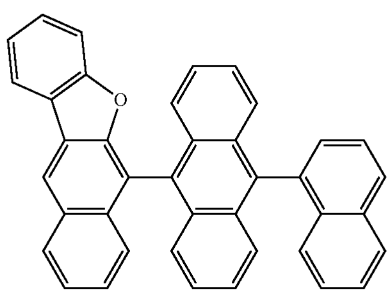
H78
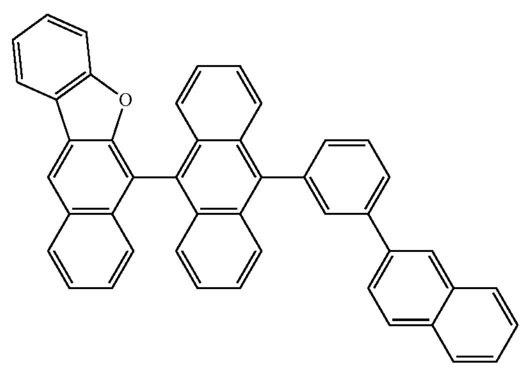
H79
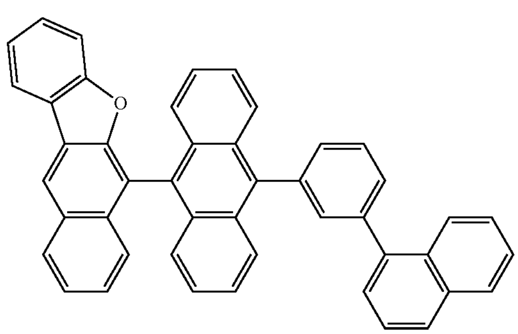
H80
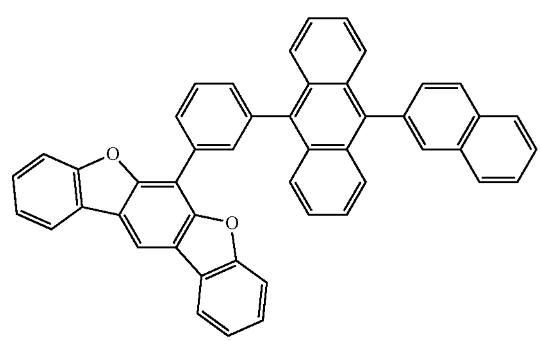

-continued
H81
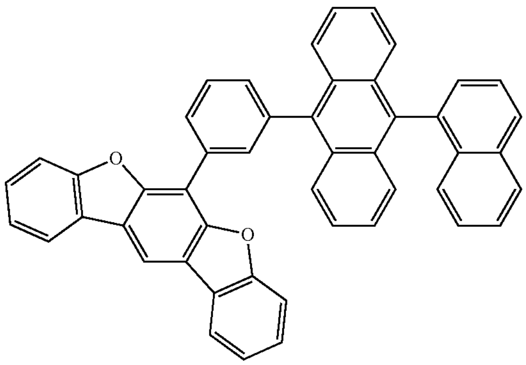
H82
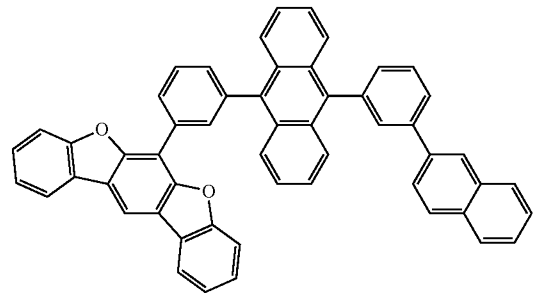
H83
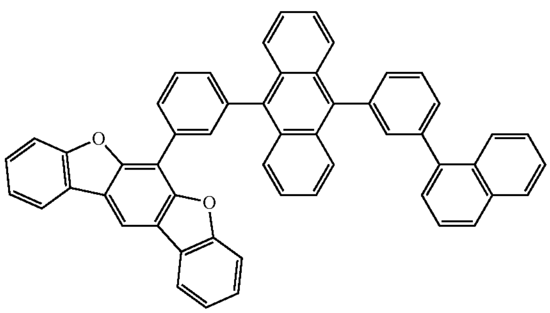
H84
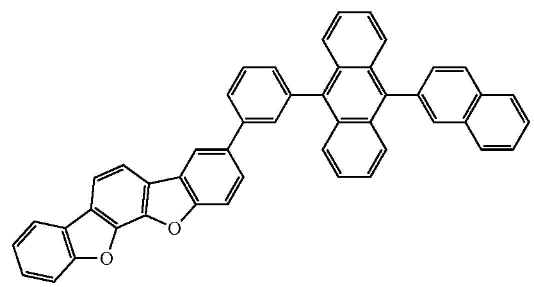
H85
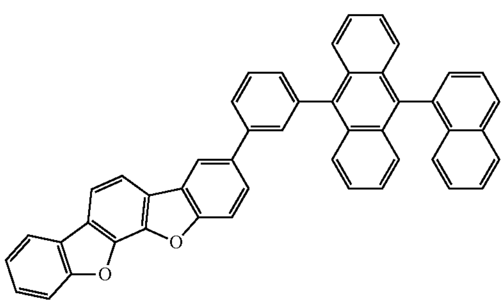
H86
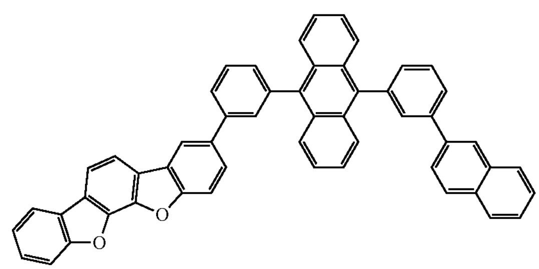
H87
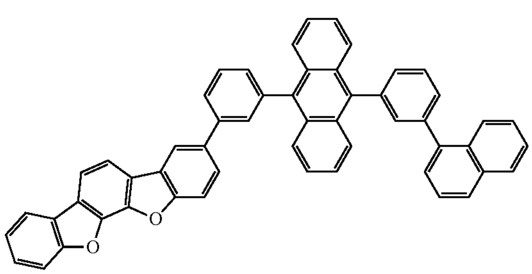
H88
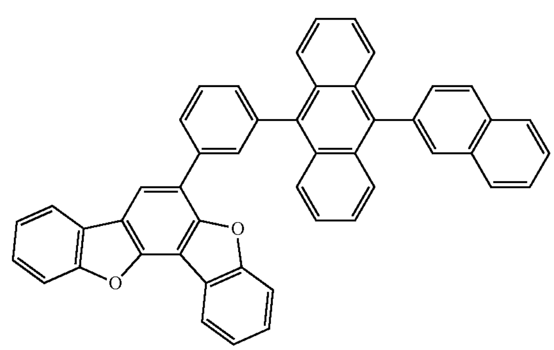

-continued
H89
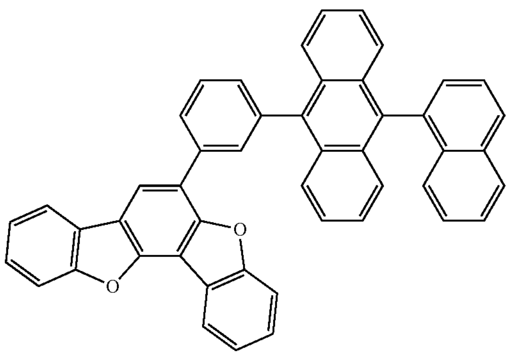
H90
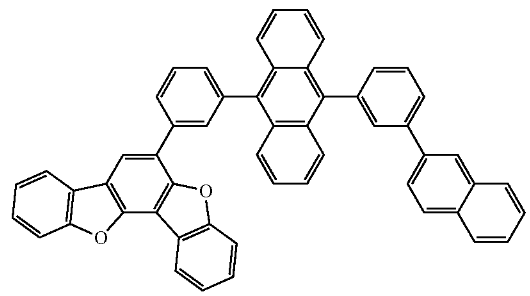
H91
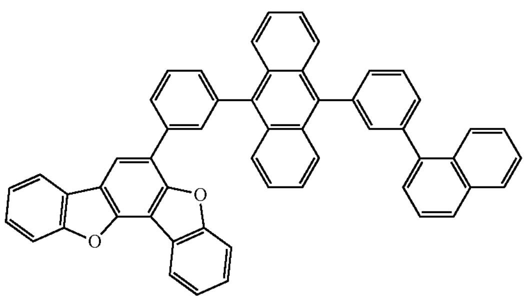
H92
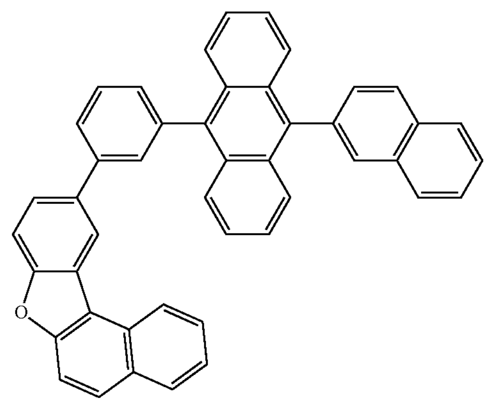
H93
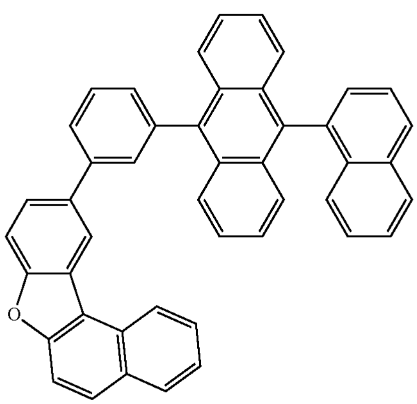
H94
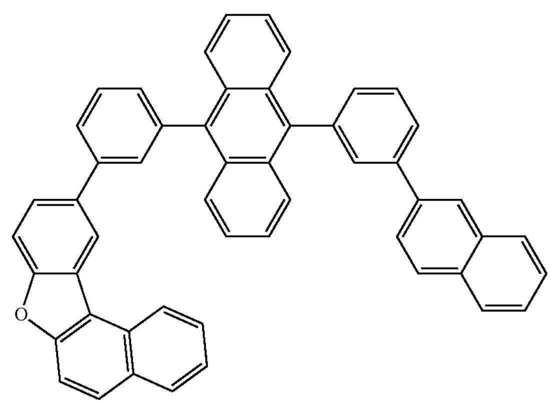
H95
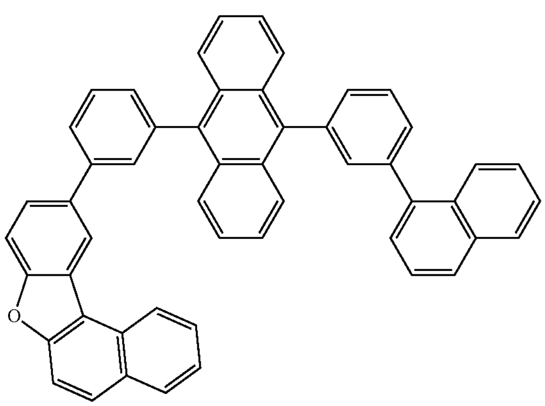
H96
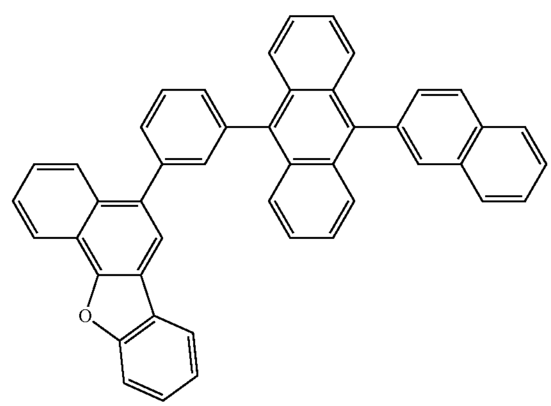

-continued
H97
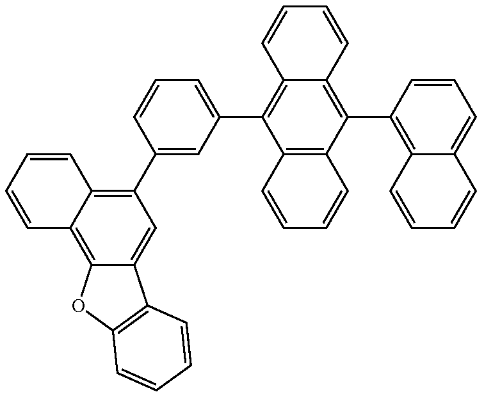
H98
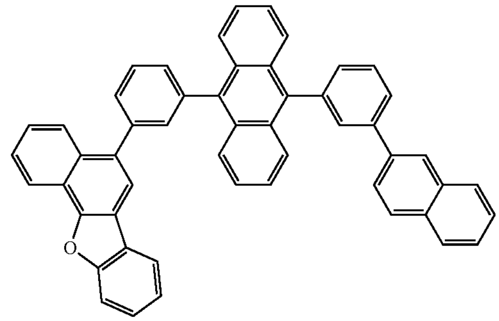
H99
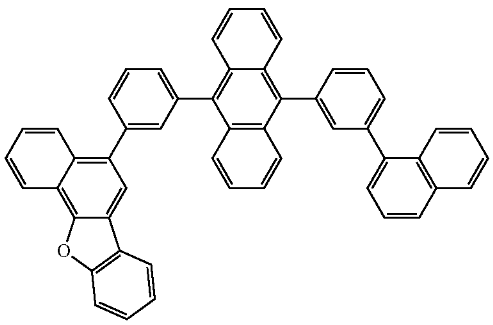
H100
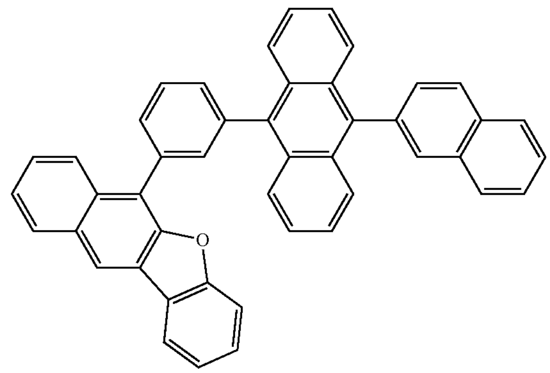
H101
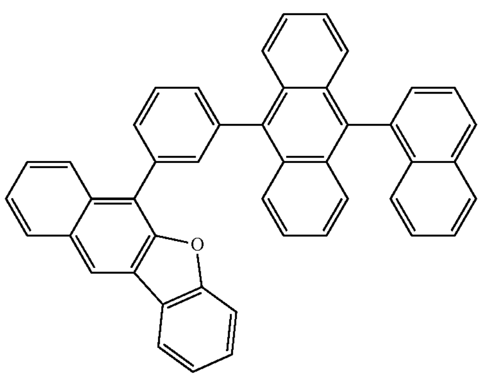
H102
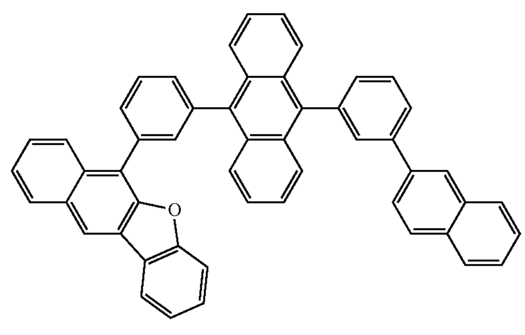
H103
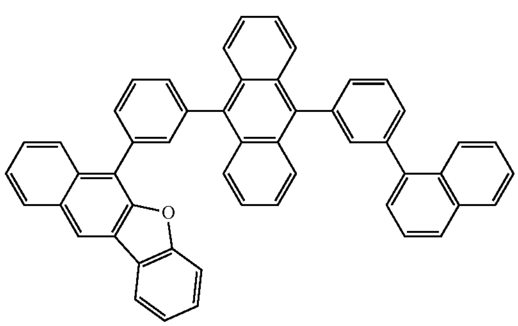
H104
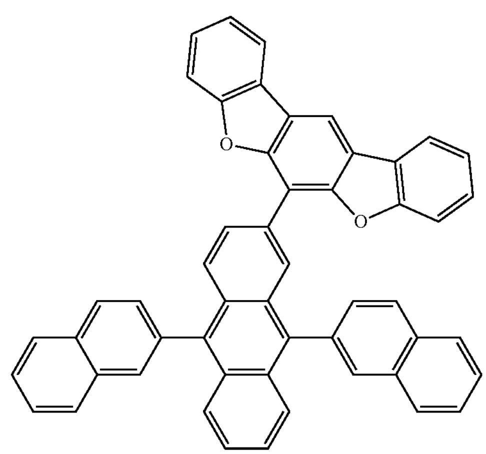

-continued
H105
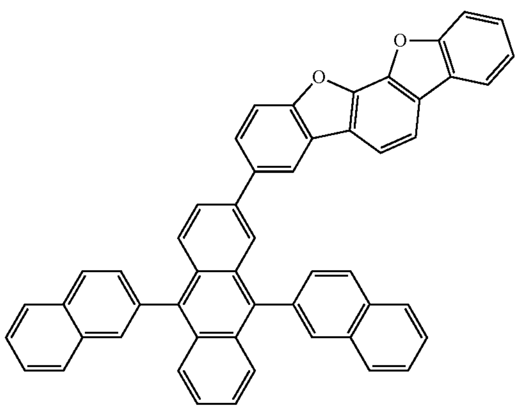
H106
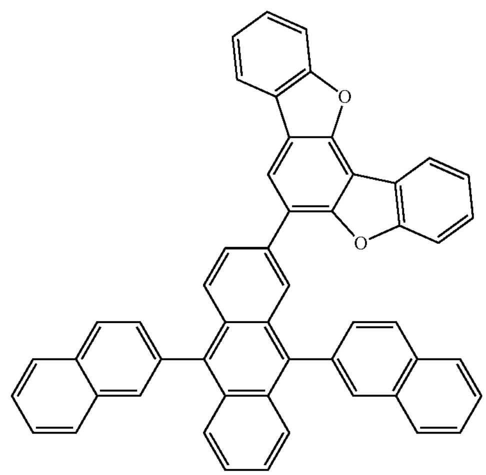
H107
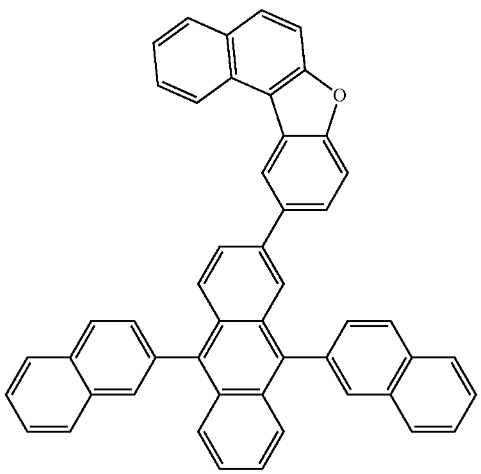
H108
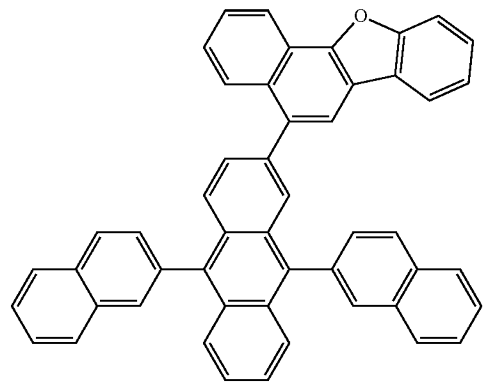
H109
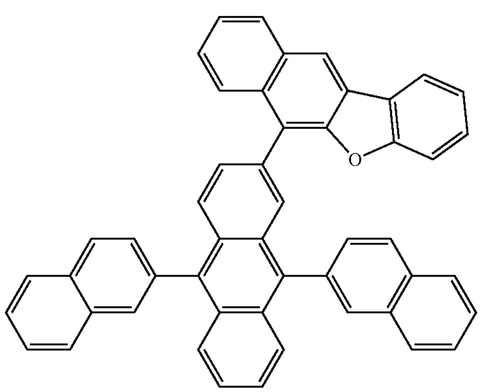
H110
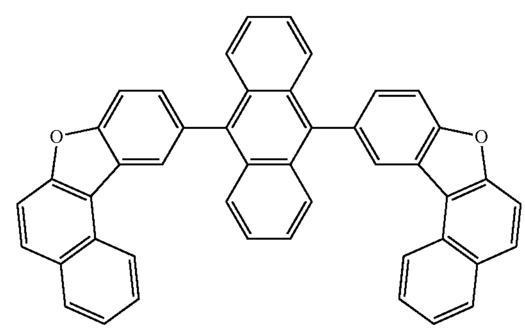
H111
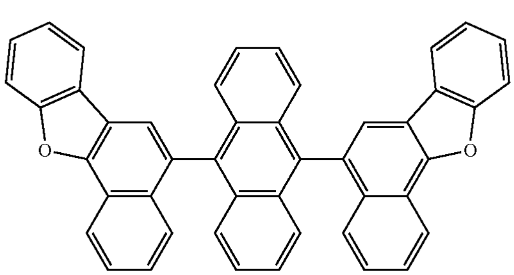
H112
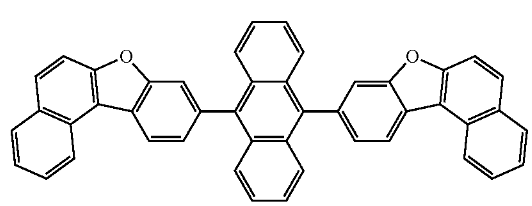

-continued
H113
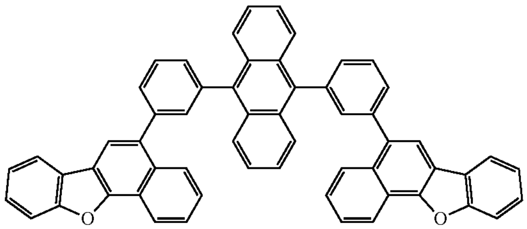
H114
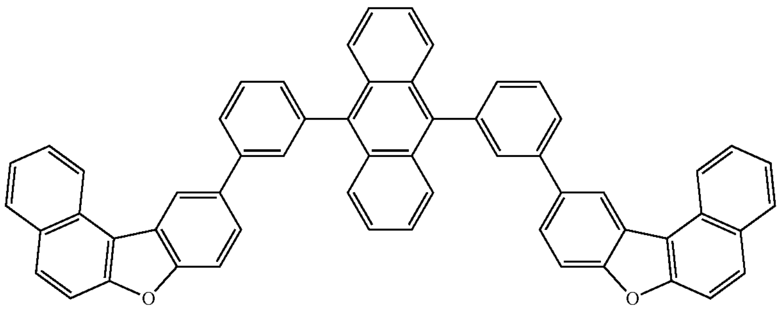
H115
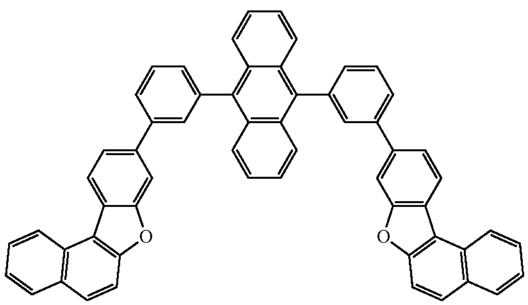
H116
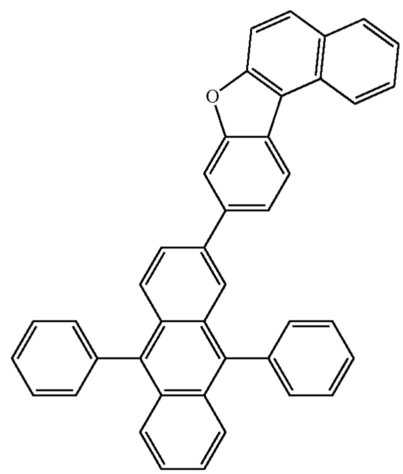
H117
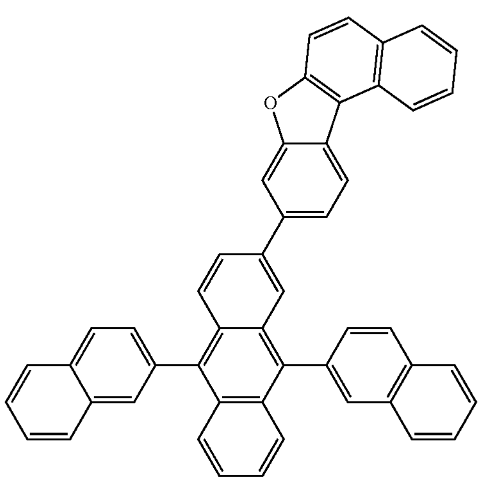
H118
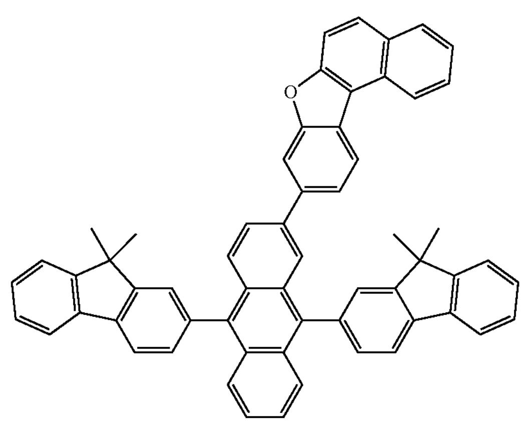

-continued
H119
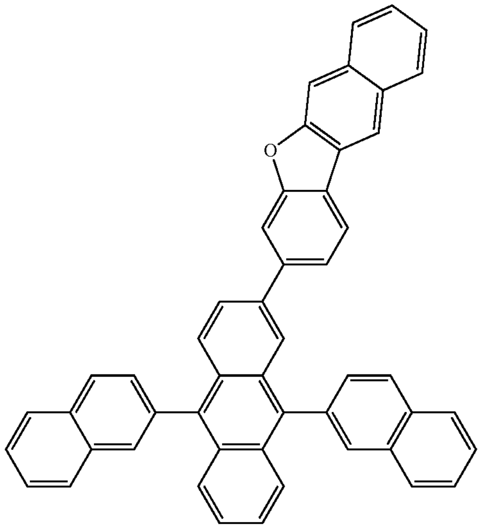
H120
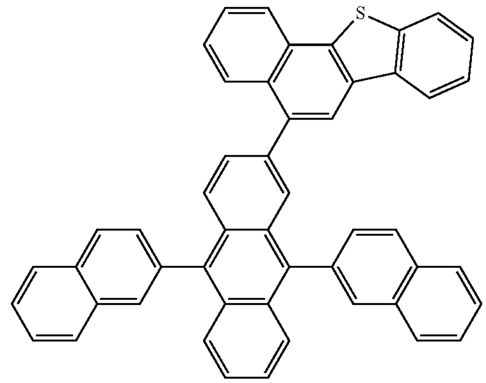
H121
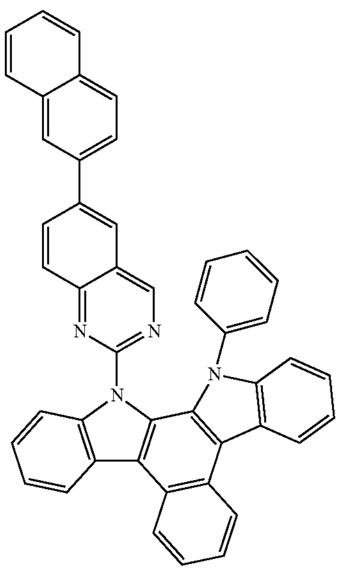
H122
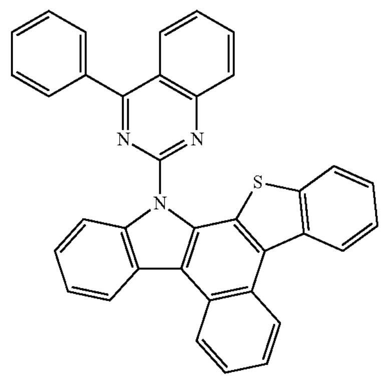
H123
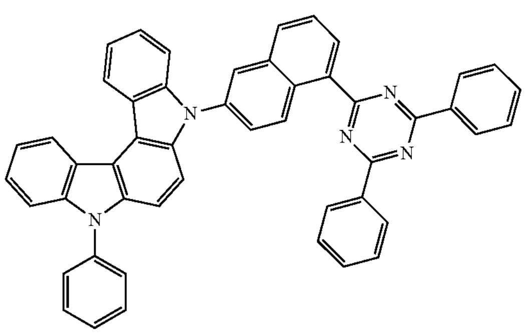
H124
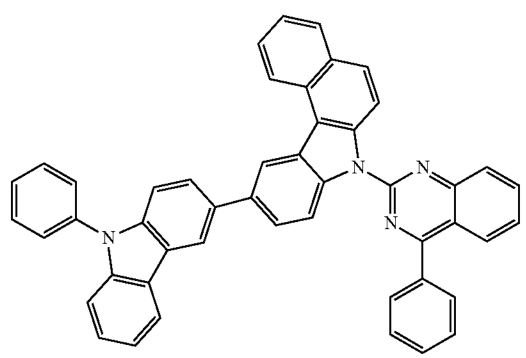

-continued
H201
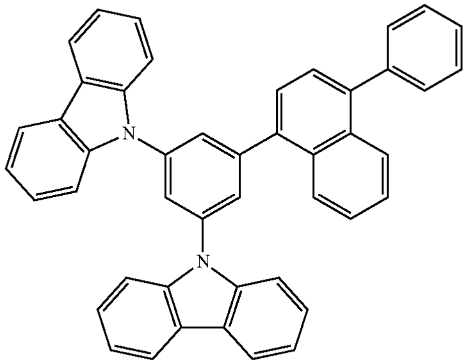
H202
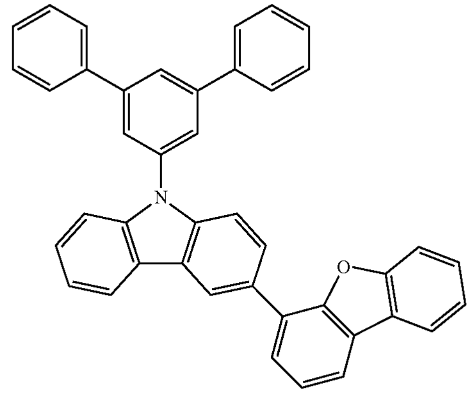
H203
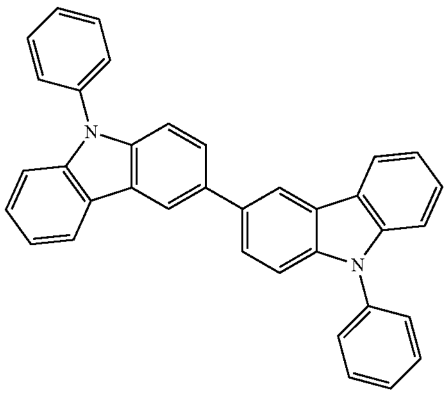
H204
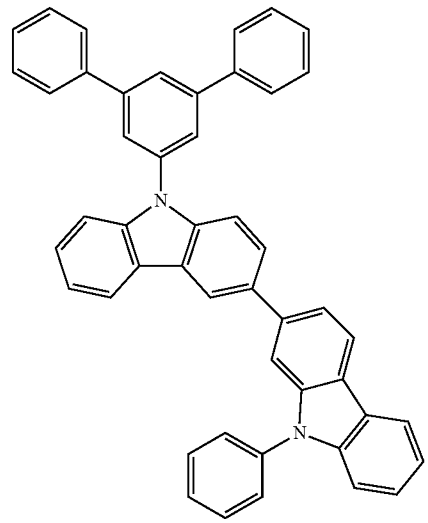
H205
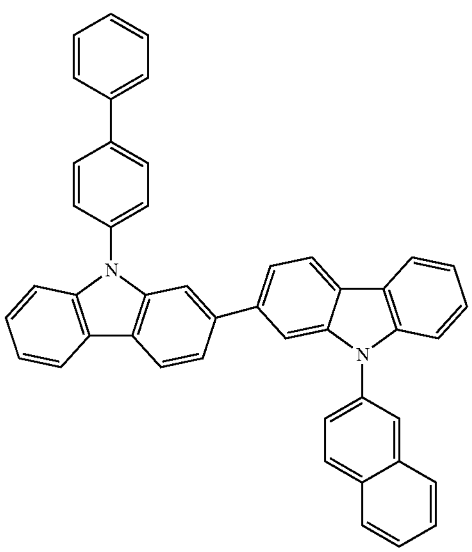
H206
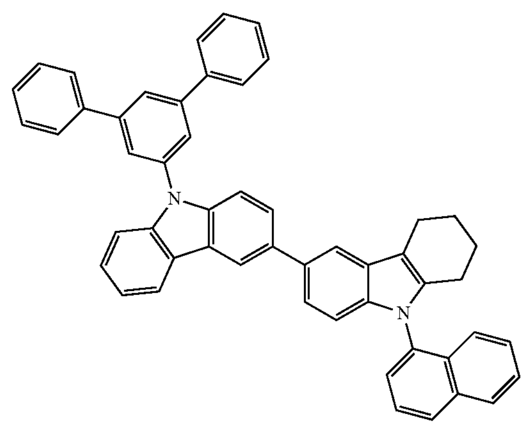

-continued
H207
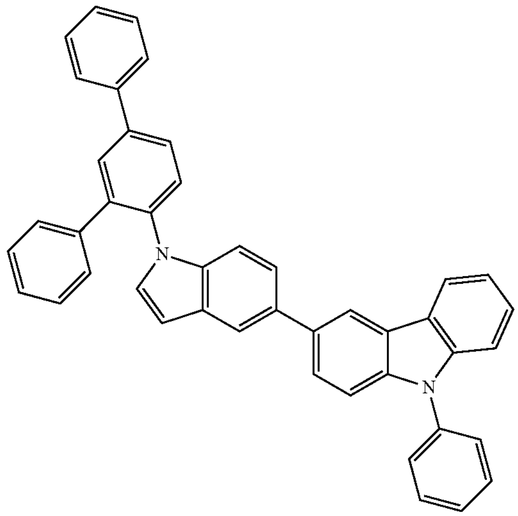
H208
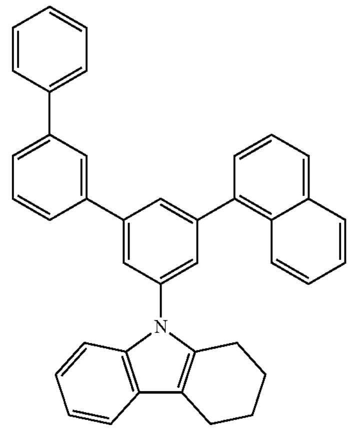
H209
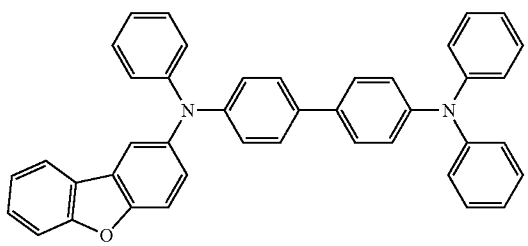
H210
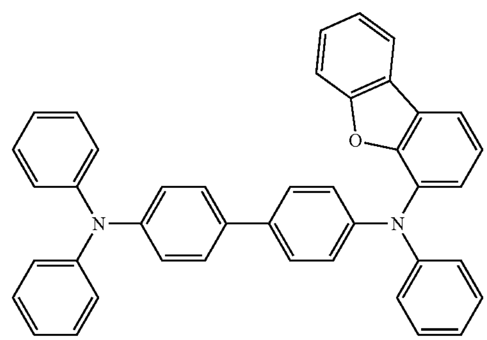
H211
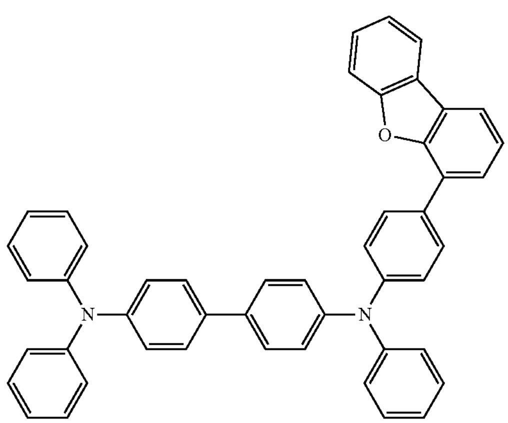
H212
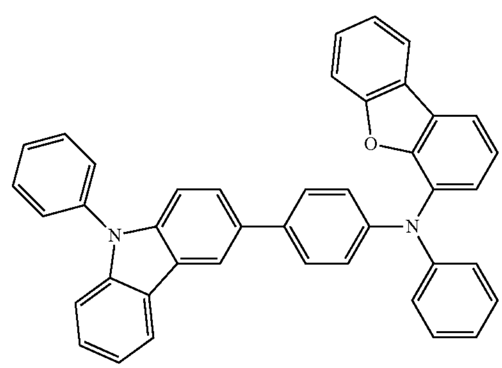

-continued
H213
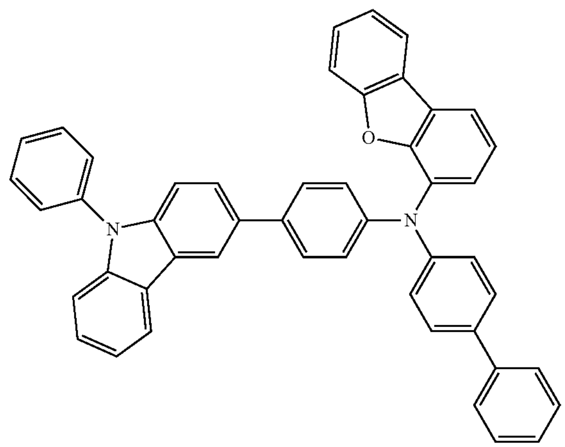
H214
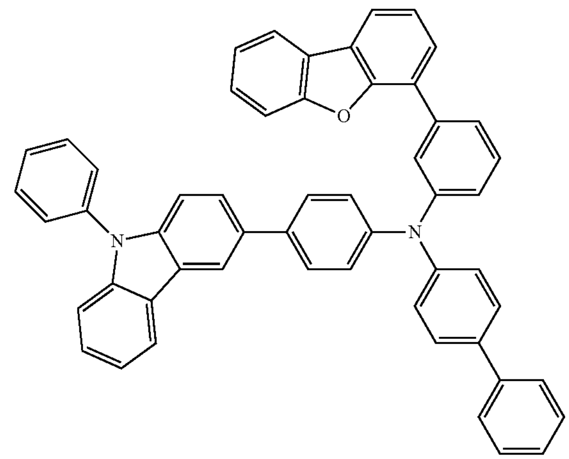
H215
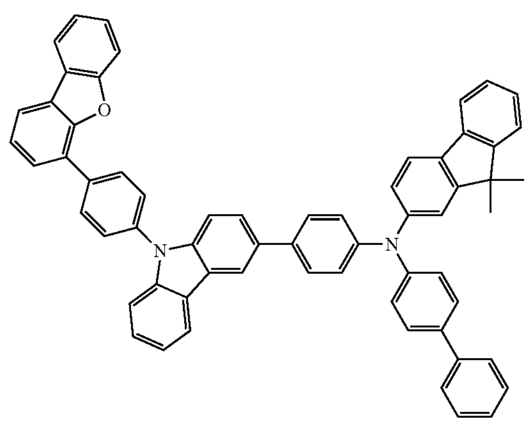
H216
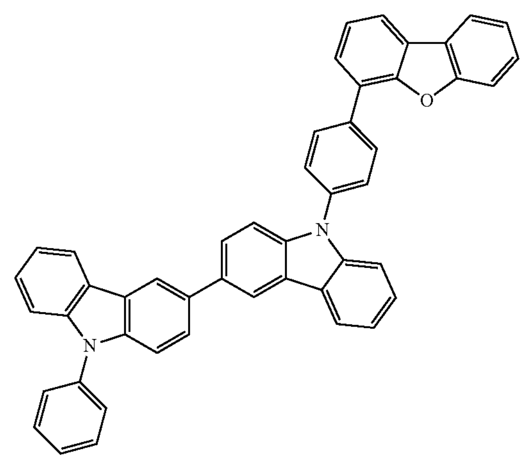
H301
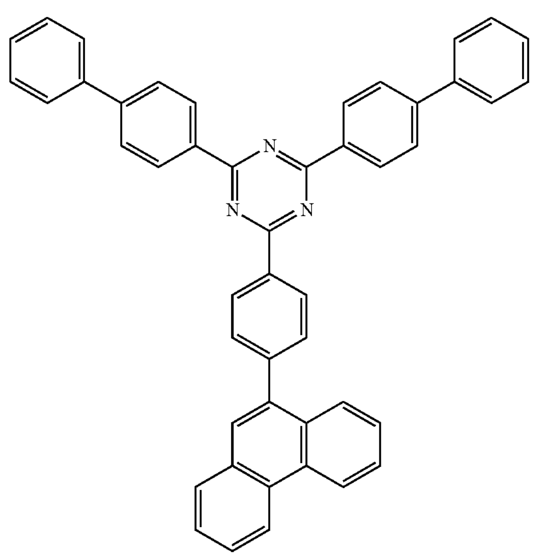
H302
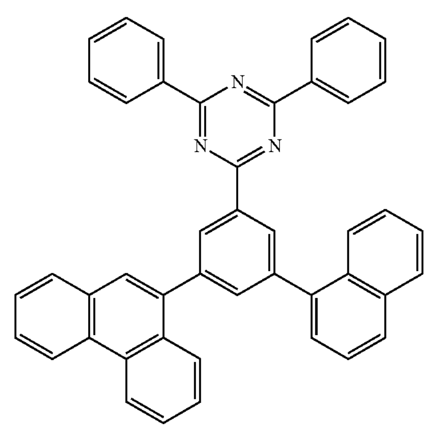

-continued
H303
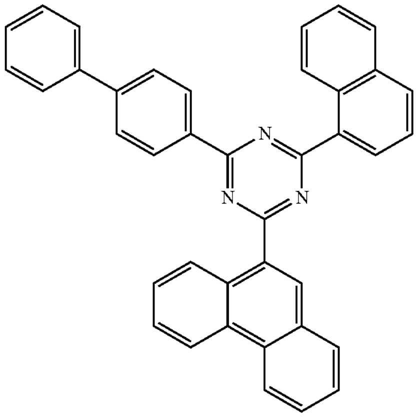
H304
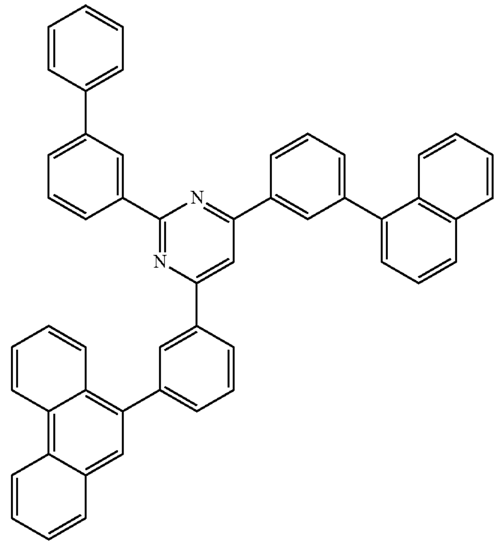
H305
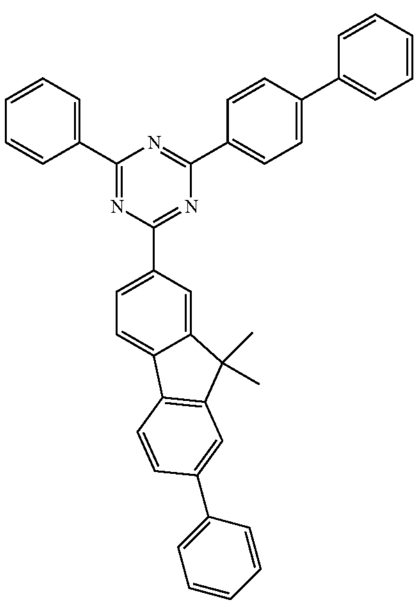
H306
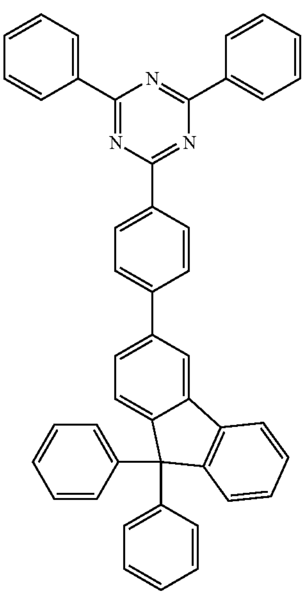

-continued
H307
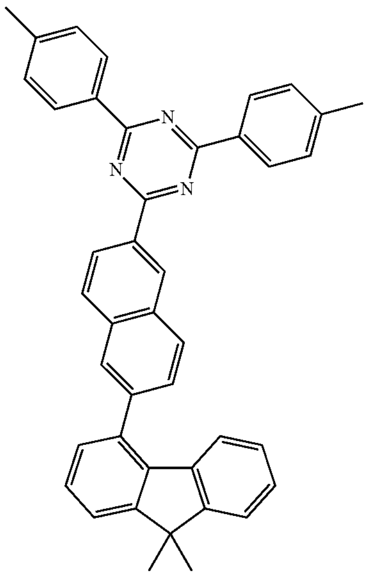
H308
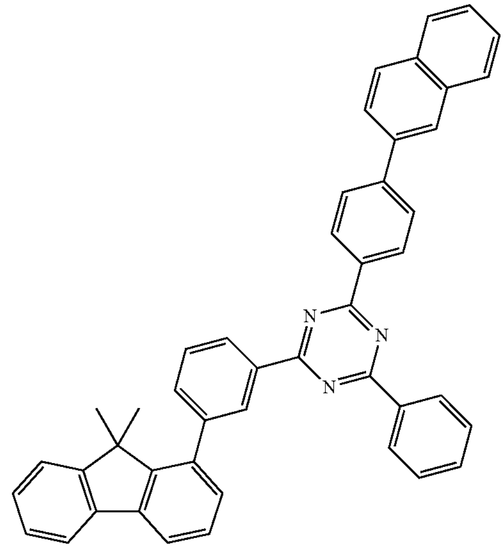
H309
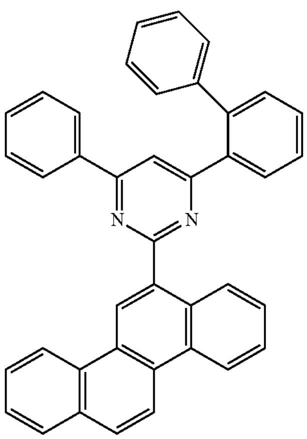
H310
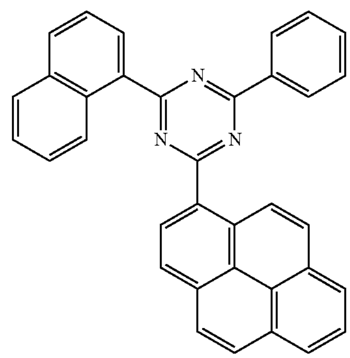
H311
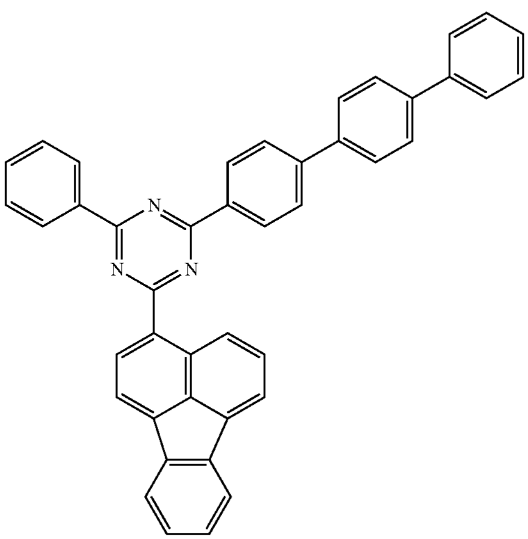
H312
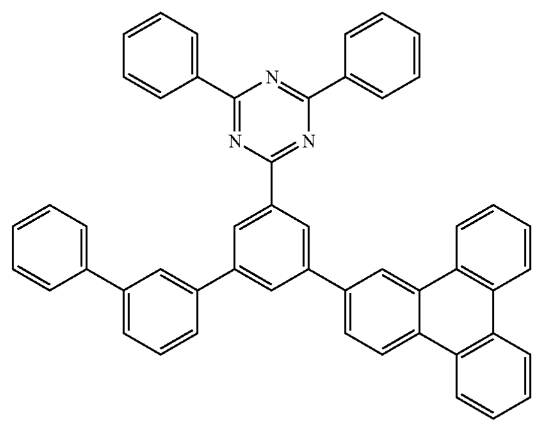

-continued
H313
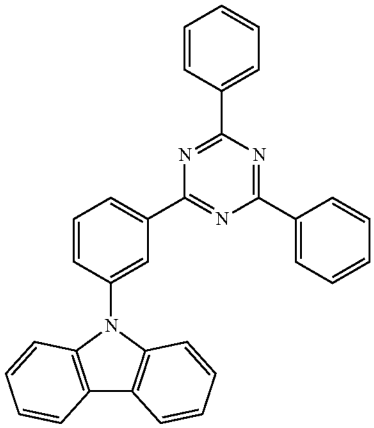
H314
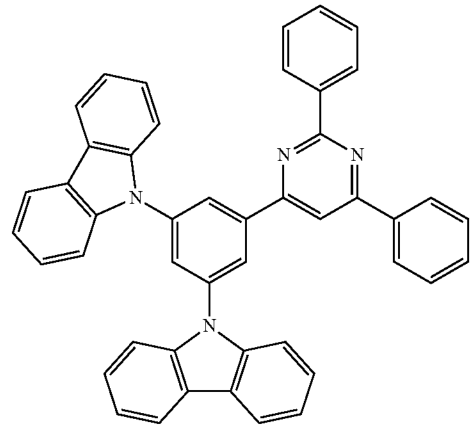
H315
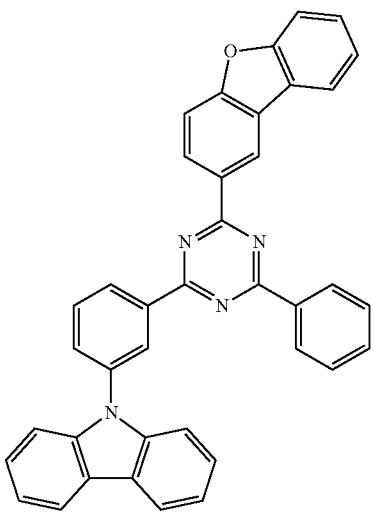
H316
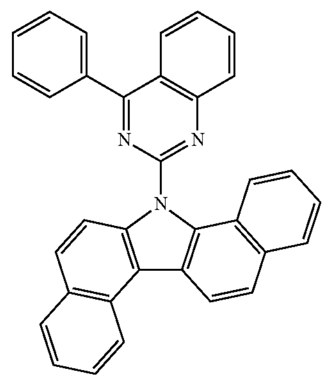
H317
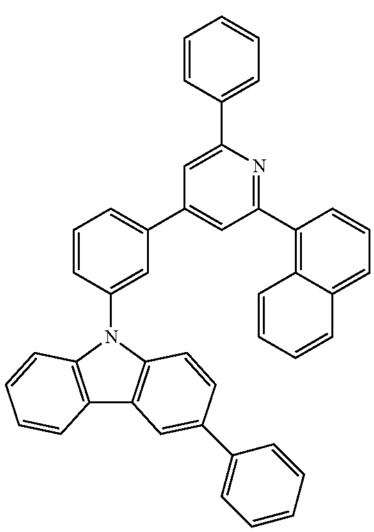
H318
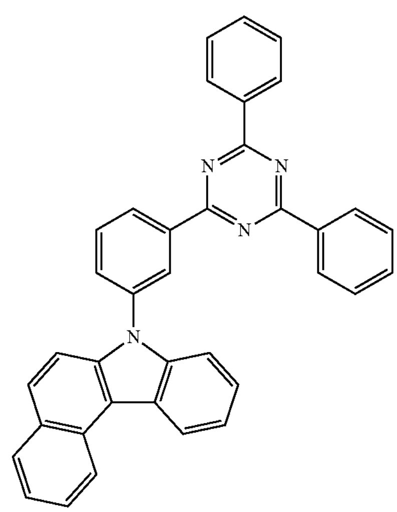

-continued
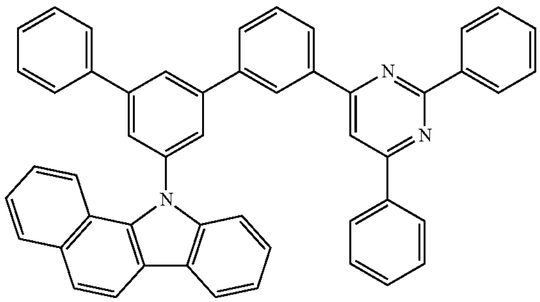
H319
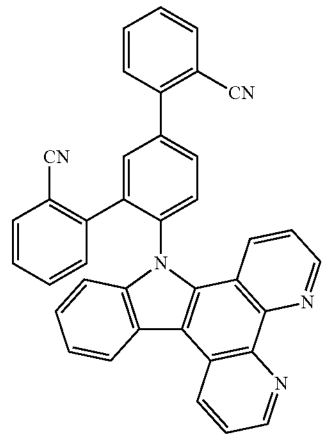
H320
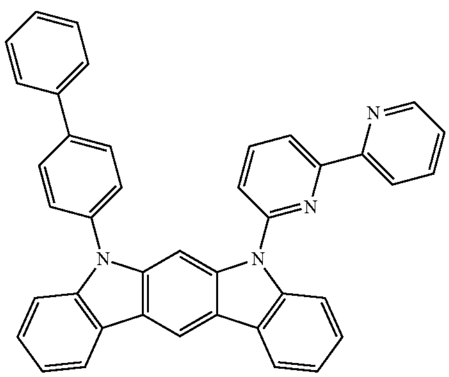
H321
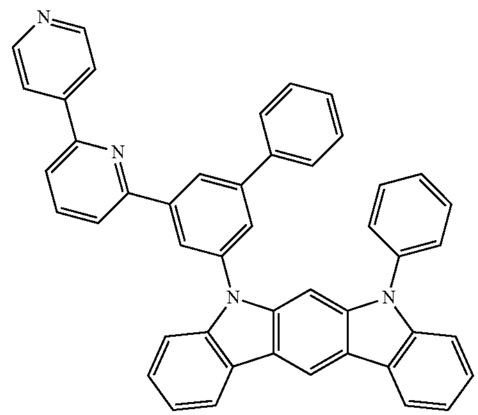
H322
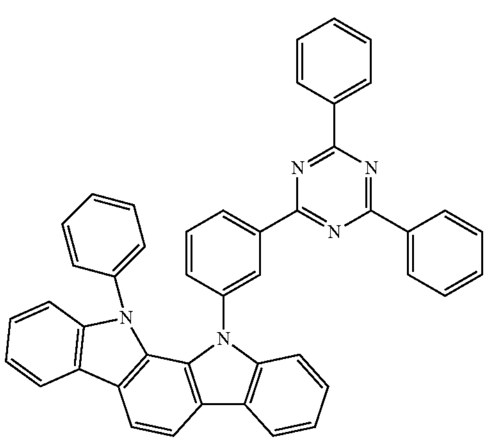
H323
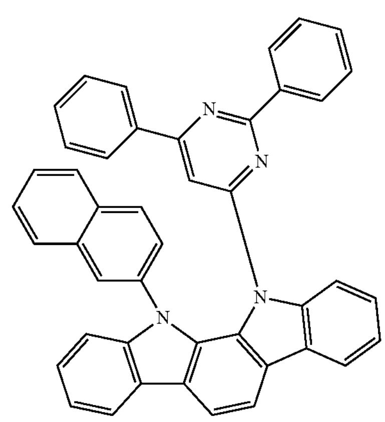
H324

-continued

H325

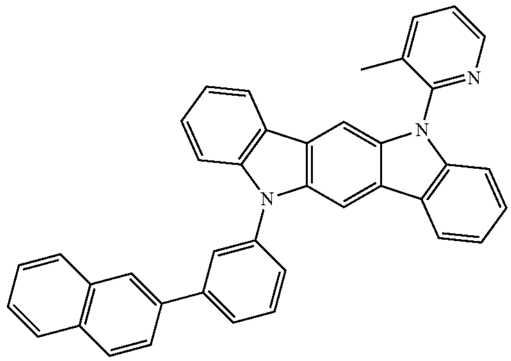

H326

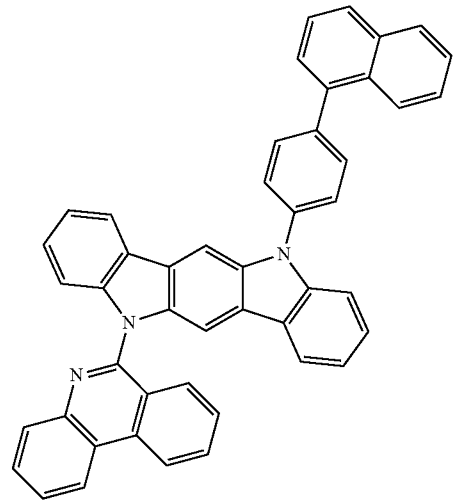

Phosphorescent Dopant

In an embodiment, the phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral.

In an embodiment, the phosphorescent dopant may include an organometallic compound represented by Formula 401:

Formula 401

$M(L_{401})_{xc1}(L_{402})_{xc2}$

Formula 402

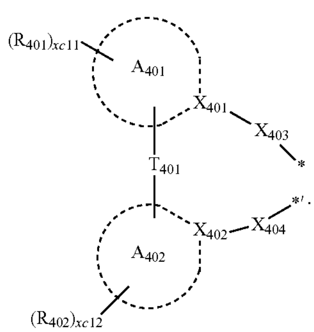

In Formulae 401 and 402,

M may be transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401(s)}$ may be identical to or different from each other, $L_{402}$ may be an organic ligand, and xc2 may be 0, 1, 2, 3, or 4, and when xc2 is 2 or more, two or more of $L_{402(s)}$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(═O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)-*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or *$Q_{413}$)($Q_{414}$), $Q_{411}$ to $Q_{414}$ may each be the same as described in connection with $Q_1$ herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ may each be the same in connection with $Q_1$ as described herein, xc11 and xc12 may each independently be an integer selected from 0 to 10, and

* and *' in Formula 402 may each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 402 is 2 or more, two ring $A_{401}$ in two or more of $L_{401(s)}$ may optionally be linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ may each be the same in connection with $T_{401}$ as described herein.

The variable $L_{402}$ in Formula 401 may be an organic ligand. In an embodiment, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or any combination thereof.
The phosphorescent dopant may include, for example, one of compounds PD1 to PD25, or any combination thereof:
PD1
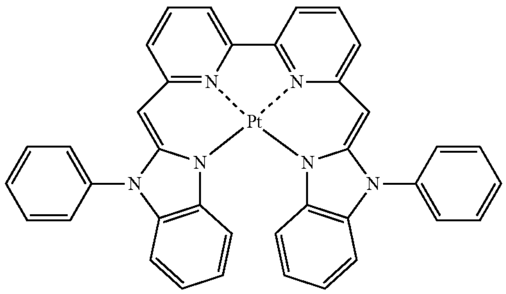
PD2
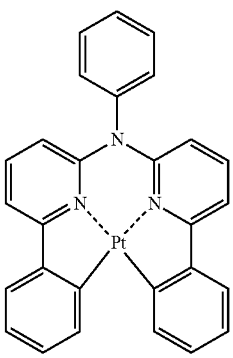
PD3
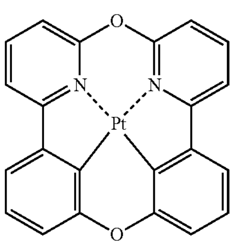
PD4
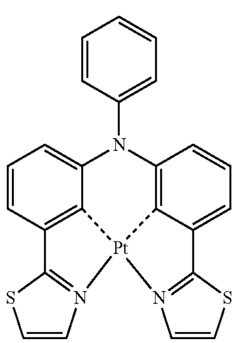
-continued
PD5
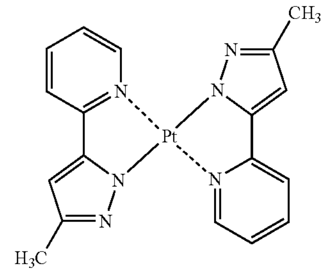
PD6
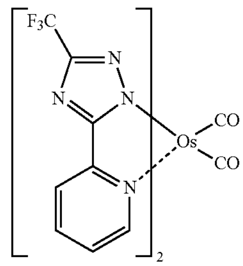
PD7
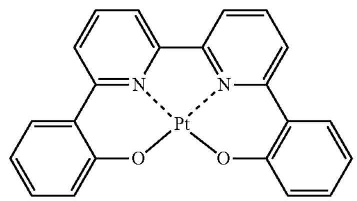
PD8
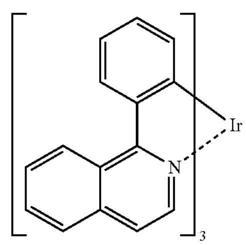
PD9
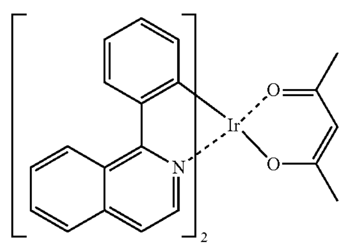
PD10
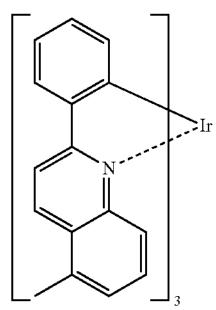

PD11
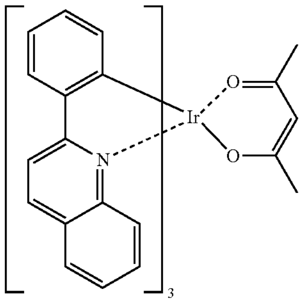
PD12
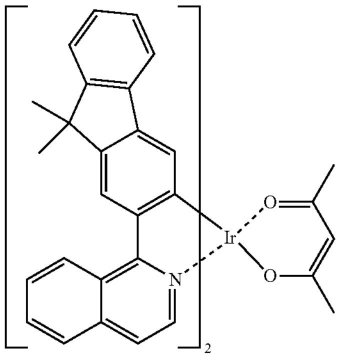
PD13
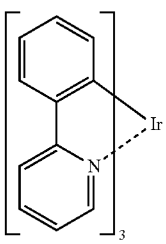
PD14
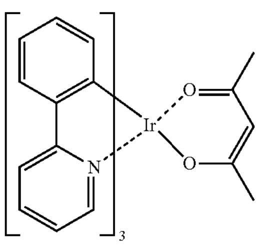
PD15
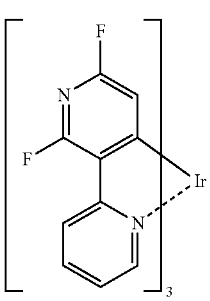
PD16
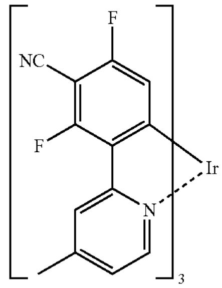
PD17
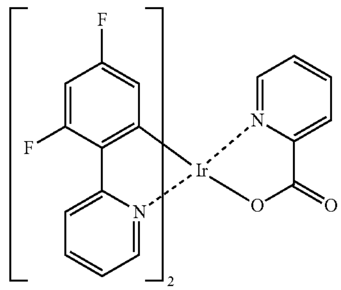
PD18
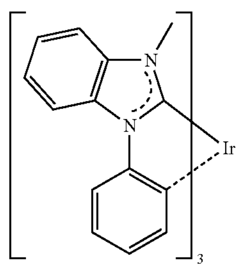
PD19
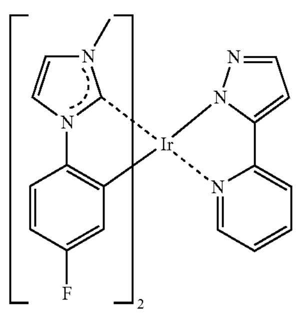
PD20
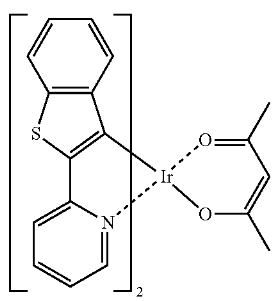

PD21

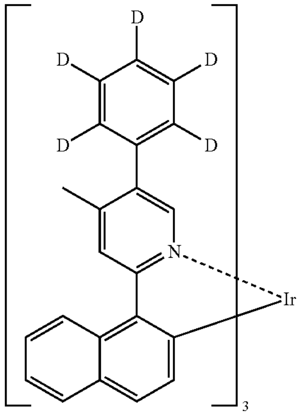

PD22

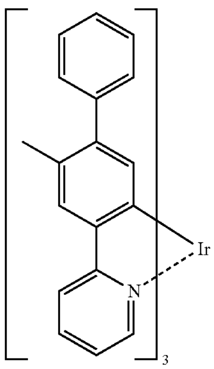

PD23

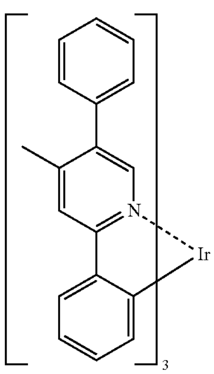

PD24

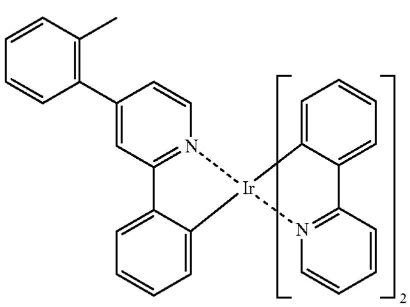

-continued

PD25

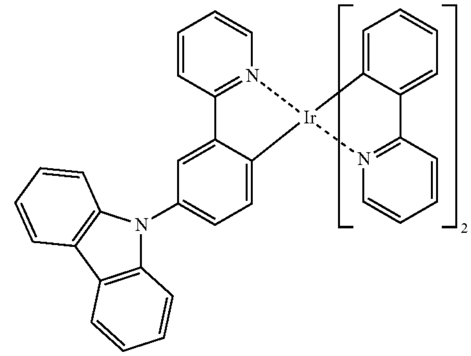

Fluorescent Dopant

The fluorescent dopant may include an amine group-containing compound, a styryl group-containing compound, or any combination thereof. In an embodiment, the fluorescent dopant may include a compound represented by Formula 501:

Formula 501

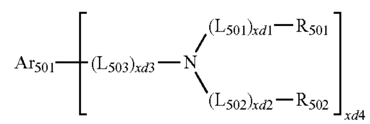

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In an embodiment, the fluorescent dopant may include: one of Compounds FD1 to FD36; DPVBi; DPAVBi; or any combination thereof:

FD1

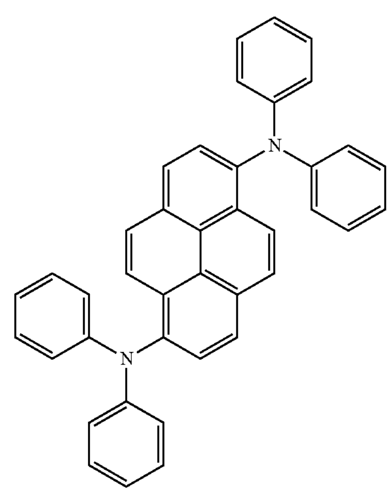

-continued
FD2
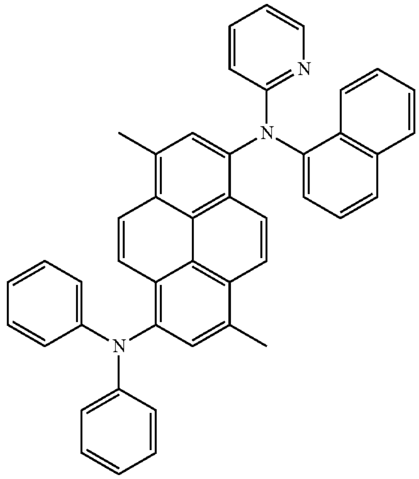
FD3
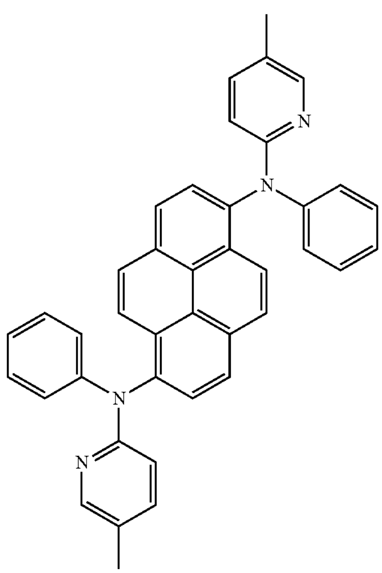
-continued
FD4
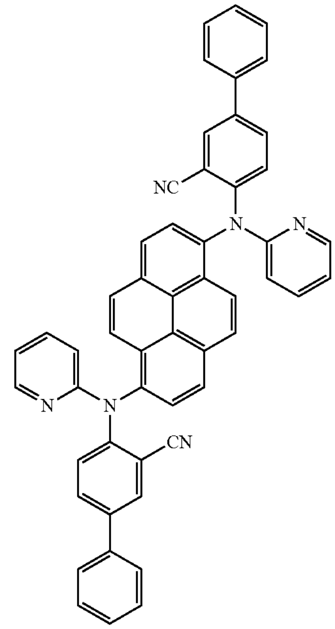
FD5
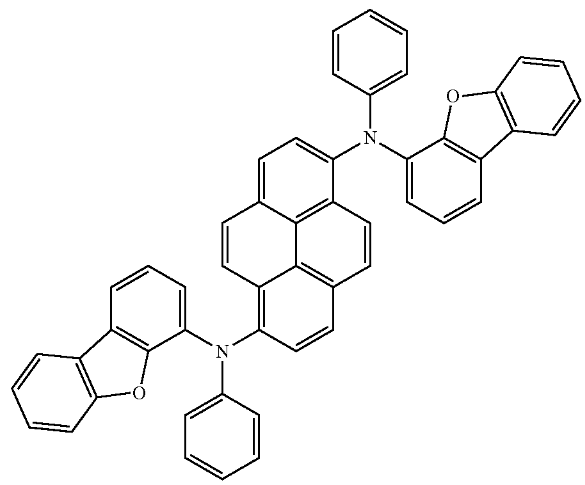
FD6
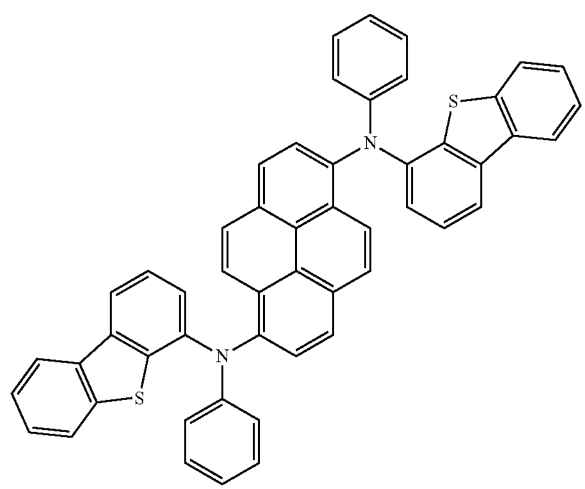

-continued
FD7
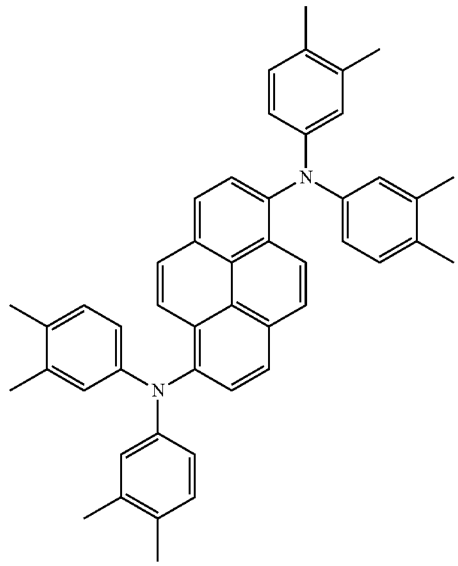
FD8
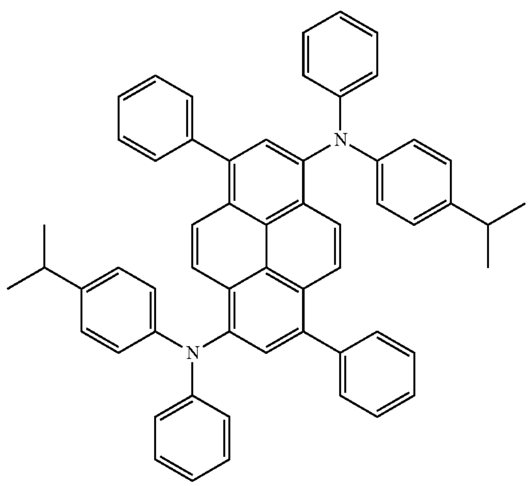
FD9
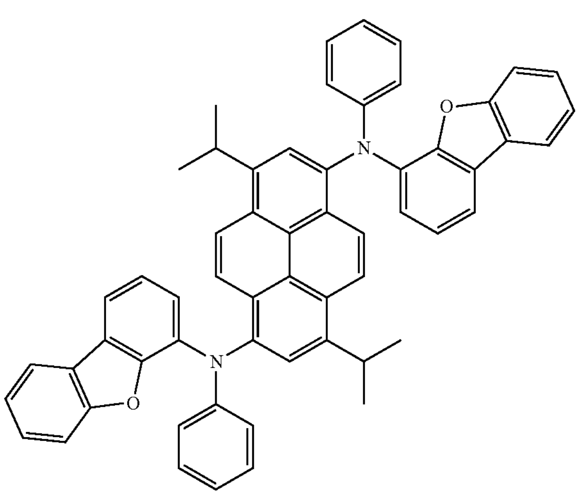
-continued
FD10
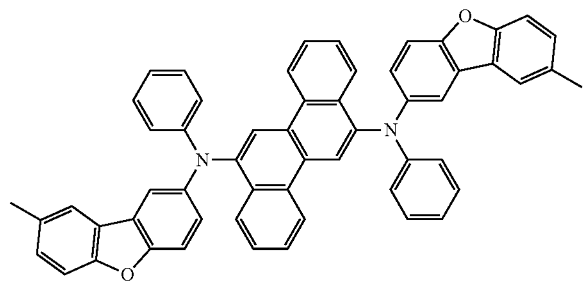
FD11
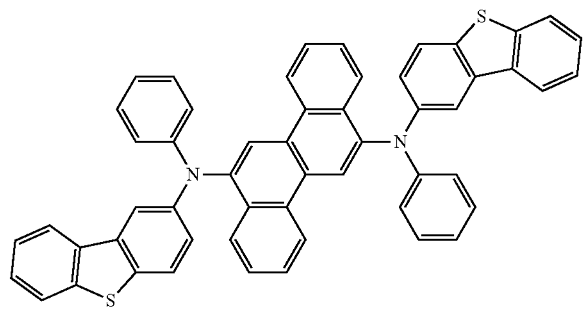
FD12
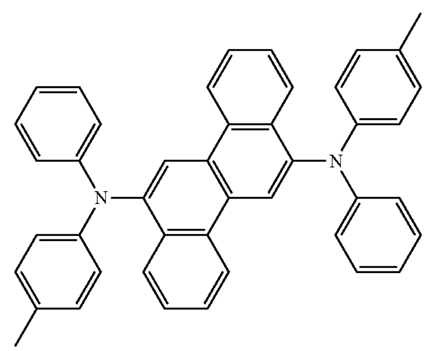
FD13
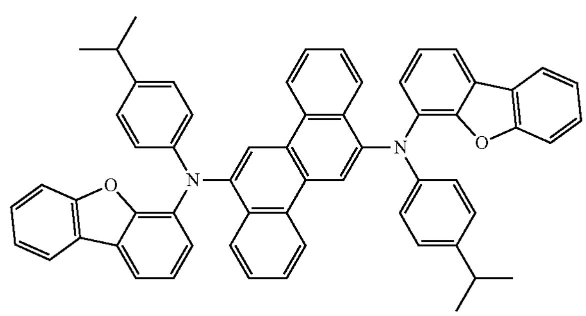
FD14
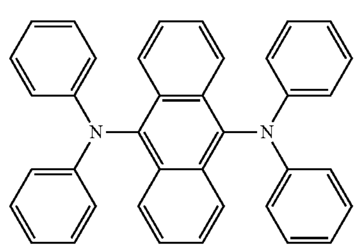

FD15
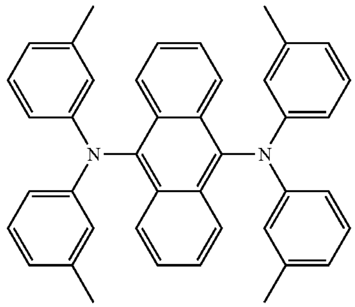
FD16
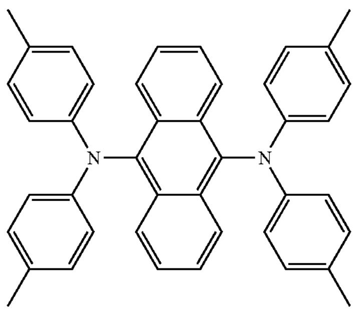
FD17
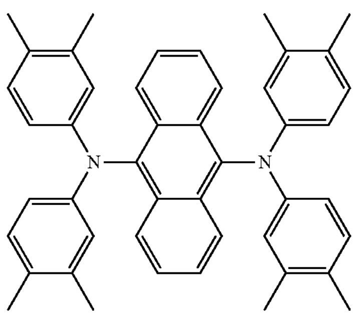
FD18
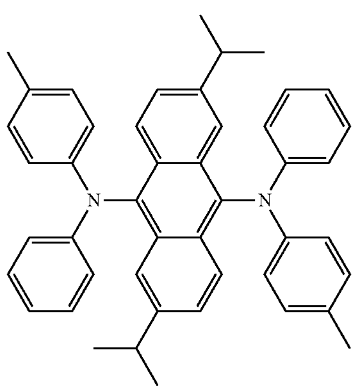
FD19
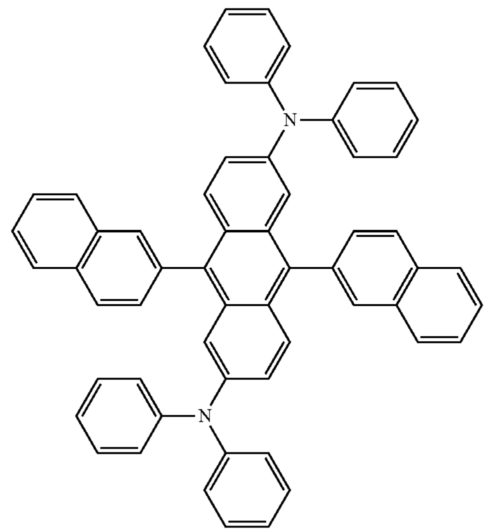
FD20
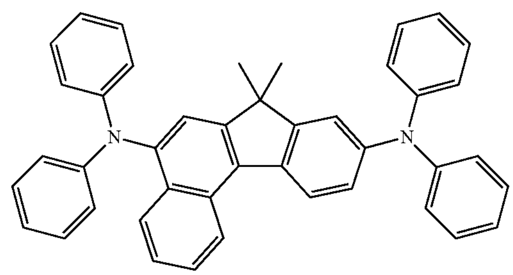
FD21
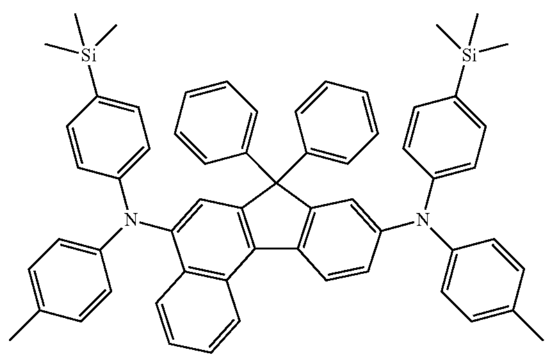
FD22
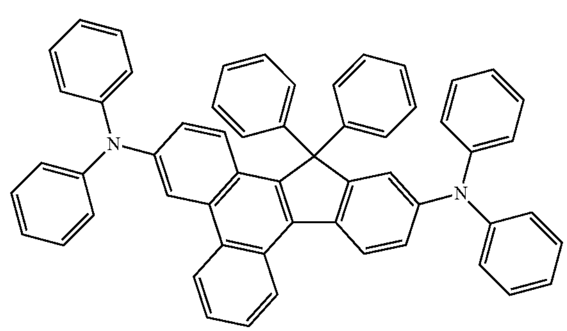

-continued
FD23
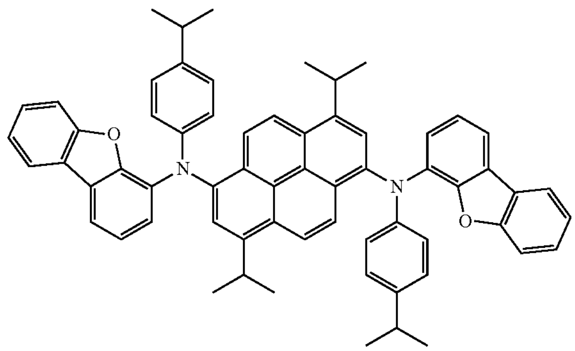
FD24
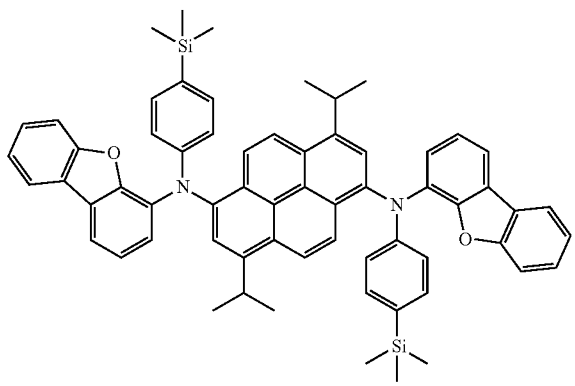
FD25
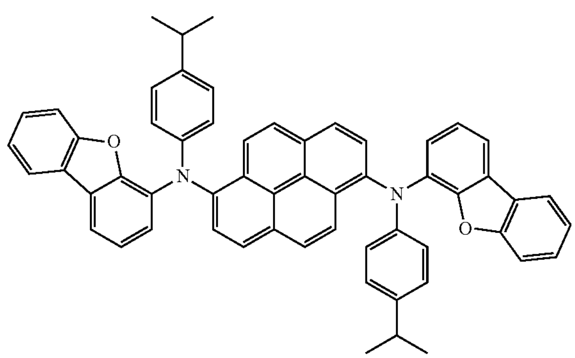
FD26
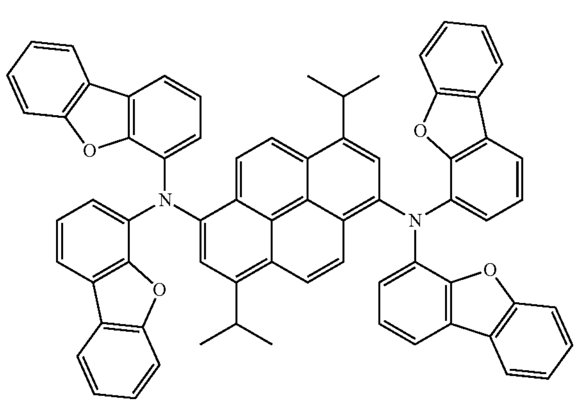
-continued
FD27
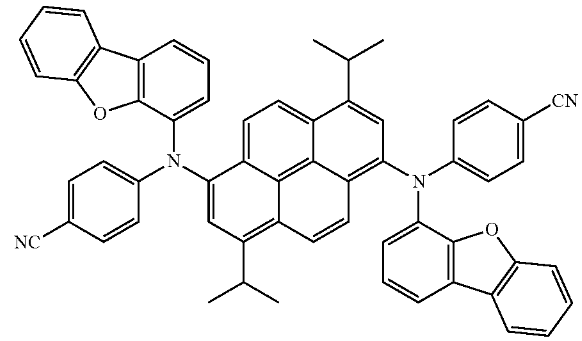
FD28
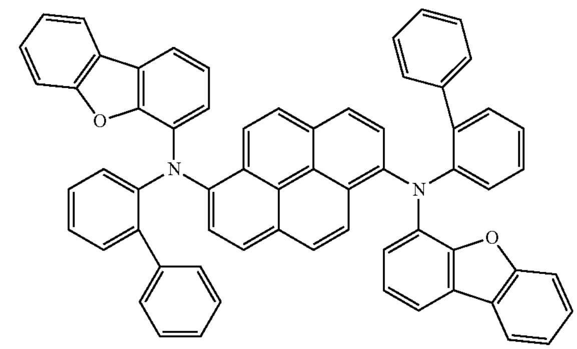
FD29
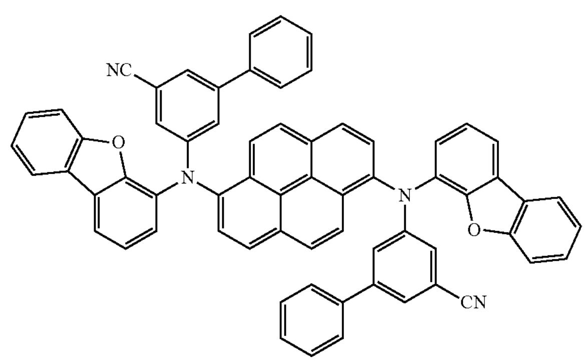
FD30
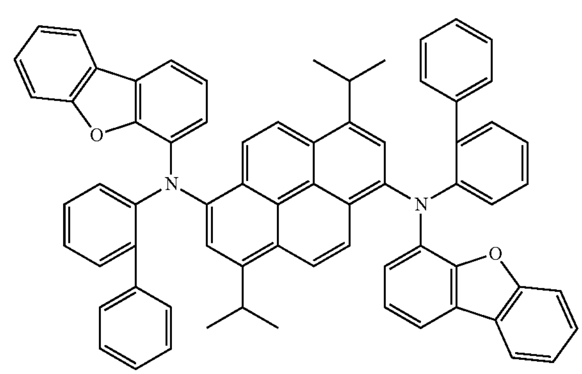

-continued

FD31

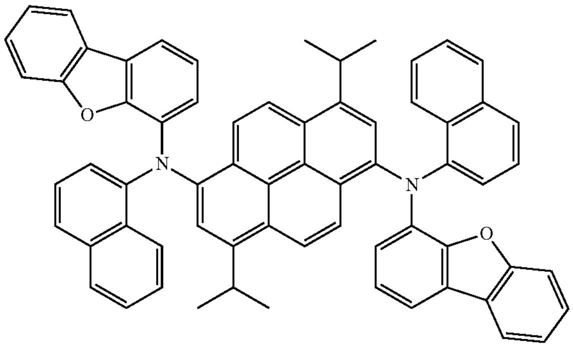

FD32

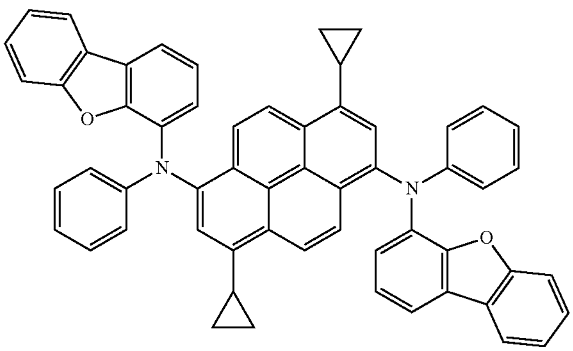

FD33

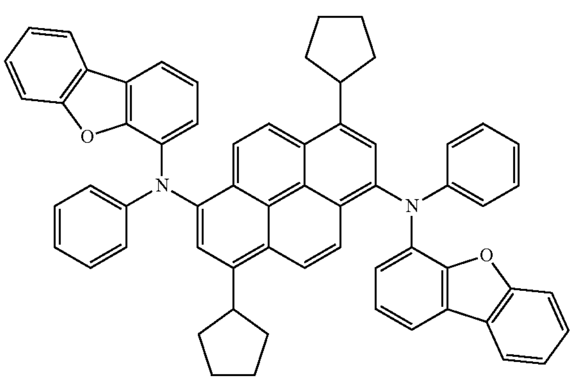

FD34

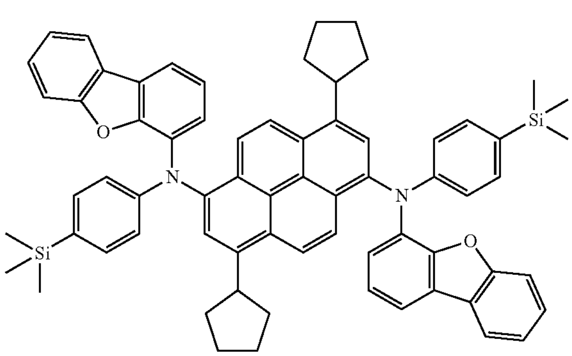

-continued

FD35

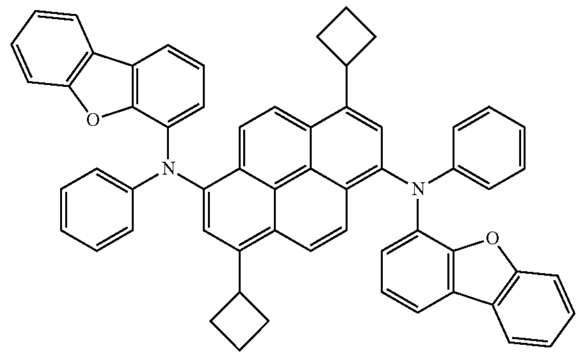

FD36

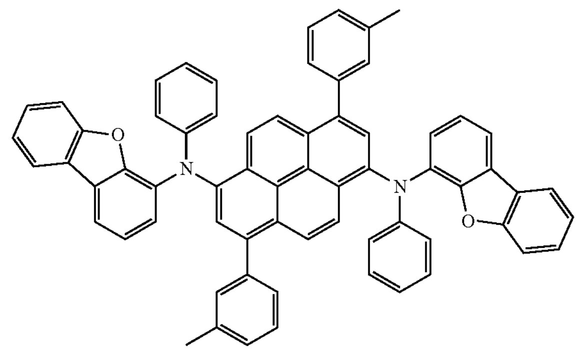

DPVBi

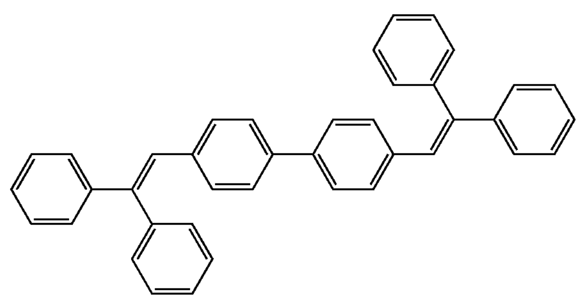

DPAVBi

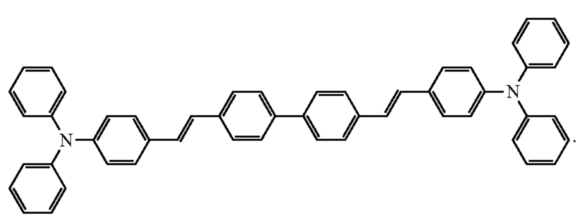

Delayed Fluorescence Material

The emission layer may include a delayed fluorescence material. As described herein, the delayed fluorescence material may be selected from compounds capable of emitting delayed fluorescence based on a delayed fluorescence emission mechanism. The delayed fluorescence material included in the emission layer may act as a host or a dopant depending on the type of other materials included in the emission layer.

In an embodiment, the difference between the triplet energy level (eV) of the delayed fluorescence material and the singlet energy level (eV) of the delayed fluorescence material may be greater than or equal to 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the emission efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

In an embodiment, the delayed fluorescence material may include at least one of the following compounds DF1 to DF9:

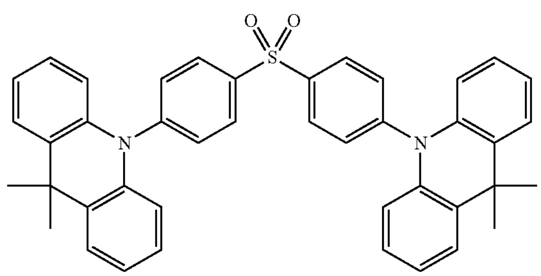

DF1(DMAC-DPS)

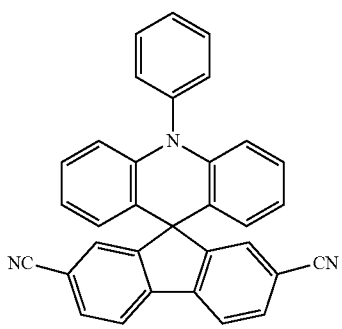

DF2(ACRFLCN)

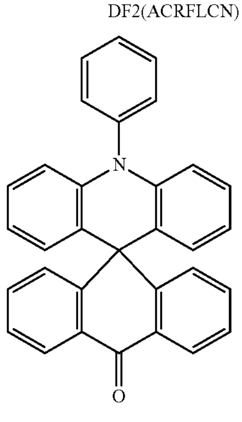

DF3(ACRSA)

-continued

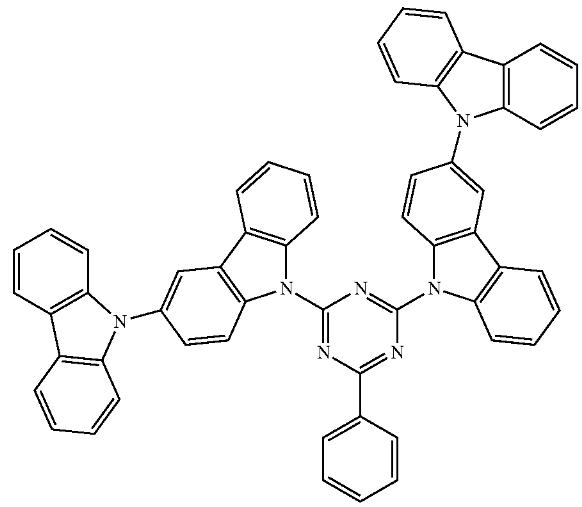

DF4(CC2TA)

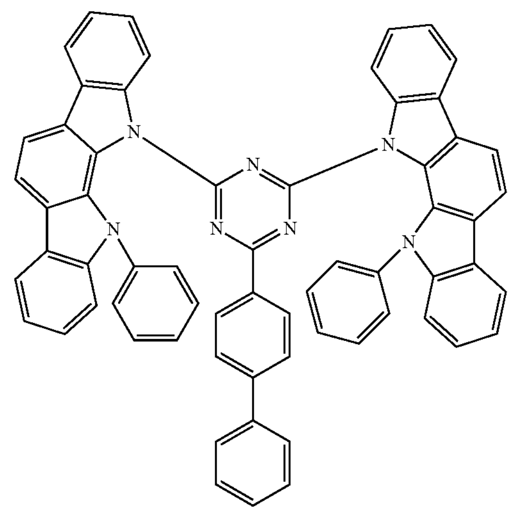

DF5(PIC-TRZ)

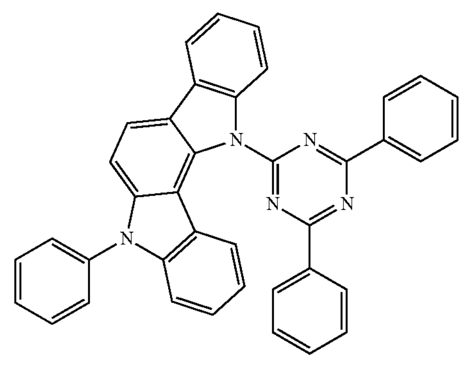

DF6(PIC-TRZ2)

-continued

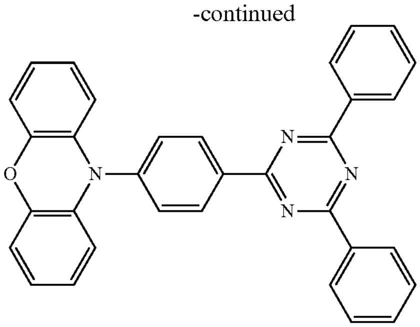

DF7(PXZ-TRZ)

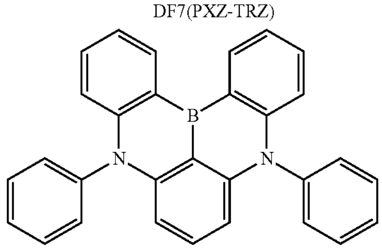

DF8(DABNA-1)

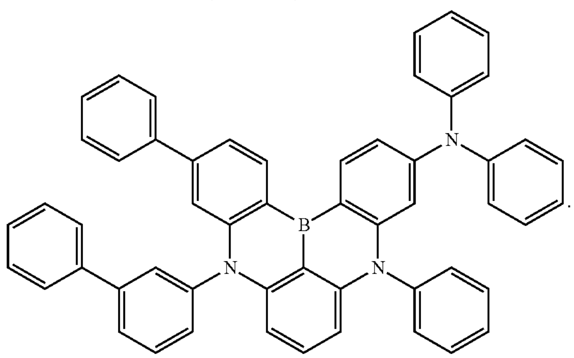

DF9(DABNA-2)

Quantum Dot

The emission layer may include a quantum dot. As described herein, the quantum dot refers to a crystal of a semiconductor compound, and may include any material capable of emitting light of various emission wavelengths according to the size of the crystal. The diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include Groups II-VI semiconductor compounds, Groups III-V semiconductor compounds, Groups III-VI semiconductor compounds, Groups semiconductor compounds, Groups IV-VI semiconductor compounds, a Group IV element or compound, or any combination thereof.

Examples of the Groups II-VI semiconductor compound are: a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound are: a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like; a quaternary compound, such as GaAlNAs, GaAlNSb, GaAlPAs, GaAlPSb, GaAlNP, GaInNP, GaInNAs, GaInNSb, GaInPAs, GaInPSb, InAlNP, InAlNAs, InAlNSb, InAlPAs, InAlPSb, or the like; or any combination thereof. In one or more embodiments, the Groups III-V semiconductor compound may further include Group II elements. Examples of the Groups III-V further including Group II elements are InZnP, InGaZnP, InAlZnP, etc.

Examples of the Groups III-VI semiconductor compound are a binary compound, such as GaS, GaSe, $Ga_2Se_3$, GaTe, InS, ZnSe, $In_2S_3$, $In_2Se_3$, or InTe; a ternary compound, such as $InGaS_3$, or $InGaSe_3$; and any combination thereof. Examples of the Group semiconductor compound are a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound are a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

The Group IV element or compound may include a single element compound, such as Si or Ge; a binary compound, such as SiC or SiGe; or any combination thereof. Each element included in a multi-element compound such as the binary compound, ternary compound and quaternary compound, may exist in a particle with a uniform concentration or non-uniform concentration. The quantum dot may have a single structure or a dual core-shell structure. In the case of the quantum dot having a single structure, the concentration of each element included in the corresponding quantum dot is uniform. In an embodiment, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient that decreases toward the center of the element present in the shell.

Examples of the shell of the quantum dot are an oxide of metal, metalloid, or non-metal, a semiconductor compound, and any combination thereof. Examples of the oxide of metal, metalloid, or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound are, as described herein, Groups II-VI semiconductor compounds; Groups III-V semiconductor compounds; Groups III-VI semiconductor compounds; Groups I-III-VI semiconductor compounds; Groups IV-VI semiconductor compounds; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The full width at half maximum (FWHM) of the emission wavelength spectrum of the quantum dot may be about 45 nm or less, for example, about 40 nm or less, for example, about 30 nm or less, and within these ranges, color purity or color gamut may be increased. In addition, since the light emitted through the quantum dot is emitted in all directions, the wide viewing angle may be improved.

In addition, the quantum dot may be a generally spherical particle, a generally pyramidal particle, a generally multi-armed particle, a generally cubic nanoparticle, a generally nanotube-shaped particle, a generally nanowire-shaped particle, a generally nanofiber-shaped particle, or a generally nanoplate-shaped particle.

Because the energy band gap can be adjusted by controlling the size of the quantum dot, light having various wavelength bands can be obtained from the quantum dot emission layer. Therefore, by using quantum dots of different sizes, a light-emitting display that emits light of various wavelengths may be implemented. In one embodiment, the size of the quantum dot may be selected from to emit red, green and/or blue light. In addition, the size of the quantum dot may be configured to emit white light by combining light of various colors.

Electron Transport Region 133 in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials. The electron transport region may include a buffer layer, a hole blocking layer, an electron control layer, an electron transport layer, an electron injection layer, or any combination thereof. In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region may include at least one second material represented by Formula 1 or Formula 2 as described above. The electron transport region may further include a first electron transport layer, and the first electron transport layer may include an organic electron transport material and a metal element-containing material which are different from each other.

In an embodiment, the electron transport region may include a first electron transport layer including the second material represented by Formula 1 or 2 and the metal element-containing material.

The metal element-containing material may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, wherein the alkali metal may include Li, Na, K, Rb, Cs, or any combination thereof, the alkaline earth metal may include Mg, Ca, Sr, Ba, or any combination thereof, the rare earth metal may include Sc, Y, Ce, Tb, Yb, Gd, or any combination thereof, and the alkali metal-containing compound, the alkaline earth metal-containing compound, and the rare earth metal-containing compound may be oxides, halides, or tellurides of the alkali metal, the alkaline earth metal, and the rare earth metal, or any combination thereof.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group. In an embodiment, the electron transport region may include a compound represented by Formula 601 below:

$$[Ar_{601}]_{xe11}\text{-}[(L_{601})_{xe1}\text{-}R_{601}]_{xe21} \quad \text{Formula 601}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may be the same as described in connection with $Q_1$ herein, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601(s)}$ may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

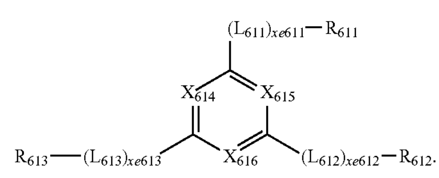

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may be the same as described in connection with $L_{601}$, xe611 to xe613 may be the same as described in connection with xe1, $R_{611}$ to $R_{613}$ may be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum ($Alq_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof:

ET1

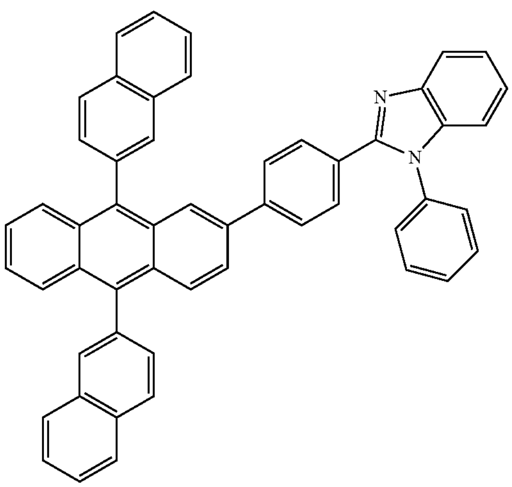

ET2

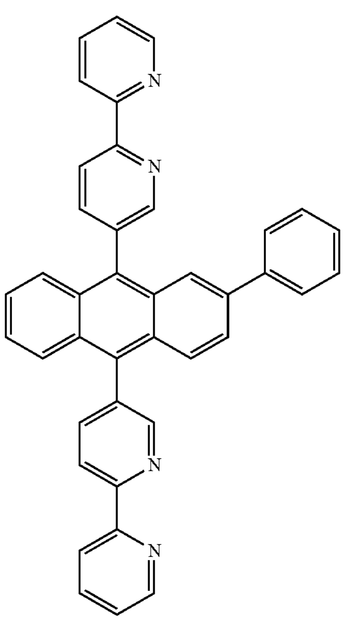

-continued

ET3

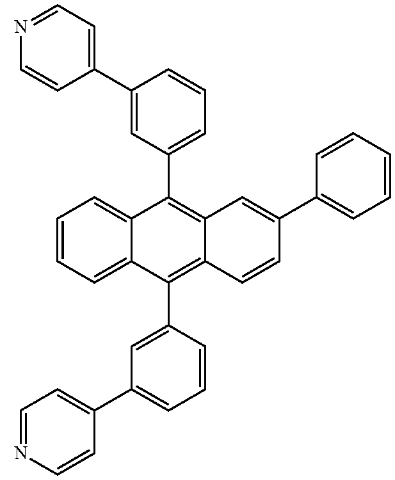

ET4

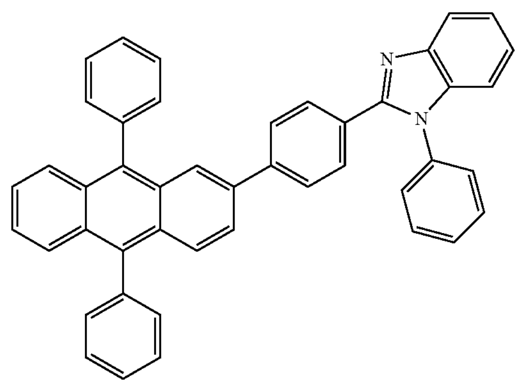

ET5

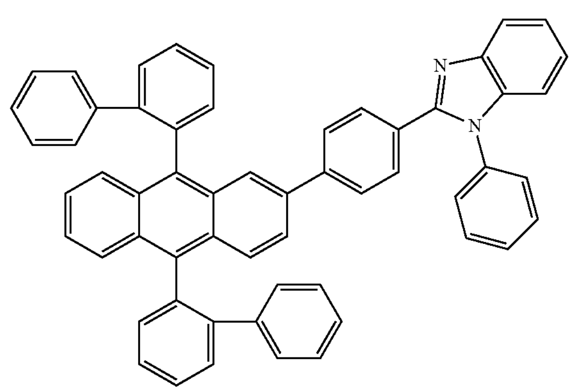

-continued
ET6
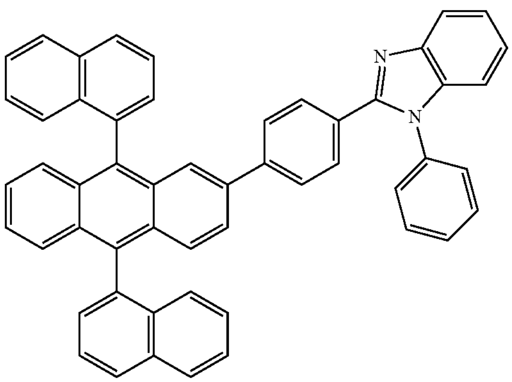
ET7
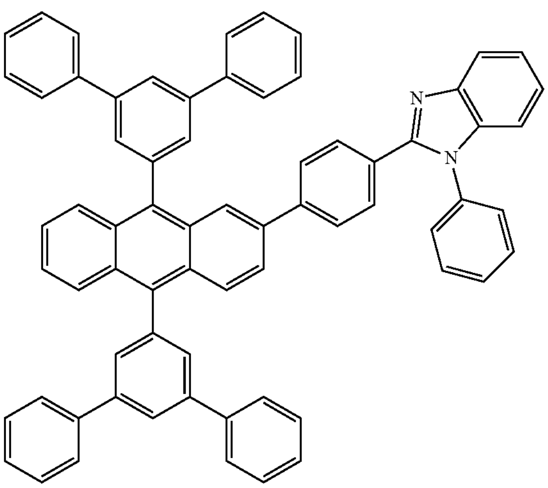
ET8
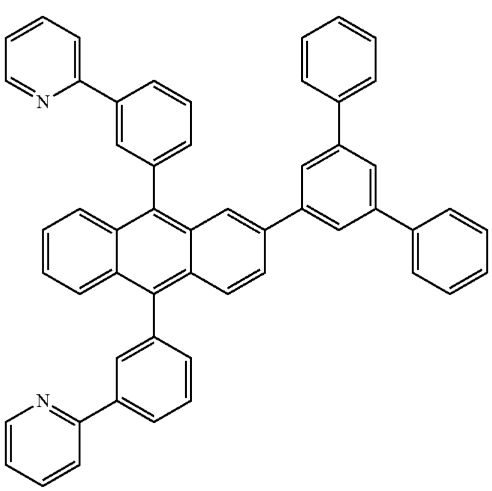
-continued
ET9
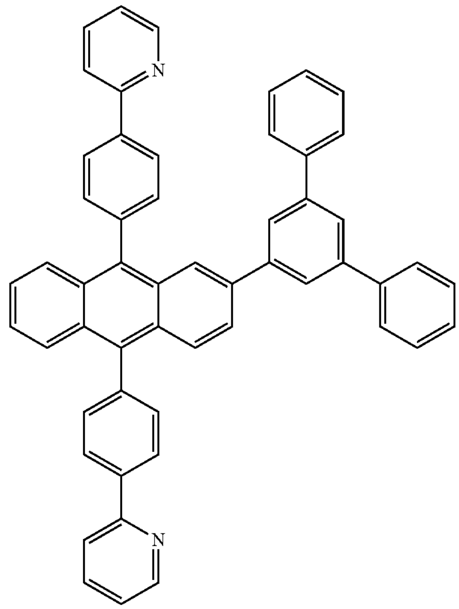
ET10
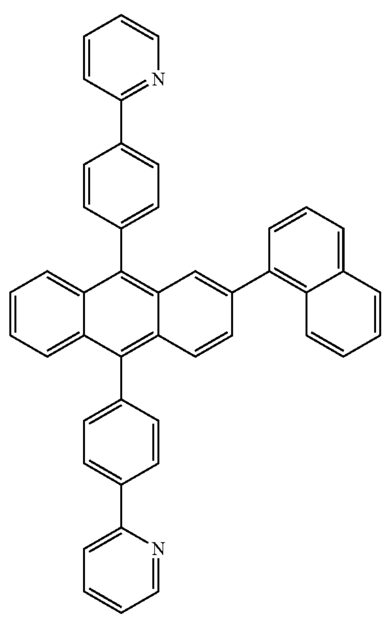

-continued
ET11
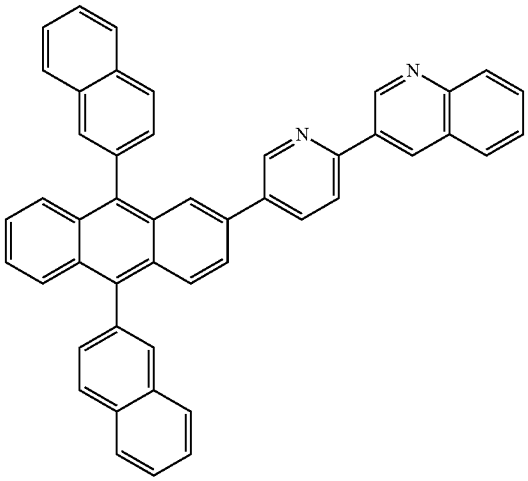
ET12
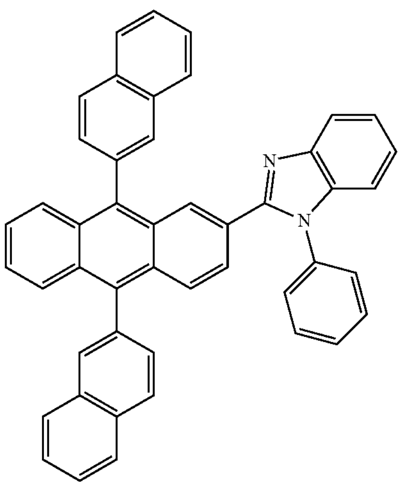
ET13
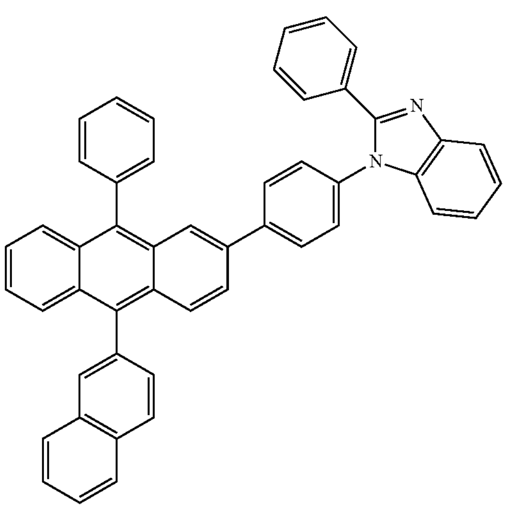
-continued
ET14
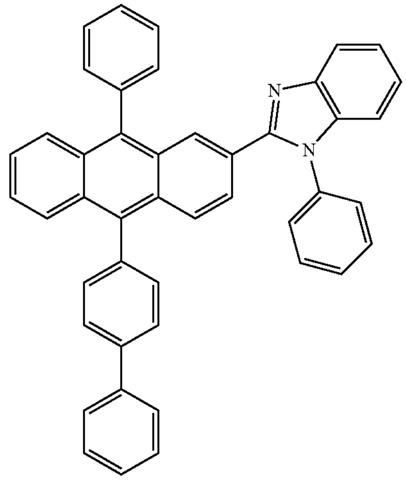
ET15
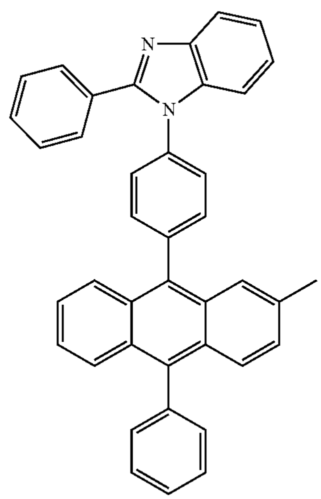
ET16
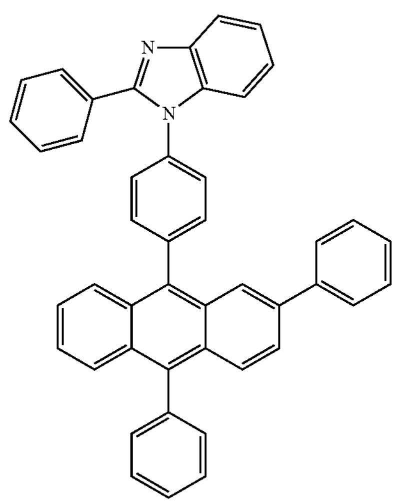

-continued
ET17
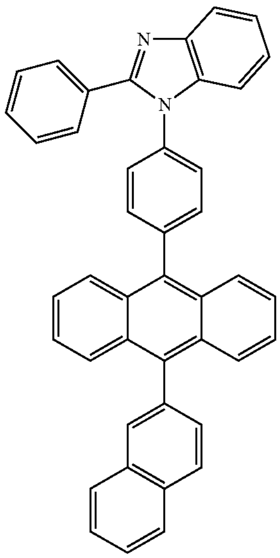
ET18
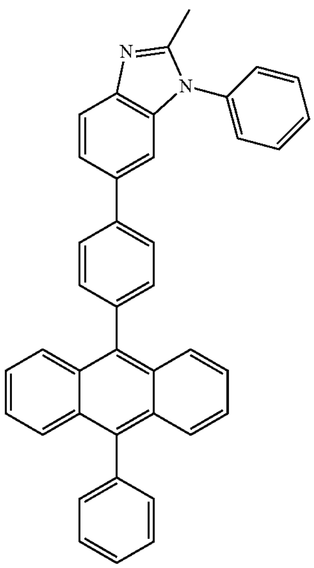
ET19
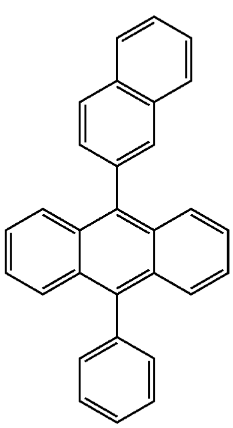
-continued
ET20
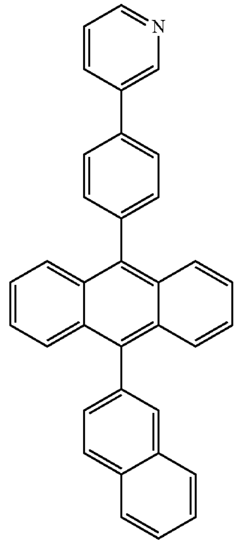
ET21
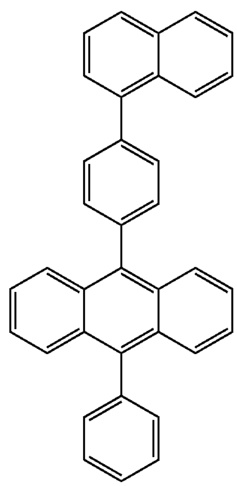
ET22
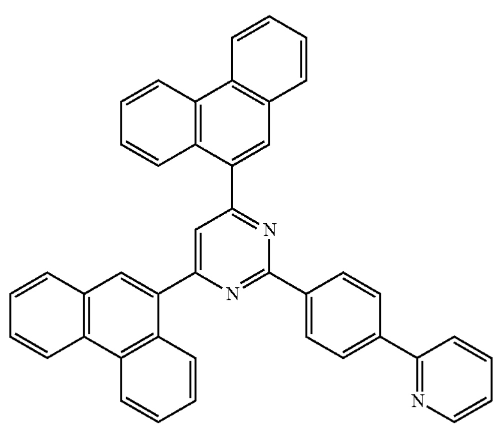

-continued
ET23
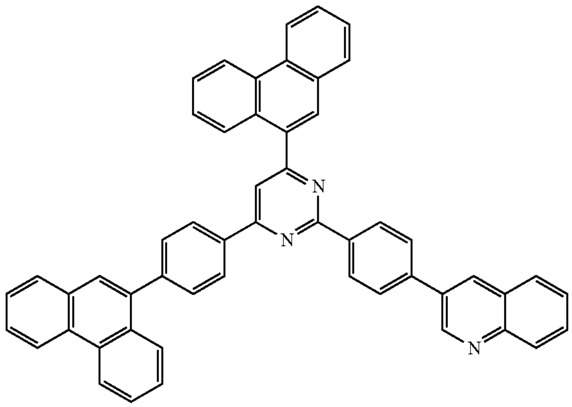
ET24
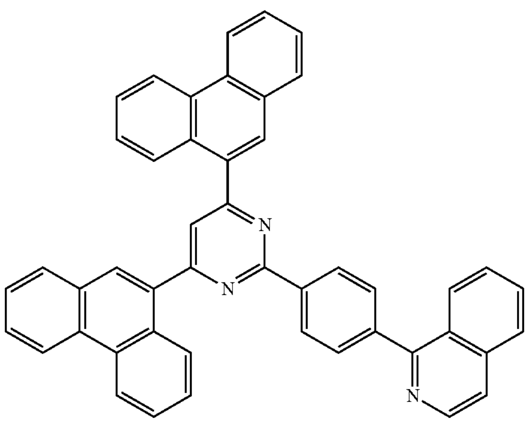
ET25
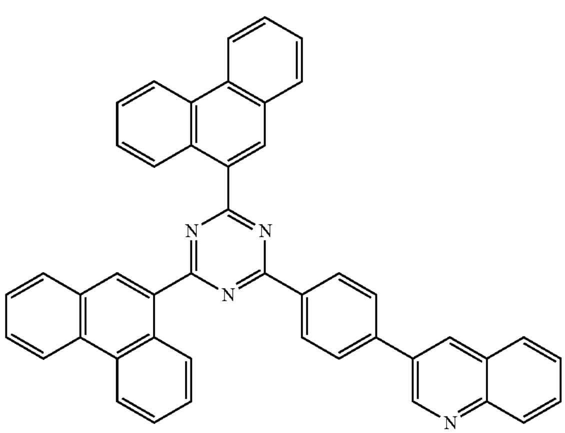
-continued
ET26
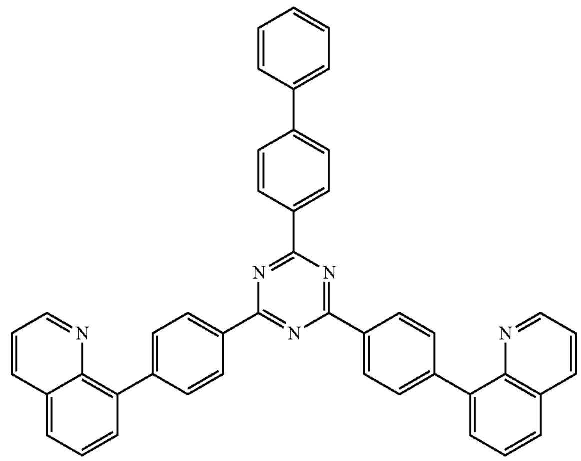
ET27
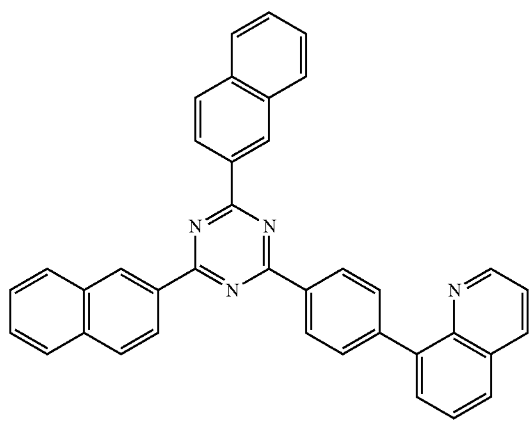
ET28
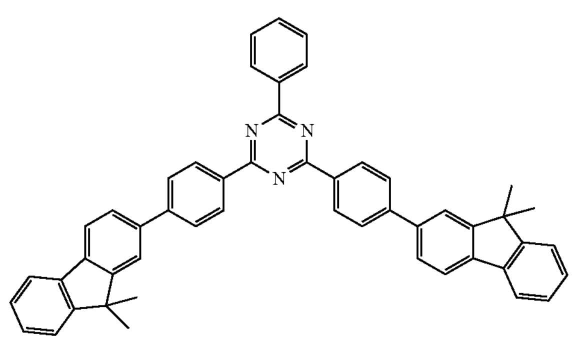

-continued
ET29
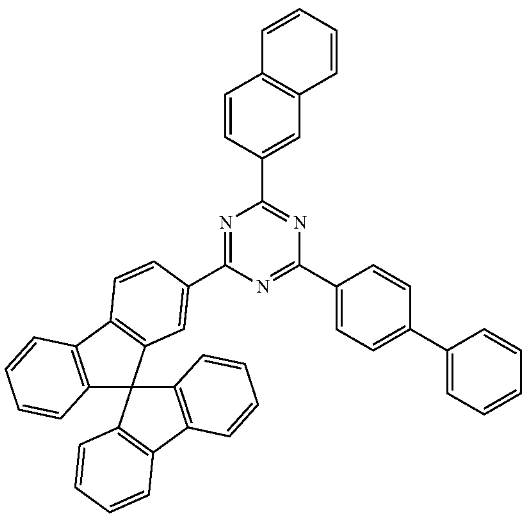
ET30
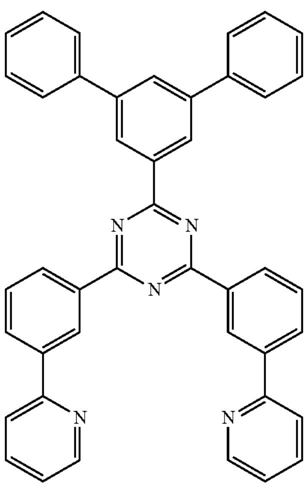
ET31
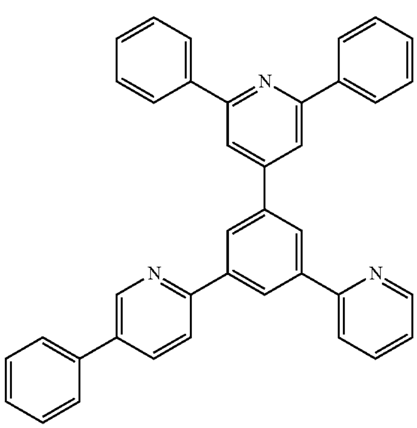
-continued
ET32
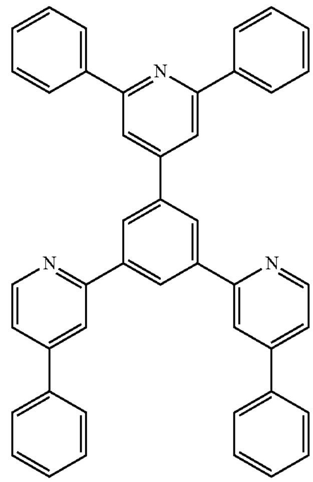
ET33
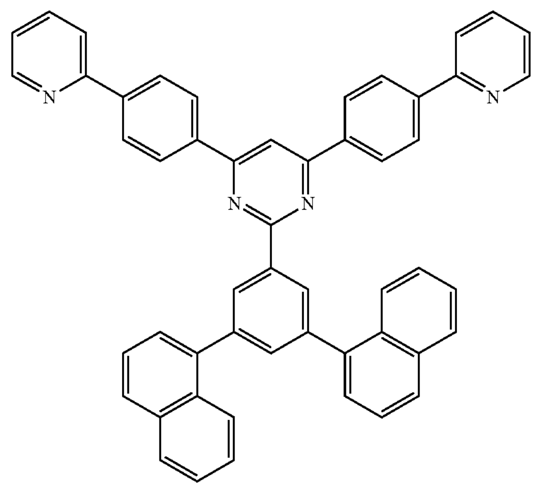
ET34
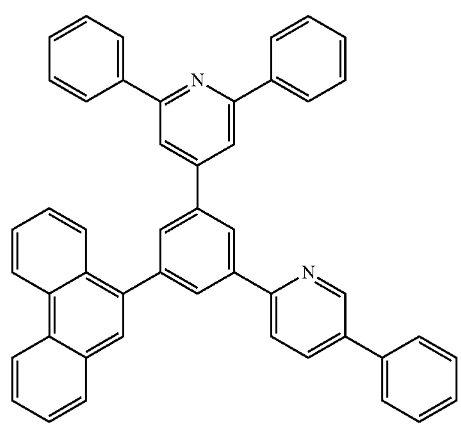

ET35
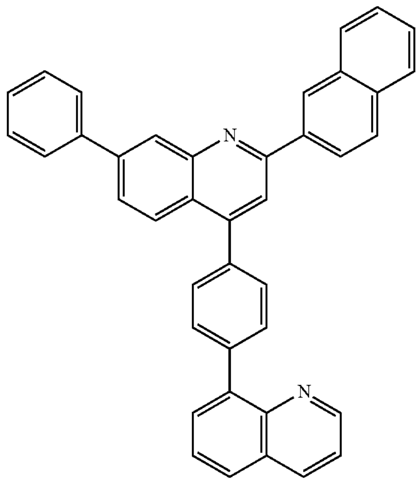
ET36
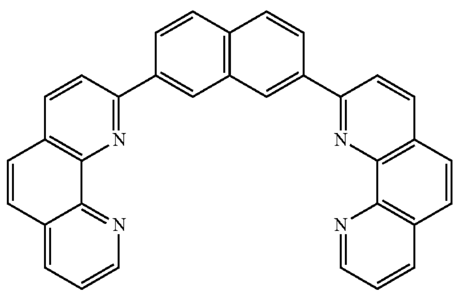
ET37
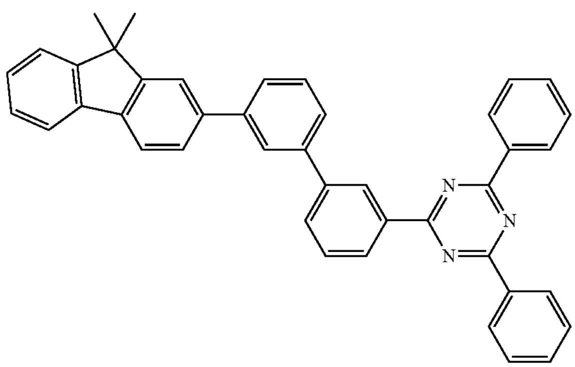
ET38
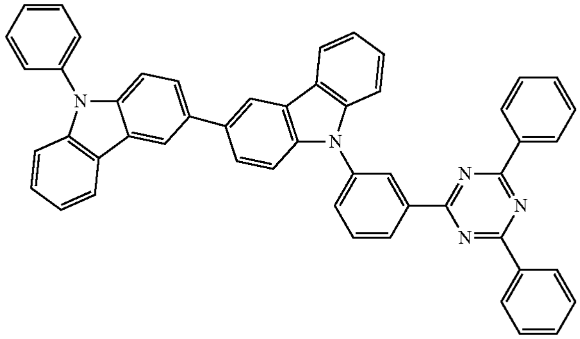
ET39
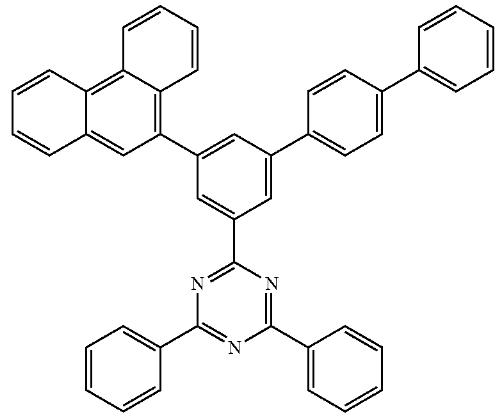
ET40
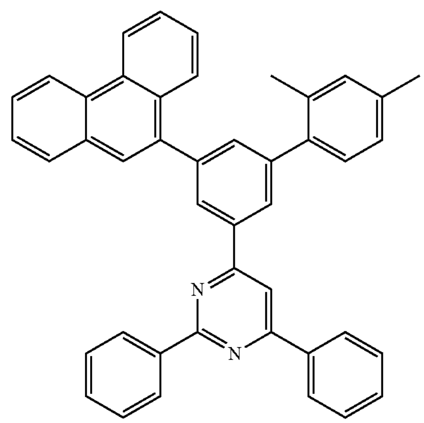
ET41
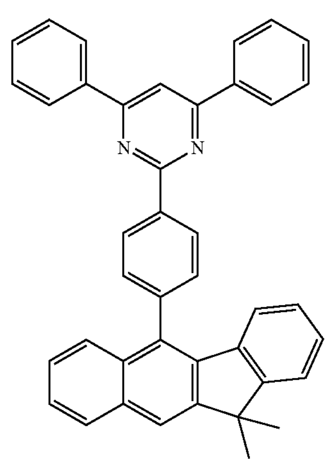

-continued

ET42

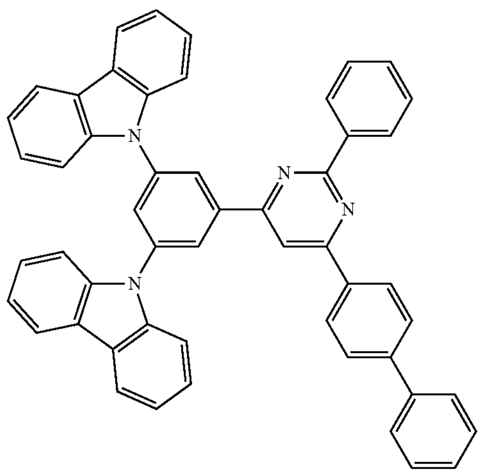

ET43

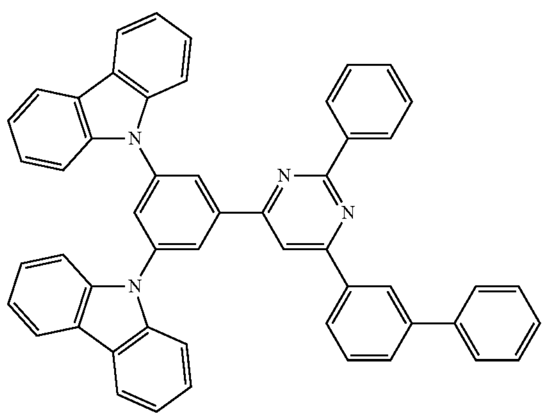

ET44

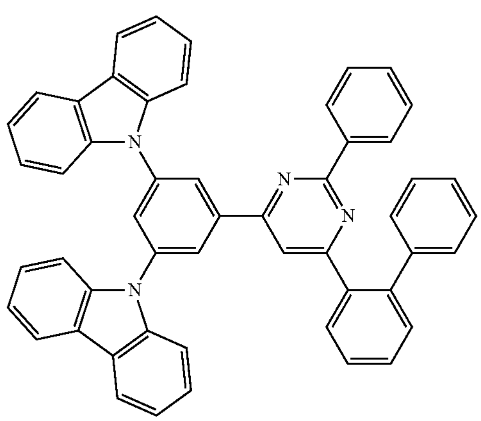

ET45

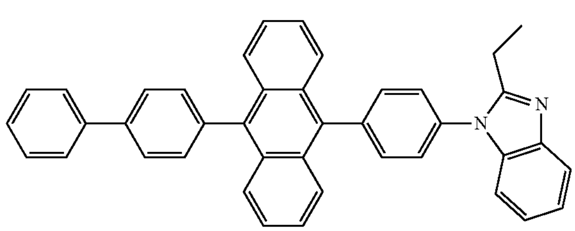

-continued $Alq_3$

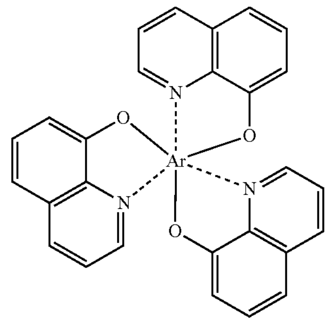

BAlq

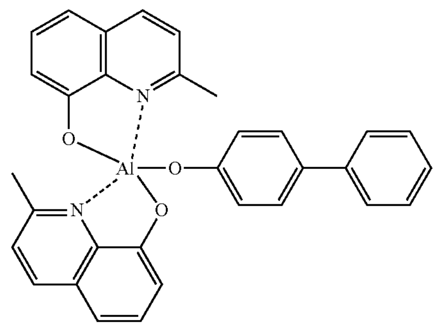

TAZ

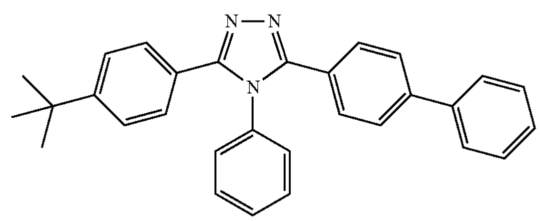

NTAZ

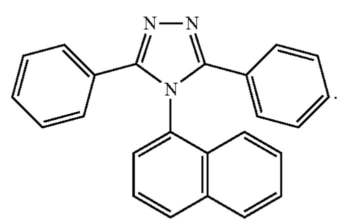

The thickness of the electron transport region may be from about 160 Å to about 5,000 Å, for example, from about 100 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the buffer layer, hole blocking layer, electron control layer, electron transport layer and/or electron transport layer are within these ranges, satisfactory electron transporting characteristics may be obtained without a substantial increase in driving voltage.

The electron transport region (for example, the electron transport layer in the electron transport region) may further include, in addition to the materials described above, a metal element-containing material.

The metal element-containing material may include an alkali metal complex, alkaline earth metal complex, or any combination thereof. The metal ion of an alkali metal complex may be a Li ion, a Na ion, a K ion, a Rb ion, or a Cs ion, and the metal ion of alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal element-containing material may include a Li complex. The Li complex may include, for example, Compound ET-D1 (lithium quinolate, LiQ) or ET-D2:

ET-D1

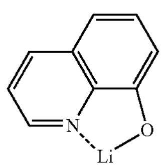

ET-D2

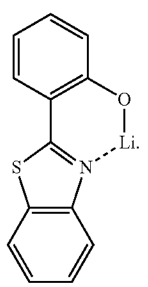

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, alkali metal, alkaline earth metal, rare earth metal, an alkali metal-containing compound, an alkaline earth metal-containing compound, a rare earth metal-containing compound, alkali metal complex, alkaline earth-metal complex, rare earth metal complex, or any combination thereof may be homogeneously or non-homogeneously dispersed in a matrix including the organic material.

The thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

In an embodiment, the second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode. The second electrode 150 may have a single-layered structure or a multi-layered structure including two or more layers.

Capping Layer 170

The capping layer 170 (hereinafter, the second capping layer) may be outside the second electrode 150 of the light-emitting device 10. In addition, a first capping layer may be located outside the first electrode 110. In detail, the light-emitting device 10 may have a structure in which the first electrode 110, the interlayer 130, the second electrode 150, and the second capping layer 170 are sequentially stacked, or a structure in which the first capping layer, the first electrode 110, the interlayer 130, the second electrode 150, and the second capping layer 170 are sequentially stacked.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved. The second capping layer may include the first material represented by Formula 1 or 2 as described above. Each of the first capping layer and second capping layer may include a material having a refractive index (at 589 nm) of about 1.6 or more.

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphyrine derivatives, phthalocyanine derivatives, naphthalocyanine derivatives, alkali metal complexes, alkaline earth-based complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include a compound selected from Compounds HT28 to HT33, Compounds CP1 to CP6, N4,N4'-di(naphthalen-2-yl)-N4,N4'-diphenyl-[1,1'-biphenyl]-4,4'-diamine (β-NPB), or any combination thereof:

CP1

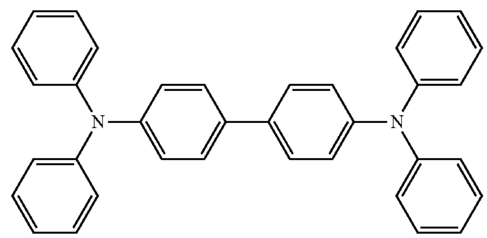

CP2

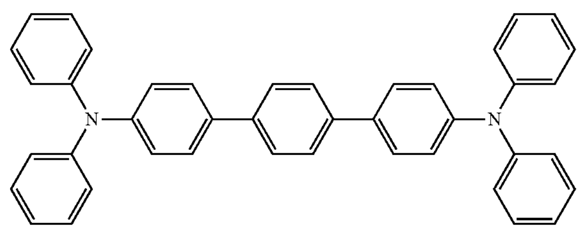

CP3

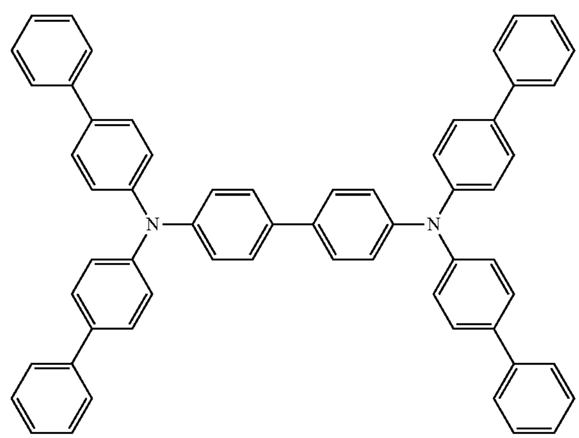

CP4

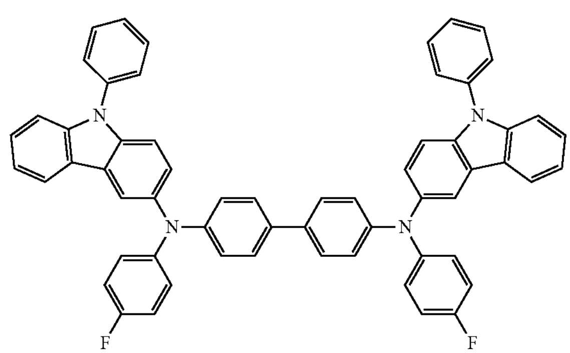

-continued

CP5

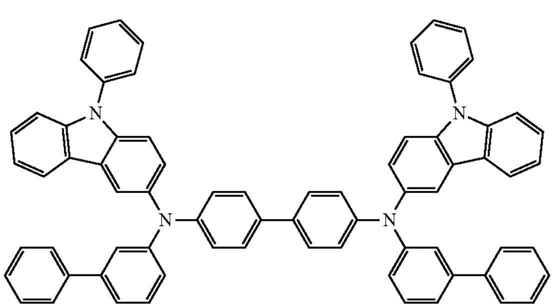

CP6

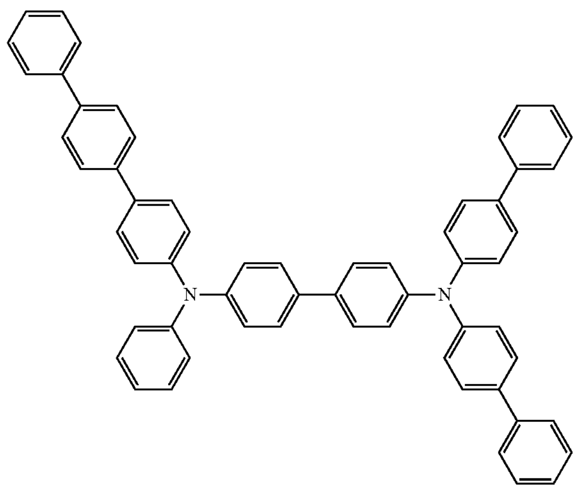

β-NPB

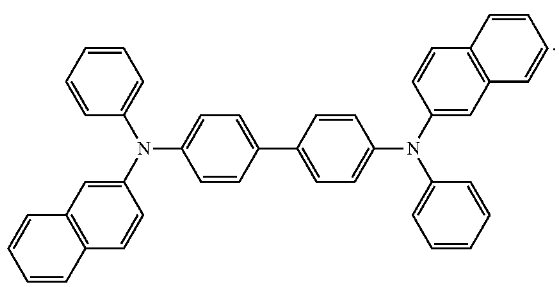

Film

The first material represented by Formula 1 or 2 may be included in various films. Accordingly, another aspect provides a film including the first material represented by Formula 1. The film may be, for example, an optical member or, a light control means (for example, a color filter, a color conversion member, a capping layer, a light extraction efficiency enhancement layer, a selective light-absorbing layer, a polarizing layer, a quantum dot-containing layer, etc.), a light-blocking member (for example, a light-reflecting layer, a light-absorbing layer, etc.), a protective member (for example, an insulating layer, a dielectric layer, etc.), or the like.

Electronic Apparatus

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas. A pixel-defining film may be located among the subpixel areas to define each of the subpixel areas.

The color filter may further include a plurality of color filter areas and light-blocking patterns located among the color filter areas, and the color conversion layer may include a plurality of color conversion areas and light-blocking patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot may be the same as described herein. The first area, the second area, and/or the third area may each include a scatter.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third-first light may have different maximum emission wavelengths from one another. In detail, the first light may be blue light, the first first-color light may be red light, the second first-color light may be green light, and the third first-color light may be blue light.

The electronic apparatus may further include a thin-film transistor in addition to the light-emitting device 10 or 20 as described above. The thin-film transistor may include a source electrode, a drain electrode, and an activation layer, wherein any one of the source electrode and the drain electrode may be electrically connected to any one of the first electrode and the second electrode of the light-emitting device. The thin-film transistor may further include a gate electrode, a gate insulating film, or the like. The activation layer may include a crystalline silicon, an amorphous silicon, an organic semiconductor, an oxide semiconductor, or the like.

The electronic apparatus may further include a sealing portion for sealing the light-emitting device. The sealing portion and/or the color conversion layer may be located between the color filter and the light-emitting device. The sealing portion may allow light from the light-emitting device to be extracted to the outside, while simultaneously preventing ambient air and moisture from penetrating into the light-emitting device. The sealing portion may be a sealing substrate including a transparent glass or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infra-red touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector. The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 3:
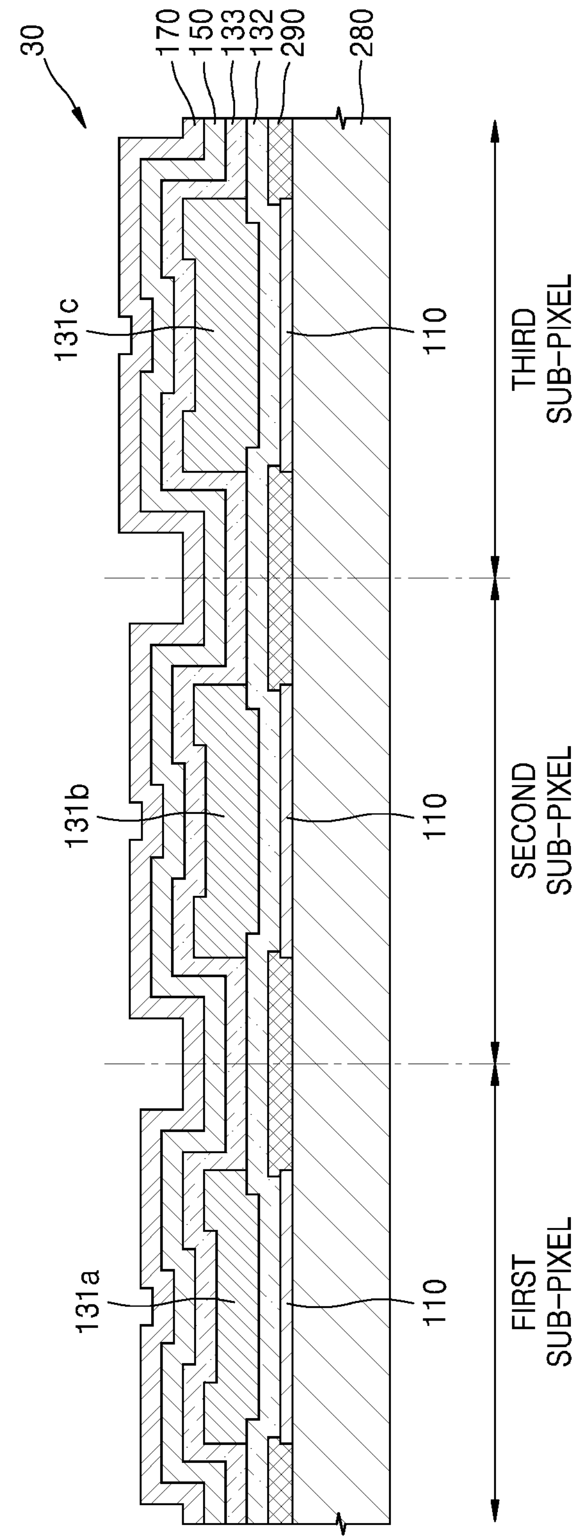
FIG. 3 is a cross-sectional view of an embodiment of a structure of a light-emitting device constructed according to the principles of the invention.

Description of FIG. 3

FIG. 3 is a cross-sectional view of an embodiment of a structure of a light-emitting device constructed according to the principles of the invention. Hereinafter, only differences with respect to the light-emitting device 10 will be described in detail to avoid redundancy.

The light-emitting device 30 may include: a substrate partitioned into a first subpixel area, a second subpixel area, and a third subpixel area; a first electrode, which may be in the form of a plurality of anodes 110 located in each of the first subpixel area, the second subpixel area, and the third subpixel area of the substrate; a second electrode, which may be in the form of a cathode 150 facing the plurality of anodes 110; a capping layer 170 on the cathode 150; and an interlayer including a first emission layer 131*a* in first subpixel area, a second emission layer 131*b* in second subpixel area and a third subpixel area in third subpixel area which each located between the plurality of anodes 110 and the cathode 150, wherein the interlayer may include: a common hole transport region 132 between the first emission layer 131*a*, the second emission layer 131*b*, and the third emission layer 131*c* and the plurality of anodes 110; and a common electron transport region 133 located between the first emission layer 131*a*, the second emission layer 131*b*, and the third emission layer 131*c* and the cathode 150. The capping layer 170 may include the first material represented by Formula 1 or 2 as described above. The electron transport region 133 may include the second material represented by Formula 1 or 2 as described above. The electron transport region 133 may include a first electron transport layer including a compound including an organic electron transport material and a metal element-containing material.

The first emission layer 131*a* may emit first-color light, the second emission layer 131*b* may emit second-color light, and the third emission layer 131*c* may emit third-color light. The first-color light, the second-color light, and the third-color light may have different maximum emission wavelengths from one another. The first-color light, the second-color light, and the third-color light may be mixed to emit white light. In an embodiment, the first color light may be red light, the second color light may be green light, and the third color light may be blue light, but embodiments are not limited thereto. When the first-color light is blue light, the first emission layer 131*a* may include a known blue light-emitting material, when the first-color light is red light, the first emission layer 131*a* may include a known red light-emitting material, and when the first-color light is green light, the first emission layer 131*a* may include a known green light-emitting material. In an embodiment, the first mission layer 131*a* may include a known host and a known dopant. The host and the dopant may be the same as described with connection to FIG. 1.

The plurality of anodes 110, the hole transport region 132, the electron transport region 133, the cathode 150, and the capping layer 170 may be the same as described in connection with FIG. 1, and the first emission layer 131*a*, the second emission layer 131*b*, and the third emission layer 131*c* may be the same as described in connection with the description of the emission layer 131 in FIG. 1.

Figure 4:
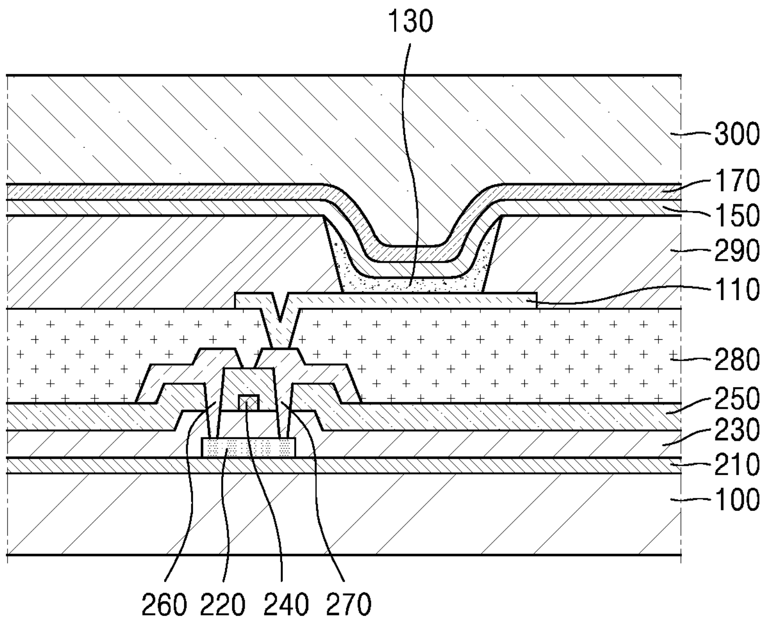
FIG. 4 is a cross-sectional view of another embodiment of a structure of a light-emitting apparatus constructed according to the principles of the invention.

FIG. 4 is a cross-sectional view of another embodiment of a structure of a light-emitting apparatus constructed according to the principles of the invention.

The light-emitting apparatus 180 of FIG. 4 includes a substrate 100, a thin-film transistor (TFT) 200, a light-emitting device, and an encapsulation portion 300 that seals the light-emitting device. The substrate 100 may be a flexible substrate, a glass substrate, or a metal substrate. A buffer layer 210 may be formed on the substrate 100. The buffer layer 210 may prevent penetration of impurities through the substrate 100 and may provide a generally flat surface on the substrate 100.

The TFT 200 may be located on the buffer layer 210. The TFT 200 may include an activation layer 220, a gate electrode 240, a source electrode 260, and a drain electrode 270. The activation layer 220 may include an inorganic semiconductor such as a silicon or a polysilicon, an organic semiconductor, or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230. An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device 10 is provided on the passivation layer 280. The light-emitting device 10 may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an interlayer 130 may be formed in the exposed region of the first electrode 110. The pixel defining layer 290 may be a polyimide or a polyacrylic organic film. At least some layers of the interlayer 130 may extend beyond the upper portion of the pixel defining layer 290 to be arranged in the form of a common layer. The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including a silicon nitride ($SiN_x$), a silicon oxide ($SiO_x$), an indium tin oxide (ITO), an indium zinc oxide (IZO), or any combination thereof; an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic resin (for example, a polymethyl methacrylate, a polyacrylic acid, or the like), an epoxy-based resin (for example, an aliphatic glycidyl ether (AGE), or the like), or a combination thereof; or a combination of the inorganic film and the organic film.

Figure 5:
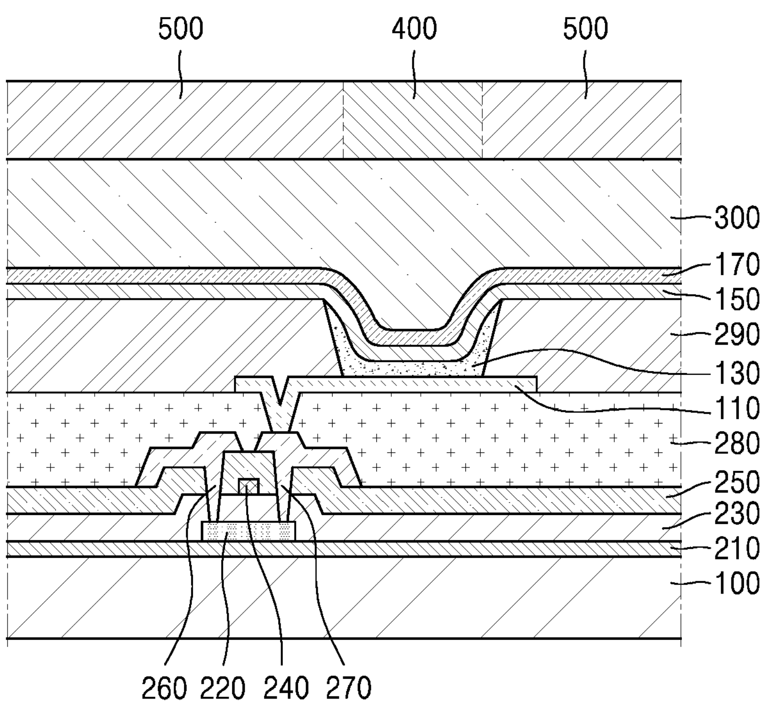
FIG. 5 is a cross-sectional view of a further embodiment of a structure of a light-emitting apparatus constructed according to the principles of the invention.

FIG. 5 is a cross-sectional view of a further embodiment of a structure of a light-emitting apparatus constructed according to the principles of the invention.

The light-emitting apparatus 190 of FIG. 5 is the same as the light-emitting apparatus 180 of FIG. 4, except that a light-blocking pattern 500 and a functional region 400 are additionally located on the encapsulation portion 300. Hereinafter, only differences with respect to the light-emitting apparatus 180 will be described in detail to avoid redundancy. The functional region 400 may be a combination of i) a color filter area, ii) a color conversion area, or iii) a combination of the color filter area and the color conversion area. In an embodiment, the light-emitting device 10 included in the light-emitting apparatus 190 of FIG. 5 may be a tandem light-emitting device.

Illustrative Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about 10-8 torr to about 10-3 torr, and a deposition speed of about 0.01 Å/sec to about 100 Å/sec, depending on a material to be included in a layer to be formed and the structure of a layer to be formed.

Definition of Terms

As used herein, the term "interlayer" refers to a single layer and/or all of a plurality of layers located between a first electrode and a second electrode of a light-emitting device.

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

The term "$C_3$-$C_{60}$ carbocyclic group" as used herein refers to a cyclic group consisting of only carbon as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are fused with each other. For example, the number of ring-forming atoms of the $C_1$-$C_{60}$ heterocyclic group may be from 3 to 61.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a group $T_1$ as defined below or ii) a fused cyclic group in which two or more groups $T_1$ are fused with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group $T_2$ defined below, ii) a fused cyclic group in which two or more groups $T_2$ are fused with each other, or iii) a fused cyclic group in which at least one group $T_2$ and at least one group Ti are fused with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group $T_1$ defined below, ii) a fused cyclic group in which two or more groups $T_1$ are fused with each other, iii) a group $T_3$ defined below, iv) a fused cyclic group in which two or more groups $T_3$ are fused with each other, or v) a fused cyclic group in which at least one group $T_3$ and at least one group $T_1$ are fused with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a group T4 defined below, ii) a fused cyclic group in which two or more group T4 are fused with each other, iii) a fused cyclic group in which at least one group T4 and at least one group T1 are fused with each other, iv) a fused cyclic group in which at least one group T4 and at least one group T3 are fused with each other, or v) a fused cyclic group in which at least one group T4, at least one group T1, and at least one group T3 are fused with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group fused to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understand by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the diavalent $C_1$-$C_{60}$ heterocyclic group are the $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group (for example, having 8 to 60 carbon atoms) having two or more rings fused to each other, only carbon atoms as ring-forming atoms, and no aromaticity in its entire molecular structure. Examples of the monovalent non-aromatic fused polycyclic group are an indenyl group, a fluorenyl group, a spiro-bifluorenyl group, a benzofluorenyl group, an indenophenanthrenyl group, and an indenon anthracenyl group. The term "divalent non-aromatic fused polycyclic group" as used herein refers to a divalent group having a structure corresponding to a monovalent non-aromatic fused polycyclic group.

The term "monovalent non-aromatic fused heteropolycyclic group" as used herein refers to a monovalent group (for example, having 1 to 60 carbon atoms) having two or more rings fused to each other, at least one heteroatom other than carbon atoms, as a ring-forming atom, and no aromaticity in its entire molecular structure. Examples of the monovalent non-aromatic fused heteropolycyclic group are a pyrrolyl group, a thiophenyl group, a furanyl group, an indolyl group, a benzoindolyl group, a naphthon indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to a monovalent non-aromatic fused heteropolycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_7$-$C_{60}$ aryl alkyl group" as used herein indicates -$A_{104}A_{105}$ (wherein $A_{104}$ is the $C_1$-$C_{54}$ alkylene group, and $A_{105}$ is the $C_6$-$C_{59}$ aryl group), and the term "$C_2$-$C_{60}$ heteroaryl alkyl group" as used herein indicates -$A_{106}A_{107}$ (wherein $A_{106}$ is the $C_1$-$C_{59}$ alkylene group, and $A_{107}$ is the $C_1$-$C_{59}$ heteroaryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(O_{31})(O_{32})$.

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom are O, S, N, P, Si, B, Ge, Se, and any combination thereof The term "third-row transition metal" as used herein includes hafnium (Hf), tantalum (Ta), tungsten(W), rhenium (Re), osmium (Os), iridium (Ir), platinum (Pt), and gold (Au).

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, a compound made according to the principles and certain embodiments of the invention and a light-emitting device including the same will be described in detail with reference to Synthesis Examples and Examples. The wording "B was used instead of A" used in describing Synthesis Examples refers to that an identical molar equivalent of B was used in place of A.

EXAMPLES

Example 1-1: Preparation of Red Light-Emitting Device

As an anode, a 15 Ω/cm² (1,200 Å) ITO glass substrate from Corning, Inc. of Corning, New York was cut to a size of 50 mm×50 mm×0.7 mm, sonicated with isopropyl alcohol and pure water each for 15 minutes, and then cleaned by exposure to ultraviolet rays and ozone for 30 minutes. The ITO glass substrate was provided to a vacuum deposition apparatus.

The compound HT3 was vacuum-deposited on the ITO anode formed on the ITO glass substrate to form a hole injection layer having a thickness of 120 nm, and then, the compound HT47 was vacuum-deposited on the hole injection layer to form a hole transport layer having a thickness of 40 nm. The compounds H212, H313, and PD11 were co-deposited on the hole transport layer at the weight ratio of 48:48:4 to form an emission layer having a thickness of 30 nm.

Then, Compound 1-1 and Yb were co-deposited on the emission layer at the weight ratio of 97:3 to form an electron transport layer having a thickness of 30 nm, and Ag and Mg were co-deposited on the electron transport layer at the weight ratio of 97:3 to form an cathode having a thickness of 10 nm, and Compound 1-10 was deposited on the cathode to form a capping layer having a thickness of 70 nm, thereby completing the manufacture of a light-emitting device.

Examples 1-2 to 1-11 and Comparative Examples 1-1 and 1-2

Light-emitting devices were manufactured in the same manner as in Example 1-1, except that the compounds and the weight ratios shown in Table 1 were used to form electron transport layers, cathodes, and capping layers.

Example 1-12

Light-emitting device was manufactured in the same manner as in Example 1-1, except that Compound ET37 was deposited on the emission layer to form a first electron transport layer having a thickness of 5 nm, and Compound 1-7 and Yb were co-deposited on the first electron transport layer at the weight ratio of 97:3 to form a second electron transport layer having a thickness of 25 nm, and Compound 1-7 was deposited on the cathode to form a capping layer having a thickness of 70 nm.

Example 2-1: Preparation of Green Light-Emitting Device

Light-emitting devices were manufactured in the same manner as in Example 1-1, except that the compounds H205, H323, and PD13 were co-deposited at the weight ratio of 60:30:10 to form an emission layer having a thickness of 30 nm.

Examples 2-2 to 2-12 and Comparative Examples 2-1 and 2-2

Light-emitting devices were manufactured in the same manner as in Example 2-1, except that the compounds and the weight ratios shown in Table 1 were used to form electron transport layers, cathodes, and capping layers.

Example 2-12

Light-emitting device was manufactured in the same manner as in Example 2-1, except that Compound ET37 was deposited on the emission layer to form a first electron transport layer having a thickness of 5 nm, and Compound 1-7 and Yb were co-deposited on the first electron transport layer at the weight ratio of 97:3 to form a second electron transport layer having a thickness of 25 nm, and Compound 1-7 was deposited on the cathode to form a capping layer having a thickness of 70 nm.

HT3

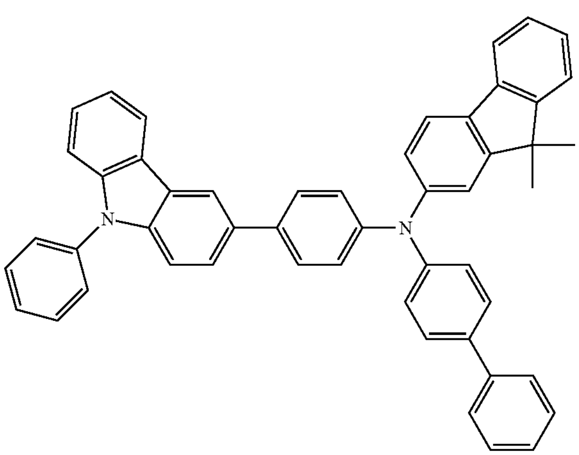

-continued

HT47

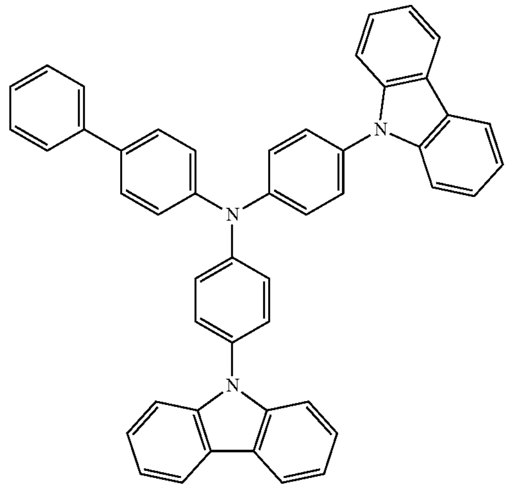

PD13

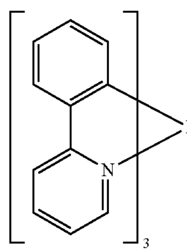

H205

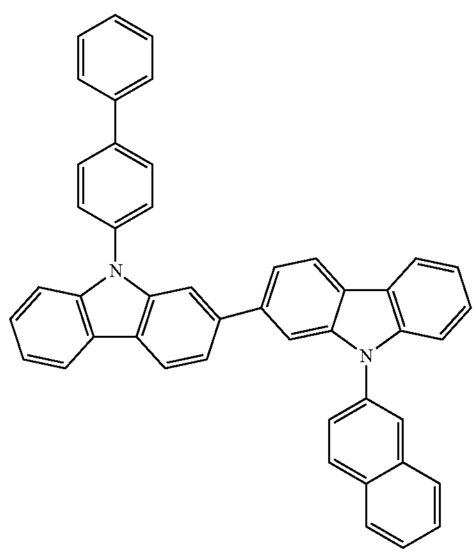

-continued

H323

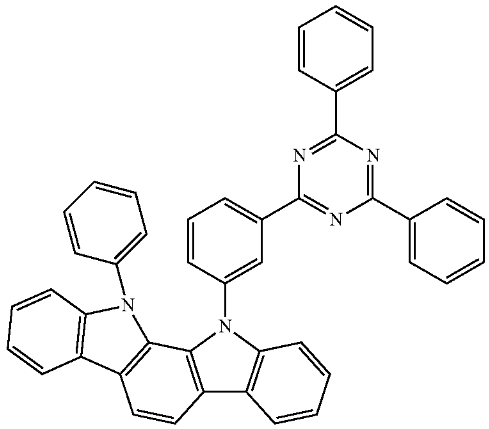

PD11

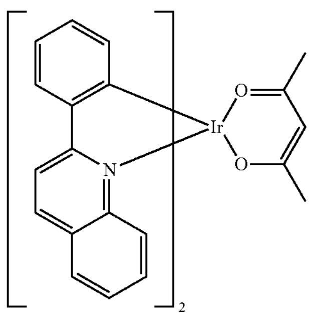

H212

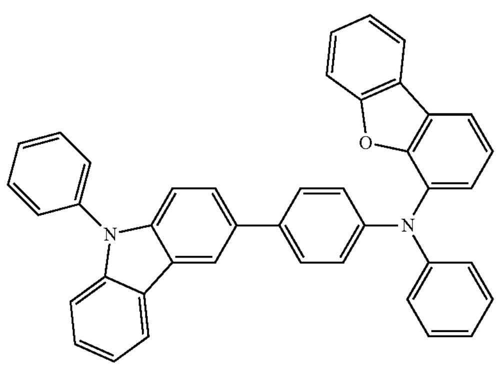

-continued

H313

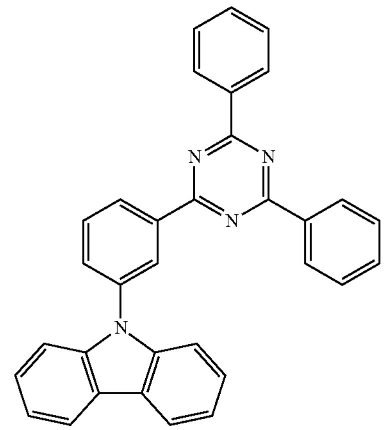

Evaluation Example

To evaluate the characteristics of the light-emitting devices in Examples 1-1 to 1-12 and Comparative Examples 1-1 and 1-2 as well as Examples 2-1 to 2-12 and Comparative Examples 2-1 and 2-2, the driving voltage at the current density of 10 $mA/cm^2$, luminescence efficiency, and lifespan were measured using a source meter unit (SMU) sold under the trade designation 2400 series by Tektronix, Inc., of Beaverton, Oregon, and a luminance meter sold under the trade designation PR650 from Konica Minolta, Inc. of Tokyo, Japan, and the lifespan was measured by the time that the luminance reaches 95% of the initial luminance at 1000 nit.

Table 1 below shows the evaluation results of the characteristics of the light-emitting devices manufactured in Examples 1-1 to 1-12 and Comparative Examples 1-1 and 1-2, and Table 2 below shows the evaluation results of the characteristics of the light-emitting devices manufactured in Examples 2-1 to 2-12 and Comparative Examples 2-1 and 2-2.

TABLE 1

| Red | Electron Transport Layer | Cathode | Capping Layer | Driving Voltage | Efficiency | Lifespan |
|---|---|---|---|---|---|---|
| Example 1-1 | 1-1:Yb (97:3) | Ag:Mg (97:3) | 1-10 | −0.15 V | 110% | 140% |
| Example 1-2 | 1-1:Yb (97:3) | Ag | 1-10 | −0.20 V | 114% | 135% |
| Example 1-3 | 1-7:Yb (95:5) | Ag:Mg (95:5) | 1-7 | −0.20 V | 108% | 155% |
| Example 1-4 | 1-18:Yb (95:5) | Ag:Mg (95:5) | 1-7 | −0.30 V | 108% | 150% |
| Example 1-5 | 2-14:Yb (95:5) | Ag:Mg (95:5) | 1-7 | −0.25 V | 110% | 130% |
| Example 1-6 | 2-14:Yb (95:5) | Ag:Mg (95:5) | 2-14 | −0.25 V | 106% | 130% |
| Example 1-7 | 1-7:Yb (95:5) | Ag:Mg (95:5) | 2-14 | −0.20 V | 108% | 140% |
| Example 1-8 | 2-51:Yb (95:5) | Ag:Mg (95:5) | 2-51 | −0.30 V | 107% | 135% |

TABLE 1-continued

| Red | Electron Transport Layer | Cathode | Capping Layer | Driving Voltage | Efficiency | Lifespan |
|---|---|---|---|---|---|---|
| Example 1-9 | 2-69:Yb (95:5) | Ag:Mg (95:5) | 2-69 | −0.25 V | 110% | 150% |
| Example 1-10 | 2-69:Yb (95:5) | Ag | 2-69 | −0.30 V | 112% | 140% |
| Example 1-11 | 1-7:Li (97:3) | Ag:Mg (97:3) | 1-7 | −0.25 V | 110% | 125% |
| Example 1-12 | ET37 (5 nm)/ 1-7:Yb (25 nm, 97:3) | Ag:Mg (97:3) | 1-7 | −0.30 V | 110% | 150% |
| Comparative Example 1-1 | Bphen:Cs (95:5) | Ag:Mg (97:3) | MeO—TPD | — | 100% | 100% |
| Comparative Example 1-2 | TPBi | Ag:Mg (97:3) | CP004 | +0.50 V | 104% | 120% |

TABLE 2

| Green | Electron Transport Layer | Cathode | Capping Layer | Driving Voltage | Efficiency | Lifespan |
|---|---|---|---|---|---|---|
| Example 2-1 | 1-1:Yb (97:3) | Ag:Mg (97:3) | 1-10 | −0.10 V | 107% | 135% |
| Example 2-2 | 1-1:Yb (97:3) | Ag | 1-10 | −0.15 V | 110% | 130% |
| Example 2-3 | 1-7:Yb (95:5) | Ag:Mg (95:5) | 1-7 | −0.20 V | 109% | 150% |
| Example 2-4 | 1-18:Yb (95:5) | Ag:Mg (95:5) | 1-7 | −0.15 V | 105% | 140% |
| Example 2-5 | 2-14:Yb (95:5) | Ag:Mg (95:5) | 1-7 | −0.15 V | 107% | 130% |
| Example 2-6 | 2-14:Yb (95:5) | Ag:Mg (95:5) | 2-14 | −0.20 V | 107% | 135% |
| Example 2-7 | 1-7:Yb (95:5) | Ag:Mg (95:5) | 2-14 | −0.10 V | 109% | 130% |
| Example 2-8 | 2-51:Yb (95:5) | Ag:Mg (95:5) | 2-51 | −0.15 V | 105% | 140% |
| Example 2-9 | 2-69:Yb (95:5) | Ag:Mg (95:5) | 2-69 | −0.20 V | 108% | 135% |
| Example 2-10 | 2-69:Yb (95:5) | Ag | 2-69 | −0.25 V | 110% | 135% |
| Example 2-11 | 1-7:Li (97:3) | Ag:Mg (97:3) | 1-7 | −0.15 V | 107% | 130% |
| Example 2-12 | ET37 (5 nm)/ 1-7:Yb (25 nm, 97:3) | Ag:Mg (97:3) | 1-7 | −0.25 V | 109% | 150% |
| Comparative Example 2-1 | Bphen:Cs (95:5) | Ag:Mg (97:3) | MeO-TPD | — | 100% | 100% |
| Comparative Example 2-2 | TPBi | Ag:Mg (97:3) | CP4 | +0.40 V | 102% | 110% |

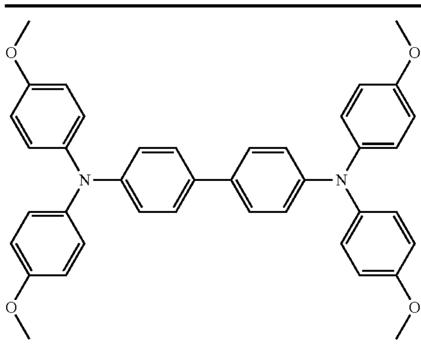

MeO-TPD

TABLE 2-continued

| Green | Electron Transport Layer | Cathode | Capping Layer | Driving Voltage | Efficiency | Lifespan |
|---|---|---|---|---|---|---|

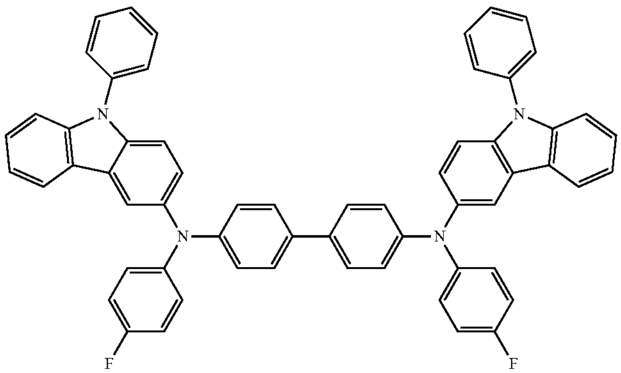

CP4

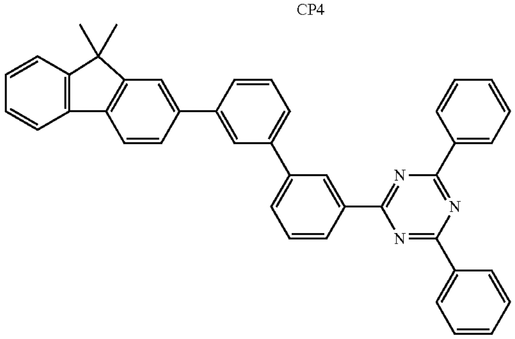

ET37

Table 1 shows that the light-emitting devices of Examples 1-1 to 1-12 have significantly and unexpectedly superior driving voltage, luminescence efficiency, and lifespan compared to the light-emitting devices of Comparative Examples 1-1 and 1-2. Table 2 shows that the light-emitting devices of Examples 2-1 to 2-12 have significantly and unexpectedly superior driving voltage, luminescence efficiency, and lifespan compared to the light-emitting devices of Comparative Examples 2-1 and 2-2.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:

a first electrode;

a second electrode facing the first electrode;

an interlayer between the first electrode and the second electrode and comprising an emission layer; and a capping layer disposed on the second electrode, wherein the interlayer further comprises an electron transport region between the emission layer and the second electrode, the capping layer comprises at least one first material represented by Formula 1 or Formula 2, and the electron transport region satisfies at least one of Condition (1) and Condition (2):

Condition (1)

the electron transport region further comprises a first electron transport layer, wherein the first electron transport layer comprises a mixture comprising an organic electron transport material and a metal element-containing material, and the organic electron transport material and the metal element-containing material are different from each other; and Condition (2)

the electron transport region comprises at least one second material represented by Formula 1 or Formula 2:

Formula 1

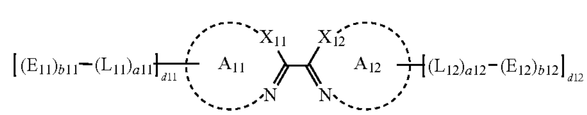

Formula 2

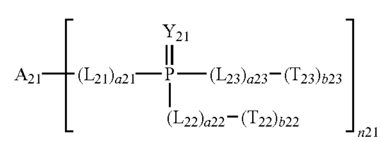

wherein, in Formula 1, $X_{11}$ is N or $C(R_{11})$, $X_{12}$ is N or $C(R_{12})$, $A_{11}$ and $A_{12}$ are each, independently from one another, a $C_1$-$C_{60}$ heterocyclic group comprising at least one N, $L_{11}$ and $L_{12}$ are each, independently from one another, a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a11 and a12 are each, independently from one another, an integer selected from 1 to 3, $E_{11}$, $E_{12}$, $R_{11}$, and $R_{12}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b11 and b12 are each, independently from one another, an integer selected from 1 to 8, d11 and d12 are each, independently from one another, an integer selected from 1 to 8, $R_{11}$ and $R_{12}$ are optionally linked to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, wherein, in Formula 2, $Y_{21}$ is O, S, or Se, $A_{21}$ is a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, n21 is an integer selected from 1 to 3, $L_{21}$ to $L_{23}$ are each, independently from one another, a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a21 to a23 are each, independently from one another, an integer selected from 1 to 3, $T_{22}$ and $T_{23}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b22 and b23 are each, independently from one another, an integer selected from 1 to 8, $T_{22}$ and $T_{23}$ are optionally linked to each other to form a $C_2$-$C_{30}$ heterocyclic group unsubstituted or substituted with at least one $R_{10a}$, and $R_{10a}$ is:

deuterium, —F, —Cl, —Br, —I, a hydroxyl group, a cyano group, or a nitro group;

a $C_1$-Coo alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and wherein the electron transport region further comprises a second electron transport layer between the first electron transport layer and the emission layer.

2. The light-emitting device of claim 1, wherein the first electrode comprises an anode, the second electrode comprises a cathode, the interlayer further comprises a hole transport region between the emission layer and the first electrode, the hole transport region comprises a hole injection layer, a hole transport layer, an emission auxiliary layer, an electron blocking layer, or any combination thereof, and the electron transport region comprises a hole blocking layer, an electron transport layer, an electron injection layer, or any combination thereof.

3. The light-emitting device of claim 1, wherein the second electrode comprises silver.

4. The light-emitting device of claim 3, wherein silver in the second electrode comprises about 95 parts or more by mass based on the total 100 parts by mass of the second electrode.

5. The light-emitting device of claim 1, wherein the electron transport region satisfies the Condition (2), the electron transport region further comprises the first electron transport layer, and the first electron transport layer comprises the second material represented by Formula 1 or Formula 2.

6. The light-emitting device of claim 1, wherein the second electrode and the capping layer directly contact each other.

7. The light-emitting device of claim 1, wherein the electron transport region satisfies the Condition (1), and the organic electron transport material comprises the second material represented by Formula 1 or Formula 2.

8. The light-emitting device of claim 1, wherein the metal element-containing material comprises an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

9. The light-emitting device of claim 1, wherein the metal element-containing material in the first electron transport layer comprises about 5 parts or less by mass based on the total 100 parts by mass of the first electron transport layer.

10. The light-emitting device of claim 1, wherein the interlayer further comprises a hole transport region between the emission layer and the first electrode, and the hole transport region comprises a compound represented by Formula 201, a compound represented by Formula 202, or any combination thereof:

Formula 201

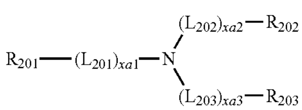

Formula 202

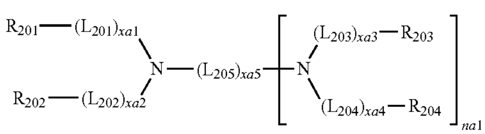

wherein, in Formulae 201 and 202, $L_{201}$ to $L_{204}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ is *—O—*, *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 are each, independently from one another, an integer selected from 0 to 5, xa5 is an integer selected from 1 to 10, $R_{201}$ to $R_{204}$ and $Q_{201}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ are optionally linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{203}$ and $R_{204}$ are optionally linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, na1 is an integer selected from 1 to 4, and $R_{10a}$ has the same meaning as in claim 1.

11. The light-emitting device of claim 1, wherein the emission layer comprises a first host, a second host, and a dopant, and the first host and the second host are different from each other.

12. The light-emitting device of claim 11, wherein the first host is a hole transport compound comprising at least one electron withdrawing group, and the second host is an electron transport compound comprising at least one electron donating group.

13. The light-emitting device of claim 1, wherein the moiety represented by

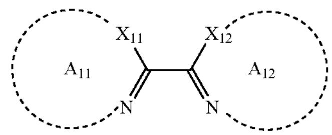

in Formula 1 is represented by one of Formulae 1-1 to 1-32:

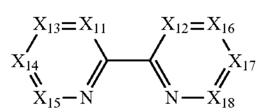

1-1

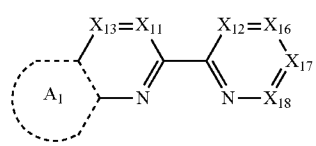

1-2

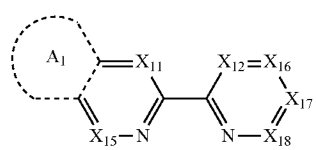

1-3

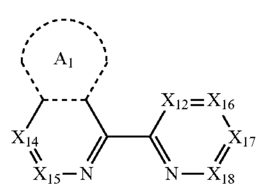

1-4

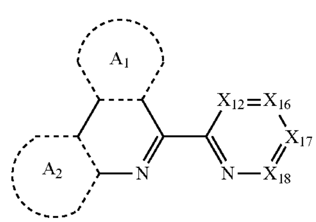

1-5

-continued
1-6
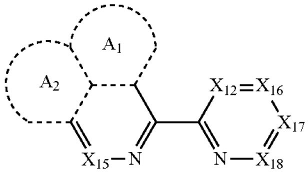
1-7
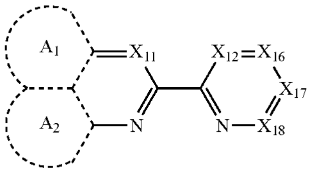
1-8
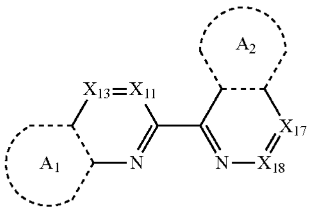
1-9
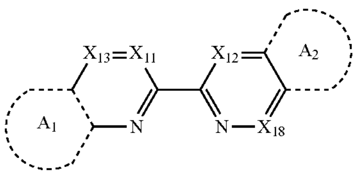
1-10
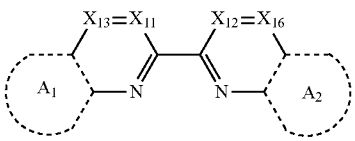
1-11
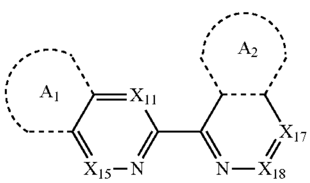
1-12
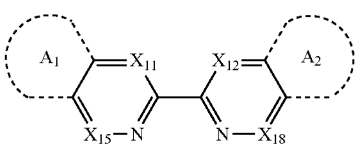
1-13
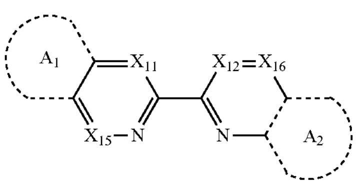
1-14
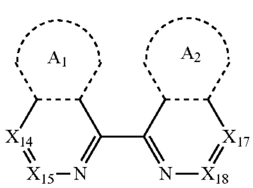
-continued
1-15
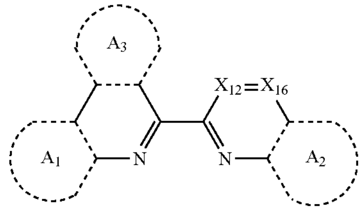
1-16
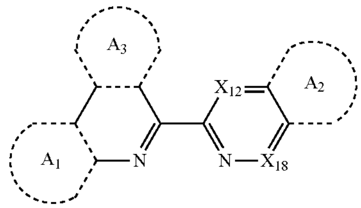
1-17
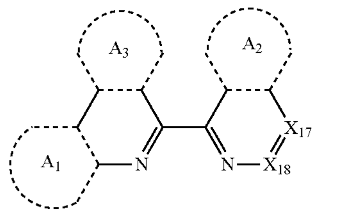
1-18
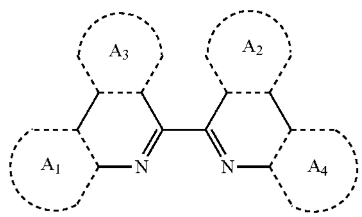
1-19
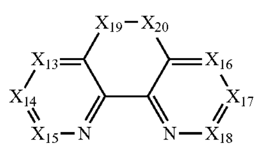
1-20
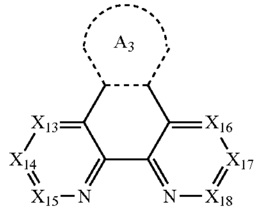
1-21
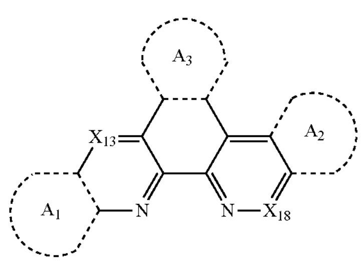

-continued 1-22

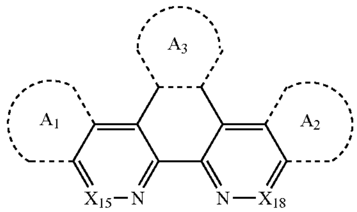

1-23

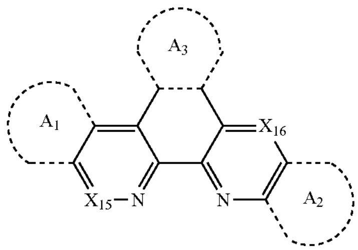

1-24

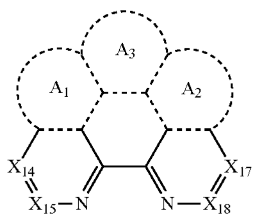

1-25

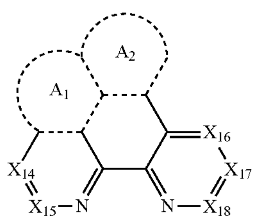

1-26

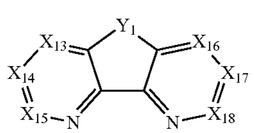

1-27

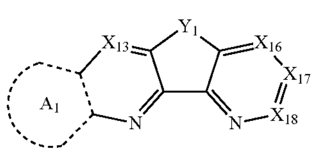

1-28

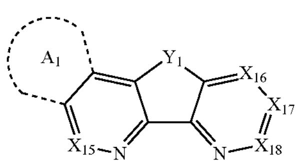

1-29

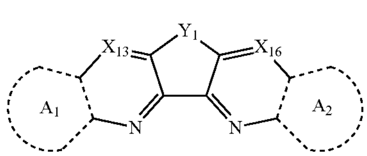

-continued 1-30

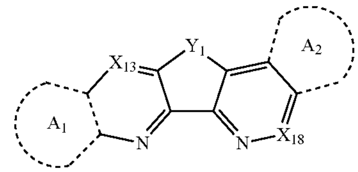

1-31

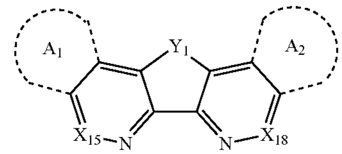

1-32

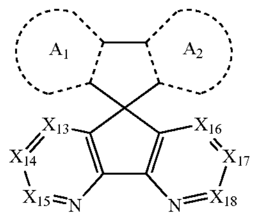

wherein, in Formulae 1-1 to 1-32, $X_{11}$ and $X_{12}$ are each independently from one another, have the same meaning as in claim 1, $X_{13}$ is N or $C(R_{13})$, $X_{14}$ is N or $C(R_{14})$, $X_{15}$ is N or $C(R_{15})$, $X_{16}$ is N or $C(R_{16})$, $X_{17}$ is N or $C(R_{17})$, $X_{18}$ is N or $C(R_{18})$, $X_{19}$ is N or $C(R_{19})$, $X_{20}$ is N or $C(R_{20})$, $A_1$ to $A_3$ are each, independently from one another, a benzene group, a naphthalene group, an anthracene group, a phenanthrene group, a triphenylene group, a pyrene group, a cyclopentadiene group, a thiophene group, a furan group, an indole group, an indene group, a benzosilole group, a benzogermole group, a benzothiophene group, a benzoselenophene group, a benzofuran group, a carbazole group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, $Y_1$ is O, S, $N(R_{1a})$, or $C(R_{1a})(R_{1b})$, $R_{11}$ to $R_{20}$, $R_{1a}$, and $R_{1b}$ each have, independently from one another, the same meaning as $*\text{-}(L_{11})_{a11}\text{-}(E_{11})_{b11}$ in Formula 1, $R_{11}$ to $R_{20}$, $R_{1a}$, and $R_{1b}$ are optionally linked to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, and $L_{11}$, $a_{11}$, $E_{11}$, $b_{11}$ and $R_{10a}$ each have the same meaning as in claim 1.

14. The light-emitting device of claim 1, wherein Formula 2 is represented by one of Formulae 2-1 to 2-4:

Formula 2-1

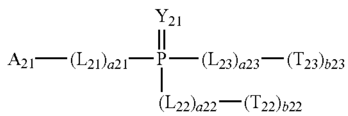

Formula 2-2

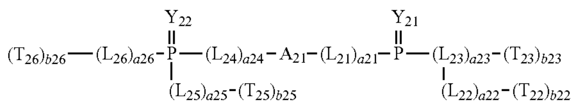

Formula 2-3

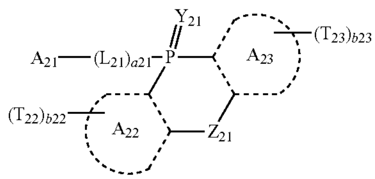

Formula 2-4

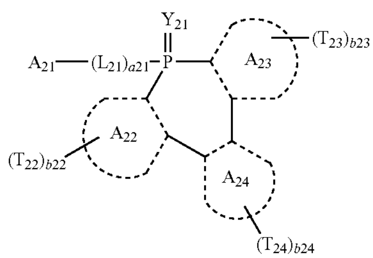

wherein, in Formulae 2-1 to 2-4, $Z_{21}$ is a non-bond, a single bond, O, S, $N(R_{21a})$, or $C(R_{21a})(R_{21b})$, $R_{21a}$ and $R_{21b}$ each have, independently from one another, the same meaning as $T_{22}$ in claim 1, $Y_{21}$, $A_{21}$, $L_{21}$ to $L_{23}$, a21 to a23, $T_{22}$, $T_{23}$, b22 and b23 are each have, independently from one another, the same meaning as described in claim 1, $Y_{22}$ has the same meaning as $Y_{21}$ in claim 1, $L_{24}$ to $L_{26}$ are each have, independently from one another, the same meaning as $L_{21}$ in claim 1, a24 to a26 are each, independently from one another, an integer selected from 1 to 3, $T_{24}$ to $T_{26}$ are each have, independently from one another, the same meaning as $T_{22}$ in claim 1, $A_{22}$ to $A_{24}$ are each, independently from one another, a $C_5$-$C_{60}$ carbocyclic group or $C_2$-$C_{30}$ heterocyclic group, and b24 to b26 are each have, independently from one another, an integer selected from 1 to 8.

15. The light-emitting device of claim 1, wherein $A_{21}$ in Formula 2 is represented by one of Formulae 3-1 to 3-7:

3-1

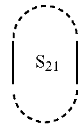

3-2

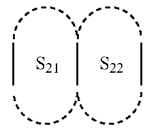

3-3

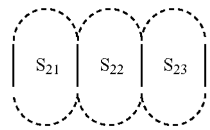

3-4

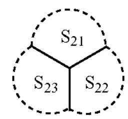

3-5

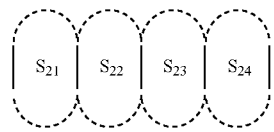

3-6

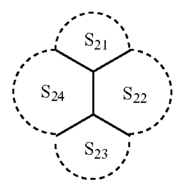

3-7

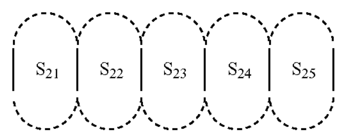

wherein, in Formulae 3-1 to 3-7, $S_{21}$ to $S_{25}$ are each, independently from one another, a benzene group, a naphthalene group, a phenanthrene group, an anthracene group, a triphenylene group, a pyrrole group, an imidazole group, a benzoxazole group, a benzothiazole group, a benzimidazole group, a pyridine group, a pyrazine group, a pyrimidine group, an indole group, a quinoline group, an isoquinoline group, a benzoquinoline group, a phenanthridine group, an acridine group, a phenanthroline group, a triazole group, a tetrazole group, or a triazine group, each independently from one another, unsubstituted or substituted with at least one $R_{10a}$, and $R_{10a}$ has the same meaning as described in claim 1.

16. An electronic apparatus comprising:

the light-emitting device of claim 1 and a thin-film transistor, wherein the thin-film transistor comprises a source electrode and a drain electrode, and the first electrode of the light-emitting device is electrically connected to the source electrode or the drain electrode.

17. The electronic apparatus of claim 16, further comprising a color filter, a color conversion layer, a touch screen layer, a polarizing layer, or any combination thereof.

18. A light-emitting device comprising:

a plurality of first electrodes patterned according to each of a first subpixel, a second subpixel, and a third subpixel;

a second electrode facing the plurality of the first electrodes;

an interlayer between the plurality of the first electrodes and the second electrode and comprising an emission layer; and a capping layer on the second electrode, wherein the emission layer comprises a first emission layer disposed in the first subpixel to emit a first-color light, a second emission layer disposed in the second subpixel to emit a second-color light, and a third emission layer disposed in the third subpixel to emit a third-color light, the interlayer further comprises an electron transport region between the emission layer and the second electrode, the capping layer comprises at least one first material represented by Formula 1 or Formula 2, and the electron transport region satisfies at least one of Condition (11) and Condition (12):

Condition (11)

the electron transport region further comprises a first electron transport layer which is formed as a common layer in all of the first subpixel, the second subpixel, and the third subpixel, the first electron transport layer comprises a mixture comprising an organic electron transport material and a metal element-containing material, and the organic electron transport material and the metal element-containing material are different from each other; and Condition (12)

the electron transport region comprises at least one second material represented by Formula 1 or Formula 2:

Formula 1

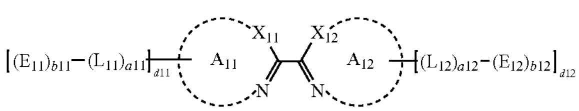

Formula 2

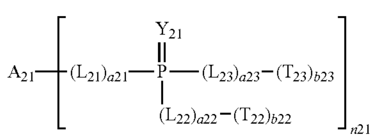

wherein, in Formula 1, $X_{11}$ is N or $C(R_{11})$, $X_{12}$ is N or $C(R_{12})$, $A_{11}$ and $A_{12}$ are each, independently from one another, a $C_1$-$C_{60}$ heterocyclic group including at least one N, $L_{11}$ and $L_{12}$ are each, independently from one another, a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a11 and a12 are each, independently from one another, an integer selected from 1 to 3, $E_{11}$, $E_{12}$, $R_{11}$, and $R_{12}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, b11 and b12 are each, independently from one another, an integer selected from 1 to 8, d11 and d12 are each, independently from one another, an integer selected from 1 to 8, $R_{11}$ and $R_{12}$ are optionally linked to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, wherein, in Formula 2, $Y_{21}$ is O, S, or Se, $A_{21}$ is a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, n21 is an integer selected from 1 to 3, $L_{21}$ to $L_{23}$ are each, independently from one another, a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a21 to a23 are each, independently from one another, an integer selected from 1 to 3, $T_{22}$ and $T_{23}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, b22 and b23 are each, independently from one another, an integer selected from 1 to 8, $T_{22}$ and $T_{23}$ are optionally linked to each other to form a $C_2$-$C_{30}$ heterocyclic group unsubstituted or substituted with at least one $R_{10a}$, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})$ $(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and wherein the electron transport region further comprises a second electron transport layer between the first electron transport layer and the emission layer.

19. A light-emitting device comprising:

a first electrode;

a second electrode facing the first electrode;

an interlayer between the first electrode and the second electrode and comprising an emission layer; and a capping layer disposed on the second electrode, wherein the interlayer further comprises an electron transport region between the emission layer and the second electrode, the capping layer comprises at least one first material represented by Formula 1 or Formula 2, and the electron transport region satisfies at least one of Condition (1) and Condition (2):

Condition (1)

the electron transport region further comprises a first electron transport layer, wherein the first electron transport layer comprises a mixture comprising an organic electron transport material and a metal element-containing material, and the organic electron transport material and the metal element-containing material are different from each other; and Condition (2)

the electron transport region comprises at least one second material represented by Formula 1 or Formula 2:

Formula 1

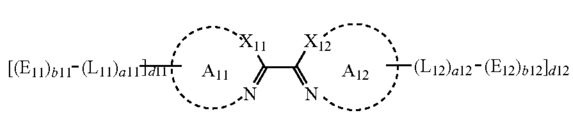

-continued

Formula 2

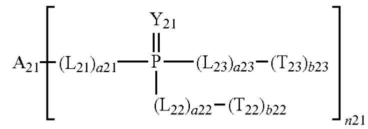

wherein, in Formula 1, $X_{11}$ is N or $C(R_{11})$, $X_{12}$ is N or $C(R_{12})$, $A_{11}$ and $A_{12}$ are each, independently from one another, a $C_1$-$C_{60}$ heterocyclic group comprising at least one N, $L_{11}$ and $L_{12}$ are each, independently from one another, a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a11 and a12 are each, independently from one another, an integer selected from 1 to 3, $E_{11}$, $E_{12}$, $R_{11}$, and $R_{12}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b11 and b12 are each, independently from one another, an integer selected from 1 to 8, d11 and d12 are each, independently from one another, an integer selected from 1 to 8, $R_{11}$ and $R_{12}$ are optionally linked to each other to form a $C_5$-$C_{60}$ carbocyclic group unsubstituted or substituted with at least one $R_{10a}$ or a $C_2$-$C_{30}$ heterocyclic group unsubstituted or substituted with at least one $R_{10a}$, wherein, in Formula 2, $Y_{21}$ is O, S, or Se, $A_{21}$ is a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, n21 is an integer selected from 1 to 3, $L_{21}$ to $L_{23}$ are each, independently from one another, a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a21 to a23 are each, independently from one another, an integer selected from 1 to 3, $T_{22}$ and $T_{23}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b22 and b23 are each, independently from one another, an integer selected from 1 to 8, $T_{22}$ and $T_{23}$ are optionally linked to each other to form a $C_2$-$C_{30}$ heterocyclic group unsubstituted or substituted with at least one $R_{10a}$, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-Coo arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and wherein the first electron transport layer and the second electrode directly contact each other.

* * * * *